(12) United States Patent
Ishii et al.

(10) Patent No.: US 12,173,114 B2
(45) Date of Patent: Dec. 24, 2024

(54) COPOLYMER, ELECTROLUMINESCENCE DEVICE MATERIAL INCLUDING COPOLYMER, AND ELECTROLUMINESCENCE DEVICE

(71) Applicant: SAMSUNG ELECTRONICS CO., LTD., Suwon-si (KR)

(72) Inventors: Norihito Ishii, Yokohama (JP); Takahiro Fujiyama, Yokohama (JP); Masashi Tsuji, Hwaseong-si (KR); Naotoshi Suganuma, Yokohama (JP); Yusaku Konishi, Yokohama (JP); Dae Young Chung, Suwon-si (KR); Eun Joo Jang, Suwon-si (KR); Ha Il Kwon, Suwon-si (KR); Hyo Sook Jang, Suwon-si (KR); Soonmin Cha, Suwon-si (KR); Tae Ho Kim, Seongnam-si (KR); Fumiaki Kato, Yokohama (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 493 days.

(21) Appl. No.: 17/559,388

(22) Filed: Dec. 22, 2021

(65) Prior Publication Data

US 2022/0195110 A1 Jun. 23, 2022

(30) Foreign Application Priority Data

Dec. 22, 2020 (JP) .................................. 2020-212454

(51) Int. Cl.
*C08G 61/12* (2006.01)
*H10K 85/10* (2023.01)

(52) U.S. Cl.
CPC ......... *C08G 61/124* (2013.01); *H10K 85/146* (2023.02); *H10K 85/151* (2023.02);
(Continued)

(58) Field of Classification Search
CPC .............. H01L 51/0043; H01L 51/502; H01L 51/5056; H01L 51/5072; H01L 51/0072;
(Continued)

(56) References Cited

U.S. PATENT DOCUMENTS 7,456,567 B2 11/2008 Ogasawara
8,330,142 B2 12/2012 Cho et al.
(Continued)

FOREIGN PATENT DOCUMENTS

CN 103227285 A 7/2013
CN 104530391 A 4/2015
(Continued)

*Primary Examiner* — Shane Fang
(74) *Attorney, Agent, or Firm* — CANTOR COLBURN LLP

(57) ABSTRACT

A copolymer, including a structural unit represented by Chemical Formula 1, a structural unit represented by Chemical Formula 2, or a combination thereof:

Chemical Formula 1

(1)

(Continued)

-continued

Chemical Formula 2

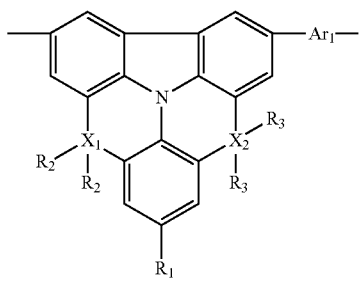

(2)

wherein $R_1$, $R_2$, $R_3$, $X_1$, $X_2$, and $Ar_1$ are as provided herein.

14 Claims, 2 Drawing Sheets

(52) U.S. Cl.
CPC ... *C08G 2261/12* (2013.01); *C08G 2261/312* (2013.01); *C08G 2261/3241* (2013.01)

(58) Field of Classification Search
CPC .. H01L 51/5012; C07D 403/04; C07D 403/10
See application file for complete search history.

(56) References Cited

U.S. PATENT DOCUMENTS

| | | | |
|---|---|---|---|
| 8,399,605 | B2 | 3/2013 | Steudel et al. |
| 9,133,119 | B2 | 9/2015 | Parham et al. |
| 9,385,326 | B2 | 7/2016 | Wonneberger et al. |
| 9,708,262 | B2 | 7/2017 | Parham et al. |
| 10,050,205 | B2 | 8/2018 | Mitsunori |
| 2009/0001880 | A1 | 1/2009 | Ogasawara |
| 2012/0217492 | A1* | 8/2012 | Kim ............... C07D 409/04 548/440 |
| 2020/0185610 | A1 | 6/2020 | Sugioka et al. |
| 2020/0199154 | A1 | 6/2020 | Parham et al. |
| 2020/0212306 | A1 | 7/2020 | Konishi et al. |

FOREIGN PATENT DOCUMENTS

| | | |
|---|---|---|
| CN | 106633005 A | 5/2017 |
| JP | 2010199067 A | 9/2010 |
| JP | 4642849 B2 | 3/2011 |
| JP | 4708749 B2 | 6/2011 |
| JP | 5371442 B2 | 12/2013 |
| JP | 5844282 B2 | 1/2016 |
| JP | 2016084462 A | 5/2016 |
| JP | 2016513077 A | 5/2016 |
| JP | 6620015 B2 | 12/2019 |
| JP | 2020107866 A | 7/2020 |

\* cited by examiner

COPOLYMER, ELECTROLUMINESCENCE DEVICE MATERIAL INCLUDING COPOLYMER, AND ELECTROLUMINESCENCE DEVICE

CROSS-REFERENCE TO RELATED APPLICATION

This application claims priority to Japanese Patent Application No. 2020-212454 filed in the Japan Patent Office on Dec. 22, 2020, and all the benefits accruing therefrom under 35 U.S.C. § 119, the entire content of which is incorporated by reference herein.

BACKGROUND

1. Field

The present disclosure relates to a copolymer, an electroluminescence device material including the copolymer, and an electroluminescence device are disclosed.

2. Description of the Related Art

Research and development of electroluminescence devices (EL devices) is active and continues to progress. In particular, EL devices are expected to be further developed as solid light emitting type devices that may be manufactured inexpensively and may be used, for example, for a variety of devices such as large area full color EL display devices and recording light source arrays. An EL device is a light emitting device including a thin film of several nanometers to several hundred nanometers in thickness that is arranged between an anode and a cathode. In addition, the EL devices usually further include a hole transport layer, a light emitting layer, an electron transport layer, a combination thereof, or the like.

Among these layers, the light emitting layer includes a fluorescent light emitting material and a phosphorescent light emitting material. A phosphorescent light emitting material is a material whose luminous efficiency is expected to be greater than the luminous efficiency of a fluorescent light emitting material. In addition, to cover a wide color gamut, a RGB light source should have an emission spectrum having a narrow full width at half maximum (FWHM). Although deep blue is particularly required for blue, there are currently no commercially available devices found to have both a long life-span and a high color purity.

Quantum dots (QD) are semiconductor materials having crystal structures of several nanometers in size and are made up of hundreds to thousands of atoms. Because quantum dots are small in size, their surface area per unit volume is large. For this reason, most of the atoms are present on the surface of the nanocrystals, and exhibit quantum confinement effects. Due to the quantum confinement effect, the emission wavelength of a quantum dot may be adjusted by changing the size of the quantum dot. The quantum confinement effect demonstrated by QDs has garnered much attention, because it has characteristics such as improved color purity and high photoluminescence (PL) efficiency.

A quantum dot light emitting diode (QD LED) is a three-layered device including a hole transport layer (HTL) and an electron transport layer (ETL) at both surfaces with a quantum dot light emitting layer, which is referred to herein as a basic device.

SUMMARY

Accordingly, one or more embodiments provide a technology capable of improving luminous efficiency and durability (luminescence life-span) of an electroluminescence device (particularly quantum dot electroluminescence device).

One or more embodiments provide a polymer having a specific structure.

One or more embodiments provide a copolymer having a structural unit represented by Chemical Formula 1, a structural unit represented by Chemical Formula 2, or a combination thereof:

Chemical Formula 1

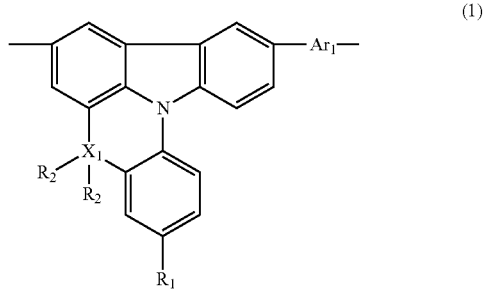

(1)

Chemical Formula 2

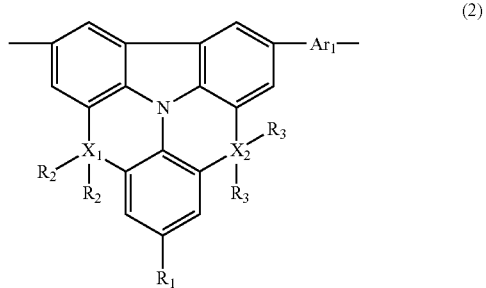

(2)

wherein, Chemical Formula 1 or Chemical Formula 2, $R_1$ is a substituted or unsubstituted alkyl group having 1 to 20 carbon atoms, a substituted or unsubstituted monovalent aromatic hydrocarbon group having 6 to 30 carbon atoms, a substituted or unsubstituted monovalent aromatic heterocyclic group having 5 to 30 ring-member atoms, or —Y—N($Ar_2$)($Ar_3$), wherein Y is a substituted or unsubstituted divalent aromatic hydrocarbon group having 6 to 30 carbon atoms and $Ar_2$ and $Ar_3$ are each independently a substituted or unsubstituted monovalent aromatic hydrocarbon group having 6 to 30 carbon atoms, or a substituted or unsubstituted monovalent aromatic heterocyclic group having 5 to 30 ring-member atoms, $R_2$ and $R_3$ are each independently be a substituted or unsubstituted alkyl group having 1 to 20 carbon atoms, a substituted or unsubstituted alkoxy group having 1 to 20 carbon atoms, a substituted or unsubstituted monovalent aromatic hydrocarbon group having 6 to 30 carbon atoms, or a substituted or unsubstituted monovalent aromatic heterocyclic group having 5 to 30 ring-member atoms, wherein each $R_2$ is the same or different, and each $R_3$ is the same or different, optionally wherein two $R_2$(s) are combined with each other to provide a ring, optionally wherein two $R_3$(s) are combined with each other to provide a ring, and optionally wherein one or more $R_2$(s) is combined with one or more $R_3$(s) to provide a ring, $X_1$ and $X_2$ are each independently a carbon atom (C) or a silicon atom (Si), and $Ar_1$ is a substituted or unsubstituted divalent aromatic hydrocarbon group having 6 to 30 carbon atoms, or a substituted or unsubstituted divalent aromatic heterocyclic group having 5 to 30 ring-member atoms.

In one or more embodiments, $Ar_1$ may be a group represented by one of Chemical Formula 3 to Chemical Formula 18:

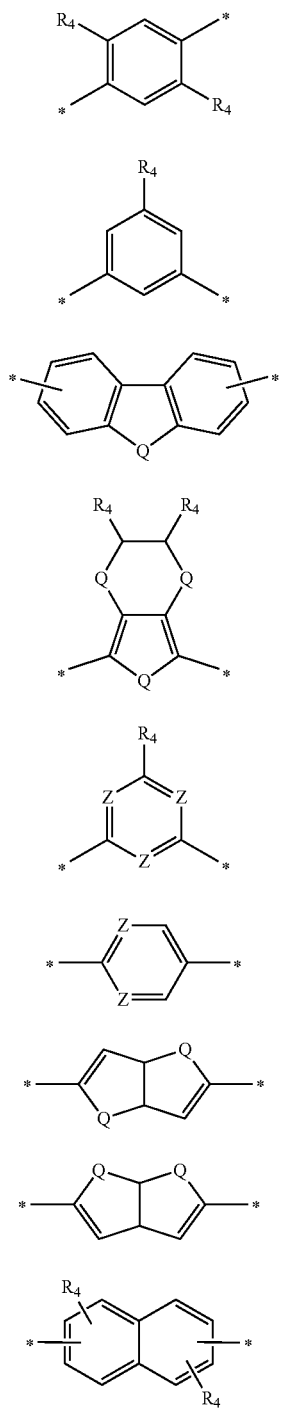

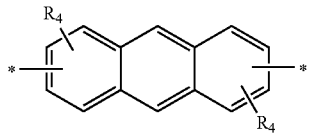

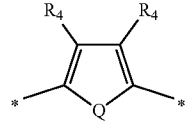

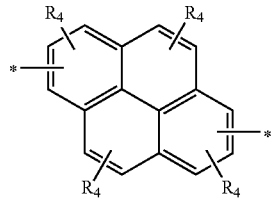

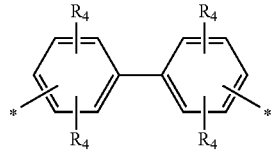

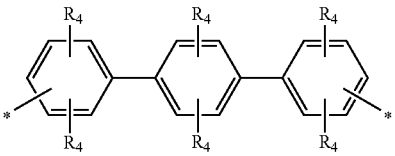

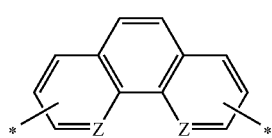

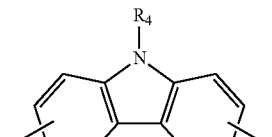

wherein, in Chemical Formula 3 to Chemical Formula 18, each $R_4$ may independently be a hydrogen atom, an alkyl group having 1 to 20 carbon atoms, a substituted or unsubstituted monovalent aromatic hydrocarbon group having 6 to 30 carbon atoms, or a substituted or unsubstituted monovalent aromatic heterocyclic group having 5 to 30 ring-member atoms, each Q may independently be —O—, —S—, —Se—, —$CR_5R_6$—, or —$SiR_5R_6$—, wherein $R_5$ and $R_6$ may each independently be a hydrogen atom, a deuterium atom, a substituted or unsubstituted alkyl group having 1 to 20 carbon atoms, a substituted or unsubstituted aryl group, or a substituted or unsubstituted heteroaryl group, each Z may independently be —$CR_7$=, —N=, or —$SiR_7$=, wherein, $R_7$ may be a hydrogen atom, a deuterium atom, a substituted or unsubstituted alkyl group having 1 to 20 carbon atoms, a substituted or unsubstituted aryl group, or a substituted or unsubstituted heteroaryl group, and

* is a binding site forming a main chain of the copolymer.

The copolymer may include the structural unit represented by Chemical Formula 1, wherein in Chemical Formula 1, $R_1$ may be a substituted or unsubstituted alkyl group having 1 to 8 carbon atoms, or —Y—N(Ar$_2$)(Ar$_3$), wherein, Y is a substituted or unsubstituted phenylene group, a substituted or unsubstituted fluorenylene group, or a substituted or unsubstituted dibenzofuranylene group, $Ar_2$ and $Ar_3$ may each independently be a substituted or unsubstituted phenyl group, a substituted or unsubstituted fluorenyl group, a substituted or unsubstituted dibenzofuranyl group, or a substituted or unsubstituted biphenyl group, each $R_2$ may independently be a substituted or unsubstituted alkyl group having 1 to 8 carbon atoms, or a substituted or unsubstituted phenyl group, or optionally two $R_2$(s) may be combined with each other to provide a ring, and $X_1$ may be a carbon atom (C).

Another aspect provides an electroluminescence device material, including the aforementioned copolymer.

Another aspect provides an electroluminescence device, including a first electrode and a second electrode, and at least one organic layer disposed between the first electrode and the second electrode, wherein the at least one layer of the organic layer includes the aforementioned copolymer.

The organic layer including the copolymer may be a hole transport layer or a hole injection layer.

The organic layer may include a light emitting layer comprising semiconductor nanoparticles or an organometallic complex.

An electroluminescence device, and in particular, a quantum dot electroluminescence device having luminous efficiency and durability (luminescence life-span), may be provided.

DETAILED DESCRIPTION

Figure 1:
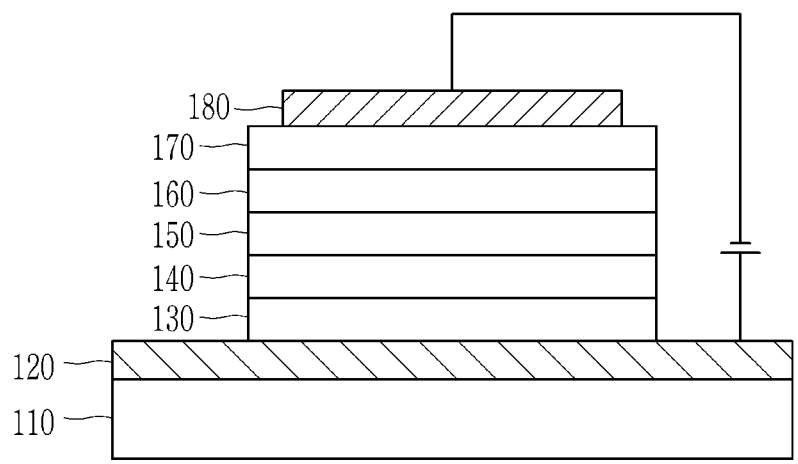
FIG. 1 is a schematic view illustrating an electroluminescence device according to one or more embodiments.

Hereinafter, exemplary embodiments of the present disclosure are described in further detail. The present disclosure is not limited only to the following exemplary embodiments. In addition, each drawing is exaggerated for better understanding and ease of description, and a dimensional ratio of each constituent element in each drawing may be different from the actual one. In addition, when the embodiment of the present disclosure has been described with reference to the drawings, the same reference numerals are given to the same elements in the description of the drawings, and redundant descriptions are omitted.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

As used herein, unless specifically stated, operations and measurement of properties are carried out under conditions of room temperature (greater than or equal to about 20° C. and less than or equal to about 25° C.)/relative humidity of greater than or equal to about 40% RH and less than or equal to about 50% RH.

As a method of solving such a problem, there is a light emitting device using "quantum dot" which is an inorganic light emitting material as a light emitting material (Japanese Patent Laid-Open Publication No. 2010-199067). However, in the electroluminescence device (especially, a quantum dot electroluminescence device) using the hole transport material described therein, sufficient performance (particularly luminous efficiency and durability) could not be achieved.

According to one or more embodiments, a copolymer comprising a structural unit represented by Chemical Formula 1, a structural unit represented by Chemical Formula 2, or a combination thereof, is provided:

Chemical Formula 1

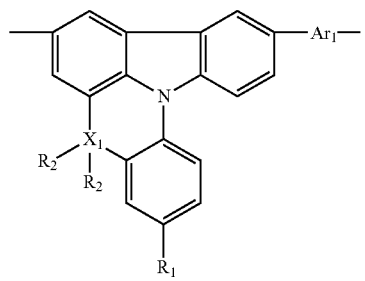

(1)

Chemical Formula 2

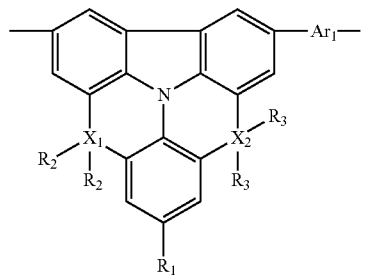

(2)

In Chemical Formula 1 and Chemical Formula 2, $R_1$ is a substituted or unsubstituted alkyl group having 1 to 20 carbon atoms, a substituted or unsubstituted monovalent aromatic hydrocarbon group having 6 to 30 carbon atoms, a substituted or unsubstituted monovalent aromatic heterocyclic group having 5 to 30 ring-member atoms, or —Y—N(Ar$_2$)(Ar$_3$), wherein Y is a substituted or unsubstituted divalent aromatic hydrocarbon group having 6 to 30 carbon atoms and Ar$_2$ and Ar$_3$ are each independently a substituted or unsubstituted monovalent aromatic hydrocarbon group having 6 to 30 carbon atoms, or a substituted or unsubstituted monovalent aromatic heterocyclic group having 5 to 30 ring-member atoms, $R_2$ and $R_3$ are each independently a substituted or unsubstituted alkyl group having 1 to 20 carbon atoms, a substituted or unsubstituted alkoxy group having 1 to 20 carbon atoms, a substituted or unsubstituted monovalent aromatic hydrocarbon group having 6 to 30 carbon atoms, or a substituted or unsubstituted monovalent aromatic heterocyclic group having 5 to 30 ring-member atoms, wherein each $R_2$ is the same or different, and each $R_3$ is the same or different, optionally wherein two $R_2$(s) are combined with each other to provide a ring, optionally wherein two $R_3$(s) are combined with each other to provide a ring, and optionally wherein one or more $R_2$(s) is combined with one or more $R_3$(s) to provide a ring, $X_1$ and $X_2$ are each independently a carbon atom (C) or a silicon atom (Si), and Ar$_1$ is a substituted or unsubstituted divalent aromatic hydrocarbon group having 6 to 30 carbon atoms, or a substituted or unsubstituted divalent aromatic heterocyclic group having 5 to 30 ring-member atoms.

As used herein, a "structural unit represented by Chemical Formula 1" is also referred to herein as "Structural Unit (1)."

A "structural unit represented by Chemical Formula 2" is also referred to herein as "Structural Unit (2)."

According to another aspect, an electroluminescence device material includes the copolymer.

According to another aspect, an electroluminescence device includes a first electrode and a second electrode, and at least one organic layer disposed between the first electrode and the second electrode, wherein the at least one of the organic layers includes the aforementioned copolymer.

As used herein, the electroluminescence device may be referred to as "LED."

Quantum dot electroluminescence devices are also referred to simply as "QLEDs."

An organic electroluminescence device is also simply referred to as "OLED."

The present inventors have investigated about the electroluminescence device (particularly quantum dot electroluminescence device) having improved luminous efficiency and durability (luminescence life-span). As a result, it has been found that, when the structural unit of Chemical Formula 1 and/or Chemical Formula 2 is present, a material having a good balance between luminous efficiency and durability (luminescence life-span) may be obtained.

Specifically, in the structural unit of Chemical Formula 1 and/or Chemical Formula 2, the carbazole ring of the main chain and the benzene ring of the side chain are crosslinked by $X_1$ (Chemical Formula 1) or $X_1$ and $X_2$ (Chemical Formula 2). Due to this crosslinked structure, a bond dissociation energy of the C—N bond between the nitrogen atom of the carbazole ring of the main chain and the carbon atom of the benzene ring of the side chain to which the nitrogen atom is bonded in the excited state and the anionic state is increased, and even under the coexistence of holes or electrons, a material is difficult to be decomposed or is not decomposed. Thereby, high hole resistance is maintained and exciton resistance and electron resistance may be enhanced, which affect device life-span. Therefore, when the copolymer is used in an electroluminescence device, durability (luminescence life-span) may be improved.

Further, and without wishing to be limited to theory, by having the crosslinked structure as described above, the dihedral angle of the C—N bonding axis of the nitrogen atom of the carbazole ring of the main chain and the carbon atom of the benzene ring of the side chain to which the nitrogen atom is bonded becomes narrow. For this reason, the mobility of holes is increased because the copolymer is easily stacked (packed) and may be densely present. Therefore, by using the copolymer for an electroluminescence device, the mobility of holes from the hole transport layer to the light emitting layer may be improved, and the luminous efficiency may be improved.

The copolymer exhibits improved exciton resistance and electron resistance, and high hole mobility. Therefore, and without wishing to be limited to theory, the electroluminescence device manufactured using the copolymer may exhibit luminous efficiency and durability (long luminescence life-span) in a balanced manner. In addition, the copolymer may suppress an increase in driving voltage. Therefore, the electroluminescence device manufactured using the copolymer may exhibit high luminous efficiency at a low driving voltage.

Moreover, and without wishing to be limited to theory, since the copolymer has excellent film-forming properties and solvent solubility, a film may be formed by a wet (coating) method. Therefore, by using the copolymer, a large area and high productivity of the electroluminescence device are possible. The above effect may be effectively exhibited when the copolymer according to embodiment is applied to an EL device, particularly a hole transport layer or a hole injection layer of a QLED.

As used herein, unless otherwise specified, "substituted" refers to substitution with at least one of an alkyl group, a cycloalkyl group, a hydroxyalkyl group, an alkoxyalkyl group, an alkoxy group, a cycloalkoxy group, an alkenyl group, an alkynyl group, an amino group, an aryl group, an aryloxy group, an alkylthio group, a cycloalkylthio group, an arylthio group, an alkoxycarbonyl group, an aryloxycarbonyl group, a hydroxyl group (—OH), a carboxyl group (—COOH), a thiol group (—SH), a cyano group (—CN), or a combination thereof. On the other hand, when a group is substituted, the substituents are not same as the groups being substituted. For example, when the substituent is a substituted alkyl group, the alkyl group as the substituent group is not necessarily substituted with an alkyl group.

Herein, the alkyl group as the substituent may be either a linear or branched, for example a linear alkyl group having 1 to 20 carbon atoms or a branched alkyl group having 3 to 20 carbon atoms.

Specifically, the alkyl group may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, a nonadecyl group, an icosyl group, and the like.

The cycloalkyl group may include for example, a cyclopropyl group, a cyclobutyl group, a cyclopentyl group, a cyclohexyl group, and the like.

The hydroxyalkyl group, may be for example, the alkyl group substituted with 1 to 3 (for example 1 or 2, and more desirably 1) hydroxy groups (for example, hydroxymethyl group, hydroxyethyl group).

The alkoxyalkyl group, may be for example, the alkyl group substituted with 1 to 3 (desirably 1 or 2 and more desirably 1) alkoxy groups.

The alkoxy group may be either linear or a branched, but desirably a linear alkoxy group having 1 to 20 carbon atoms or a branched alkoxy group having 3 to 20 carbon atoms. For example, the alkoxy group may be, for example, a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyl oxy group, a 3-ethylpentyloxy group, and the like.

The cycloalkoxy group may be, for example, a cyclopropyloxy group, a cyclobutyloxy group, a cyclopentyloxy group, a cyclohexyloxy group, and the like.

The alkenyl group may include, for example, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, and the like.

The alkynyl group may include, for example, an acetylenyl group, a 1-propynyl group, a 2-propynyl group, a 1-butynyl group, a 2-butynyl group, a 3-butynyl group, a 1-pentetyl group, a 2-pentetyl group, a 3-pentetyl group, 1-hexynyl group, a 2-hexynyl group, a 3-hexynyl group, a 1-heptinyl group, a 2-heptinyl group, a 5-heptinyl group, a 1-octynyl group, a 3-octynyl group, a 5-octynyl group, and the like.

The aryl group may include an aryl group having 6 to 30 carbon atoms. The aryl group may include, for example, a phenyl group, a naphthyl group, a biphenyl group, a fluorenyl group, an anthryl group, a pyrenyl group, an azulenyl group, an acenaphthylenyl group, a terphenyl group, a phenanthryl group, and the like.

The aryloxy group may include, for example, a phenoxy group, a naphthyloxy group, and the like.

The alkylthio group may include, for example, a methylthio group, an ethylthio group, a propylthio group, a pentylthio group, a hexylthio group, an octylthio group, a dodecylthio group, and the like.

The cycloalkylthio group may include, for example, a cyclopentylthio group, a cyclohexylthio group, and the like.

The arylthio group may include, for example, a phenylthio group, a naphthylthio group, and the like.

The alkoxycarbonyl group may include, for example, a methyloxy carbonyl group, an ethyloxy carbonyl group, a butyloxy carbonyl group, an octyloxy carbonyl group, a dodecyloxycarbonyl group, and the like.

The aryloxycarbonyl group may include, for example, a phenyloxycarbonyl group, a naphthyloxycarbonyl group, and the like.

Copolymer

The copolymer according to one or more embodiments includes a structural unit represented by Chemical Formula 1 (Structural Unit (1)), a structural unit represented by Chemical Formula 2 (Structural Unit (2)), or a combination thereof. The copolymer having the Structural Unit (1) and/or Structural Unit (2) has excellent exciton resistance, electron resistance, and high hole mobility.

For this reason, an electroluminescence device (particularly quantum dot electroluminescence device) including the copolymer according to one or more embodiments (particularly, in a hole transport layer or a hole injection layer) has a good balance between luminous efficiency and durability (luminescence life-span). In addition, high current efficiency and low driving voltage may be achieved.

The copolymer may include one type of structural unit (Structural Unit (1)) represented by Chemical Formula 1, or may include two or more types of Structural Unit (1). The plurality of Structural Units (1) may be present in a block type or in a random type.

The copolymer may include one type of structural unit (Structural Unit (2)) represented by Chemical Formula 2, or may include two or more types of Structural Unit (2). The plurality of Structural Units (2) may be present in a block type or in a random type.

The copolymer may include one or more structural units (Structural Units (1)) of Chemical Formula 1 and one or more structural units (Structural Units (2)) of the Chemical Formula 2 in combination. Herein, the copolymer may be any of a random copolymer, an alternating copolymer, a periodic copolymer, and a block copolymer.

The copolymer may have the structural unit (Structural Unit (1)) of Chemical Formula 1, the structural unit (Structural Unit (2)) of Chemical Formula 2, or a combination thereof.

Chemical Formula 1

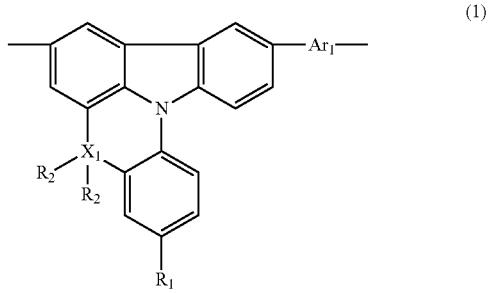

(1)

Chemical Formula 2

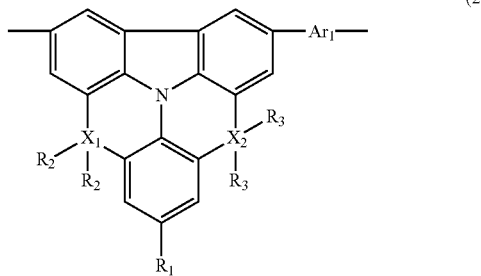

(2)

In Chemical Formula 1 or Chemical Formula 2,

Structural units on the left except "—Ar$_1$—" (referred to as Structural Unit (1-1) and Structural Unit (2-1), respectively) constitute the copolymer.

On the other hand, when two or more types of Structural Units (1) or Structural Units (2) are present, each of "Structural Unit (1-1)" of Structural Unit (1) or "Structural Unit (2-1)" of Structural Unit (2) may be the same or different from each other. The structural unit (Structural Unit (1-2)) of "—Ar$_1$—" in Chemical Formula 1 or Chemical Formula 2 constitutes the copolymer. Meanwhile, when two or more Structural Units (1) or Structural Units (2) are present, "—Ar$_1$—" of Structural Unit (1) or Structural Unit (2) may be the same or different from each other.

In Chemical Formula 1 and Chemical Formula 2, R$_1$ is a substituted or unsubstituted alkyl group having 1 to 20 carbon atoms, a substituted or unsubstituted monovalent aromatic hydrocarbon group having 6 to 30 carbon atoms, a substituted or unsubstituted monovalent aromatic heterocyclic group having 5 to 30 ring-member atoms, or —Y—N(Ar$_2$)(Ar$_3$).

The alkyl group having 1 to 20 carbon atoms may be exemplified by the same alkyl groups described herein. Among these, from the viewpoint of further improvement of exciton resistance, electron resistance, and hole mobility (thus further improvement of luminous efficiency and durability (luminescence life-span)), the alkyl group may be a linear or branched alkyl group having 1 to 8 carbon atoms, desirably a branched chain alkyl group having 3 to 5 carbon atoms (isopropyl group, sec-butyl group, tert-butyl group, isopentyl group, neopentyl group), and more desirably a sec-butyl group.

In addition, the monovalent aromatic hydrocarbon group having 6 to 30 carbon atoms is not particularly limited, but may be specifically a monovalent group derived from an aromatic hydrocarbon compound such as benzene (a phenyl group), pentalene, indene, naphthalene, anthracene, azulene, heptalene, acenaphthene, phenalene, fluorene, phenanthrene, biphenyl, terphenyl, quaterphenyl, quinquephenyl, pyrene, 9,9-diphenyl fluorene, 9,9'-spirobi[fluorene], 9,9-dialkyl fluorene, and the like.

The monovalent aromatic heterocyclic group having 5 to 30 ring-member atoms is not particularly limited, but may be specifically a divalent group derived from heterocyclic aromatic compounds such as acridine, phenazine, benzoquinoline, benzoisoquinoline, phenanthridine, phenanthroline, anthraquinone, fluorenone, dibenzofuran, dibenzothiophene, carbazole, imidazole, phenanthridine, benzimidazophenanthridine, azadibenzofuran, 9-phenyl carbazole, azacarbazole, azadibenzothiophene, diazadibenzofuran, diazacarbazole, diazadibenzothiophene, xanthone, thioxanthone, pyridine, quinoline, anthraquinoline, and the like.

R$_1$ (when unsubstituted) may be the aforementioned monovalent aromatic hydrocarbon group; a structure in which two or more types of the aforementioned monovalent aromatic hydrocarbon groups are combined; the aforementioned monovalent aromatic heterocyclic group; a structure in which two or more types of the aforementioned monovalent aromatic heterocyclic groups; or a structure in which one or more types of the monovalent aromatic hydrocarbon group and one or more types of the monovalent aromatic heterocyclic group.

When R$_1$ is —Y—N(Ar$_2$)(Ar$_3$), Y is a substituted or unsubstituted divalent aromatic hydrocarbon group having 6 to 30 carbon atoms. Here, as the divalent aromatic hydrocarbon group having 6 to 30 carbon atoms, the divalent group derived from the aromatic hydrocarbon compound in R$_1$ may be exemplified in the same manner.

Among them, from the viewpoint of new further enhancement of exciton resistance, electron resistance, and hole mobility (thus novel improvement of luminous efficiency and durability (luminescence life-span)), Y may be a substituted or unsubstituted phenylene group, a substituted or unsubstituted fluorenylene group, a substituted or unsubstituted dibenzofuranylene group, a substituted or unsubstituted naphthylene group, or a substituted or unsubstituted dibenzothiphenyl group, desirably a substituted or unsubstituted phenylene group (o-, m-, p-phenylene group), a substituted or unsubstituted fluorenylene group, or a substituted or unsubstituted dibenzofuranylene group, or more desirably a phenylene group (particularly p-phenylene group).

In addition, Ar$_2$ and Ar$_3$ are each independently a substituted or unsubstituted monovalent aromatic hydrocarbon group having 6 to 30 carbon atoms, or a substituted or unsubstituted monovalent aromatic heterocyclic group having 5 to 30 ring-member atoms. Herein, Ar$_2$ and Ar$_3$ may be the same or different from each other, but Ar$_2$ and Ar$_3$ may be desirably different from each other.

As the monovalent aromatic hydrocarbon group having 6 to 30 carbon atoms and the monovalent aromatic heterocyclic group having 5 to 30 ring-member atoms, the monovalent group derived from the aromatic hydrocarbon compound and the heterocyclic aromatic compound in $R_1$ may be exemplified in the same manner, respectively.

Among these, from the viewpoint of new further enhancement of exciton resistance, electron resistance, and hole mobility (thus novel improvement of luminous efficiency and durability (luminescence life-span)), $Ar_2$ and $Ar_3$ may be a substituted or unsubstituted phenyl group, a substituted or unsubstituted fluorenyl group, a substituted or unsubstituted dibenzofuranyl group, a substituted or unsubstituted biphenyl group, a substituted or unsubstituted naphthylene group, or a substituted or unsubstituted spirobifluorenyl group; desirably a substituted or unsubstituted phenyl group, a substituted or unsubstituted fluorenyl group, a substituted or unsubstituted dibenzofuranyl group, or a substituted or unsubstituted biphenyl group; or more desirably a substituted or unsubstituted fluorenyl group (particularly, a fluorenyl group substituted with two C1 to C3 alkyl groups (particularly, a methyl group)) or a substituted or unsubstituted biphenyl group (particularly, an unsubstituted biphenyl group).

In Chemical Formula 1 or Chemical Formula 2, from the viewpoint of new further enhancement of exciton resistance, electron resistance, and hole mobility (thus novel improvement of luminous efficiency and durability (luminescence life-span)), $R_1$ may be a substituted or unsubstituted alkyl group having 1 to 8 carbon atoms, or $-Y-N(Ar_2)(Ar_3)$.

In Chemical Formula 1 or Chemical Formula 2, $R_2$ and $R_3$ are each independently a substituted or unsubstituted alkyl group having 1 to 20 carbon atoms, a substituted or unsubstituted alkoxy group having 1 to 20 carbon atoms, a substituted or unsubstituted monovalent aromatic hydrocarbon group having 6 to 30 carbon atoms, or a substituted or unsubstituted monovalent aromatic heterocyclic group having 5 to 30 ring-member atoms. Herein, each $R_2$ is the same or different from each other and each $R_3$ is the same or different from each other.

Optionally two $R_2$(s) are combined with each other to provide a ring, optionally wherein two $R_3$(s) are combined with each other to provide a ring, and optionally wherein one or more $R_2$(s) is combined with one or more $R_3$(s) to provide a ring As the alkyl group having 1 to 20 carbon atoms and the alkoxy group having 1 to 20 carbon atoms, the alkyl groups and alkoxy groups as in the "substituent" above may be exemplified, respectively.

As the monovalent aromatic hydrocarbon group having 6 to 30 carbon atoms and monovalent aromatic heterocyclic group having 5 to 30 ring-member atoms, the monovalent group derived from the aromatic hydrocarbon compound and the heterocyclic aromatic compound in $R_1$ may be exemplified in the same manner, respectively.

Among these, from the viewpoint of new further enhancement of exciton resistance, electron resistance, and hole mobility (thus novel improvement of luminous efficiency and durability (luminescence life-span)), $R_2$ and $R_3$ may each independently be a substituted or unsubstituted alkyl group having 1 to 8 carbon atoms, a substituted or unsubstituted phenyl group or two $R_2$(s) and two $R_3$(s) may be combined with each other, respectively to provide a ring; $R_2$ and $R_3$ may each independently be a substituted or unsubstituted alkyl group having 1 to 3 carbon atoms (particularly a methyl group) or an unsubstituted phenyl group, or two phenyl groups may be combined to provide a fluorene ring; or one or more $R_2$(s) and one or more $R_3$(s) may be a phenyl group or the two phenyl groups may be combined to provide a fluorene ring.

In Chemical Formula 1 or Chemical Formula 2, $X_1$ and $X_2$ may each independently be a carbon atom (C) or a silicon atom (Si). Desirably, $X_1$ and $X_2$ may be a carbon atom (C).

In one or more embodiments, the copolymer has a structural unit represented by Chemical Formula 1. In one or more embodiments, the copolymer may have the structural unit represented by Chemical Formula 1, wherein $R_1$ may be a substituted or unsubstituted alkyl group having 1 to 8 carbon atoms, or $-Y-N(Ar_2)(Ar_3)$, wherein Y may be a substituted or unsubstituted phenylene group, a substituted or unsubstituted fluorenylene group, or a substituted or unsubstituted dibenzofuranylene group, $Ar_2$ and $Ar_3$ may each independently be a substituted or unsubstituted phenyl group, a substituted or unsubstituted fluorenyl group, a substituted or unsubstituted dibenzofuranyl group, or a substituted or unsubstituted biphenyl group; each $R_2$ may independently be a substituted or unsubstituted alkyl group having 1 to 8 carbon atoms, or a substituted or unsubstituted phenyl group or two $R_2$(s) may be combined to provide a ring; and $X_1$ may be a carbon atom (C).

In one or more embodiments, the copolymer may have the structural unit represented by Chemical Formula 1, wherein $R_1$ may be a substituted or unsubstituted branched alkyl group having 3 to 5 carbon atoms (isopropyl group, sec-butyl group, tert-butyl group, isopentyl group, or neopentyl group), or $-Y-N(Ar_2)(Ar_3)$, wherein Y may be a substituted or unsubstituted phenylene group (o-, m-, p-phenylene group), a substituted or unsubstituted fluorenylene group, or a substituted or unsubstituted dibenzofuranylene group, $Ar_2$ and $Ar_3$ may each independently be a substituted or unsubstituted fluorenyl group (particularly, fluorenyl group substituted with two alkyl groups having 1 to 3 carbon atoms (particularly methyl group)) or a substituted or unsubstituted biphenyl group (particularly unsubstituted biphenyl group); $R_2$ may be a substituted or unsubstituted alkyl group having 1 to 3 carbon atoms (particularly methyl group) or unsubstituted phenyl group, or two phenyl groups may be combined to provide a fluorene ring; and $X_1$ may be a carbon atom (C).

In other words, examples of Structural Unit (1-1) and Structural Unit (2-1) (the structural unit on the left except for "$-Ar_1-$" in Chemical Formula 1 or Chemical Formula 2) may be the structural units of Group 1. The copolymer having the structural unit of Group 1 may further improve exciton resistance, electron resistance, and hole mobility (thus, luminous efficiency and durability ((luminescence life-span)) may be improved).

Group 1

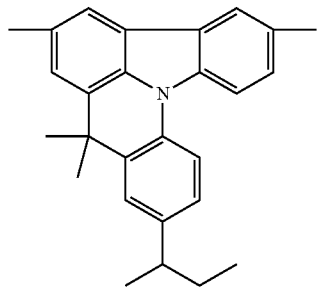

-continued
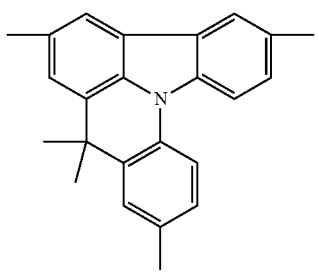
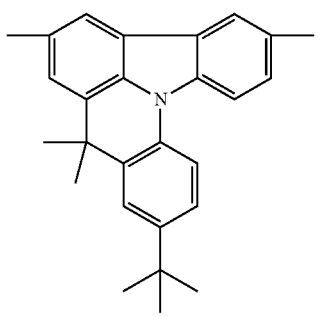
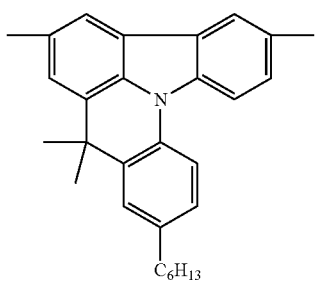
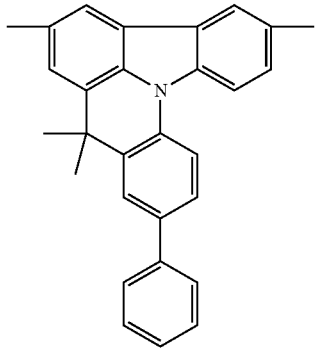
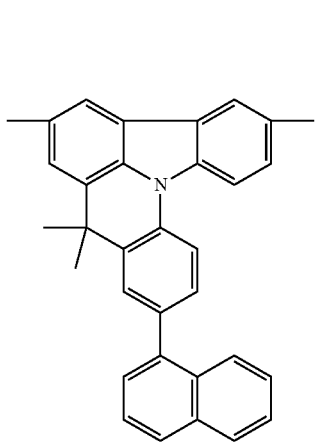
-continued
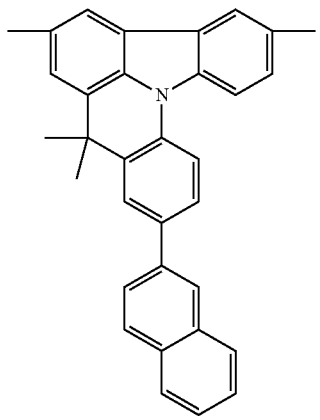
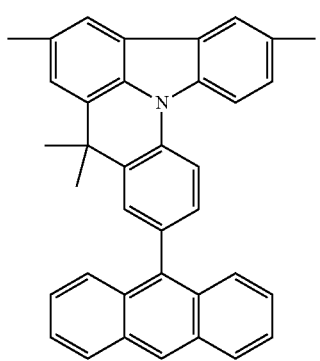
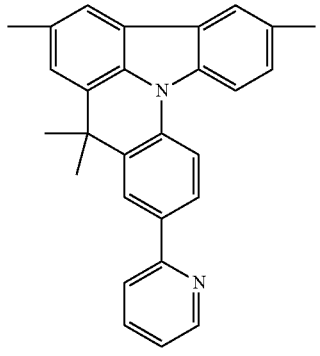
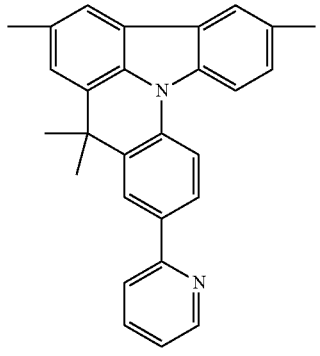
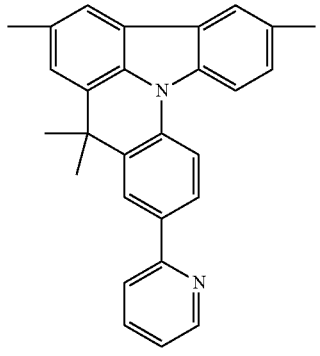

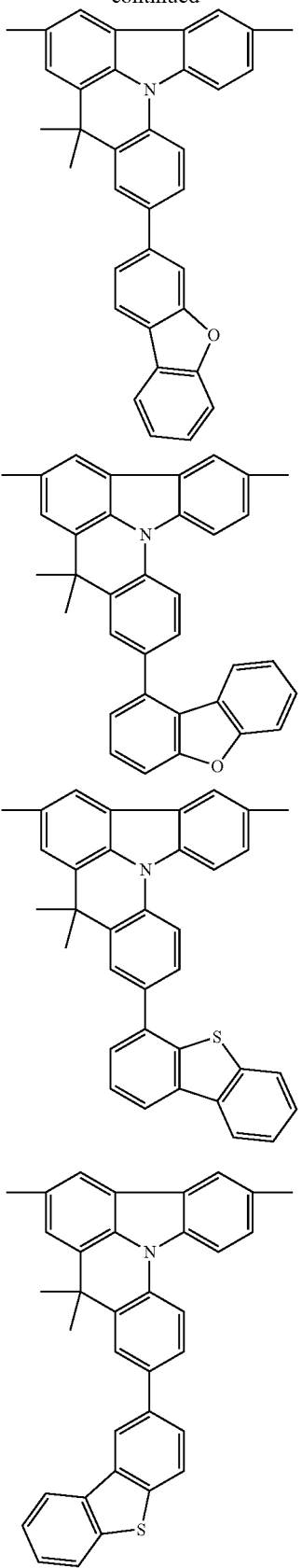
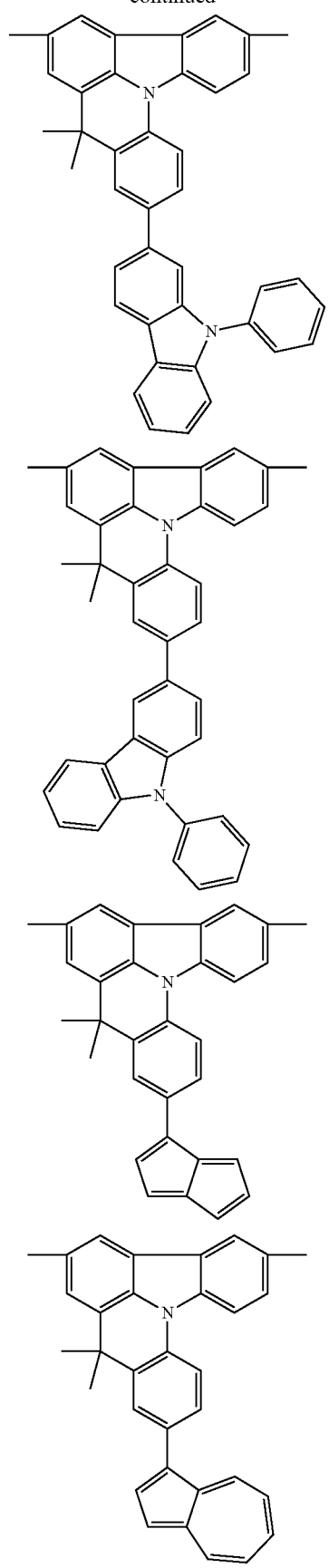

19
-continued
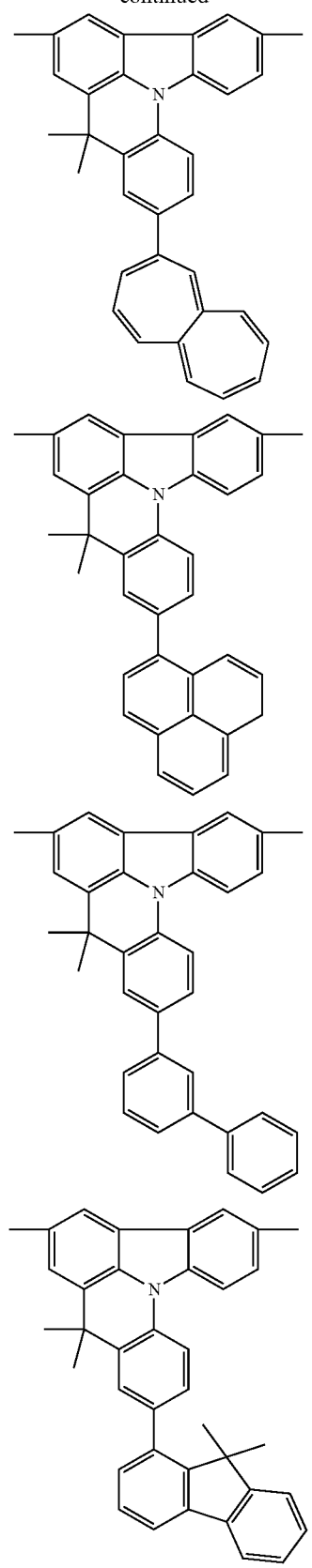
20
-continued
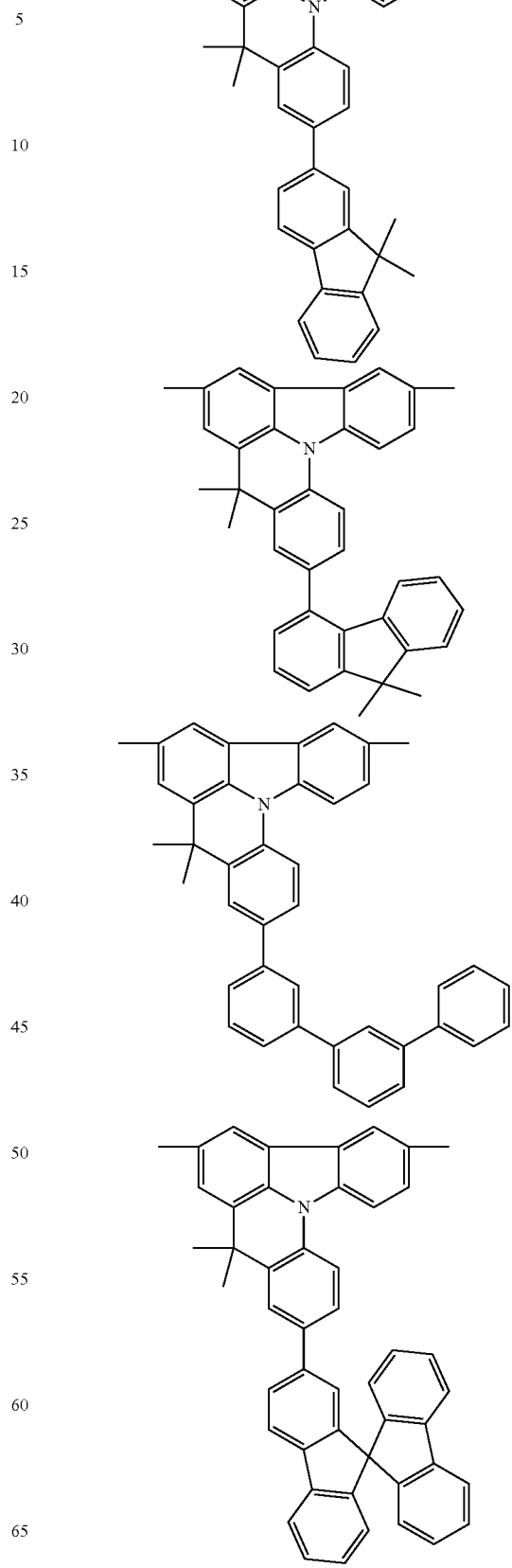

21
-continued
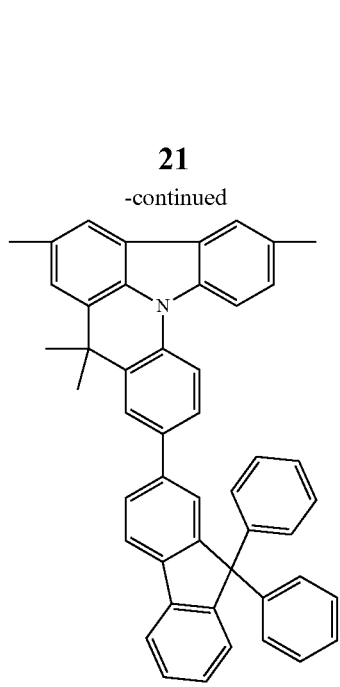
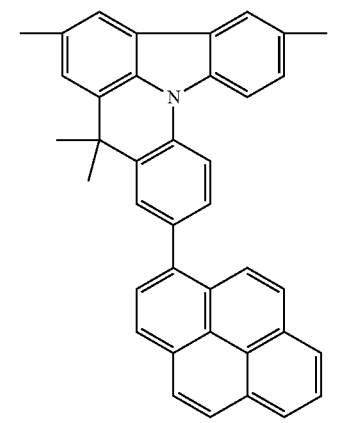
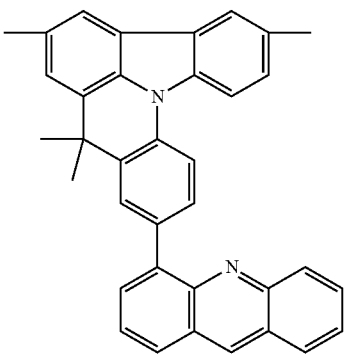
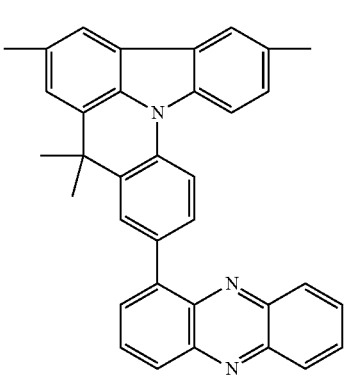
22
-continued
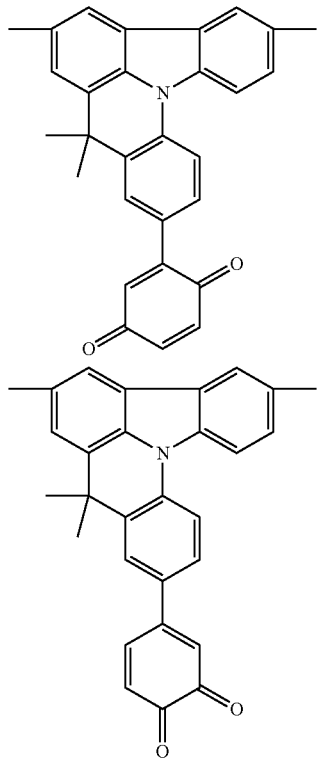
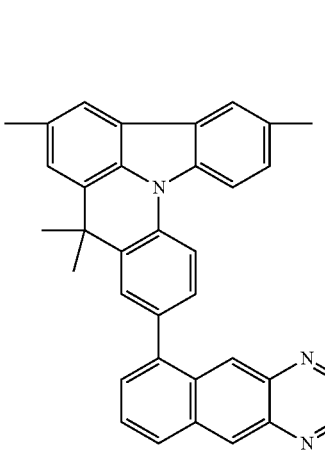
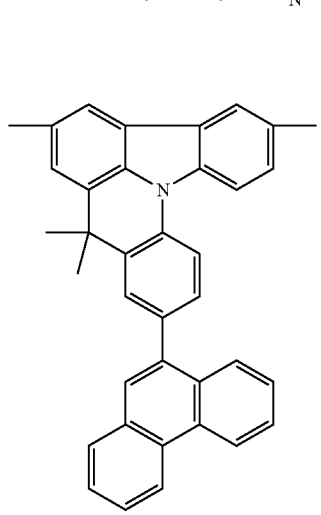
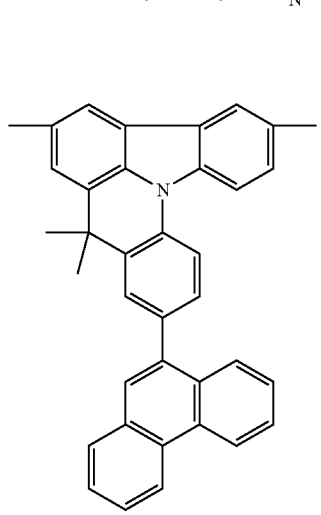

23
-continued
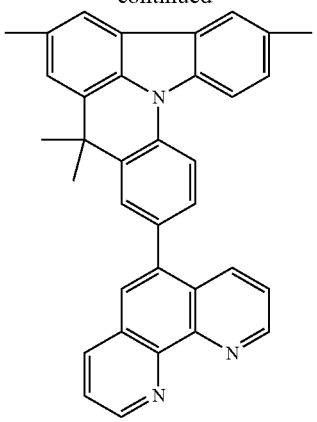
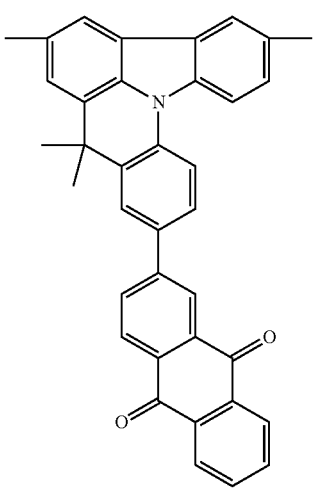
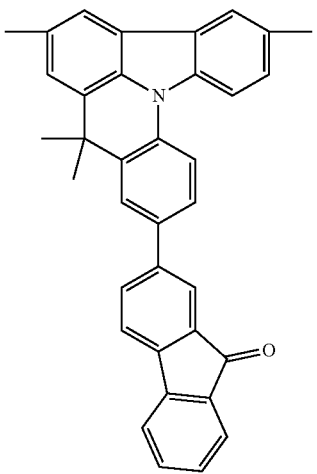
24
-continued
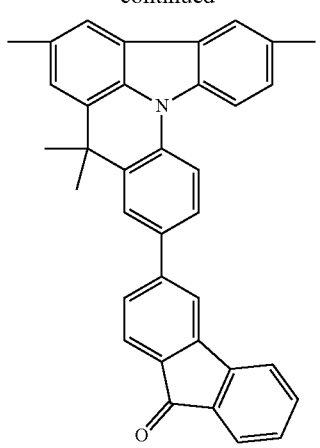
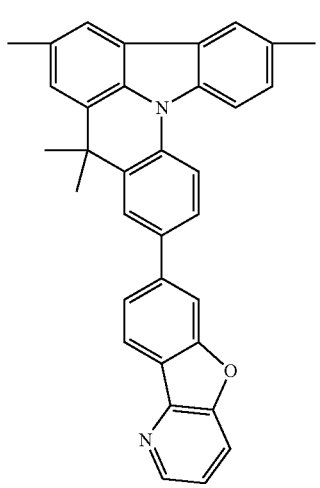
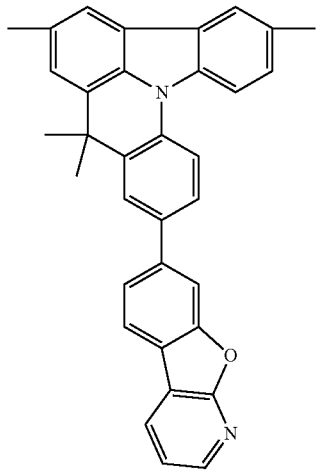

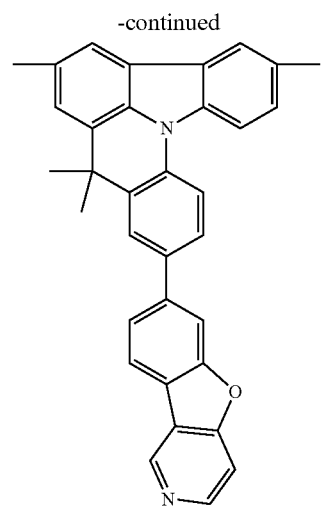
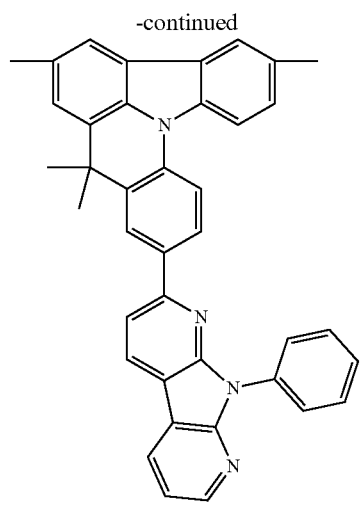
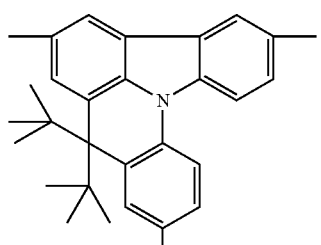
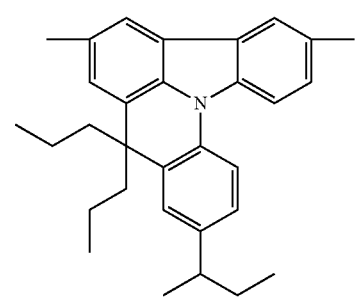
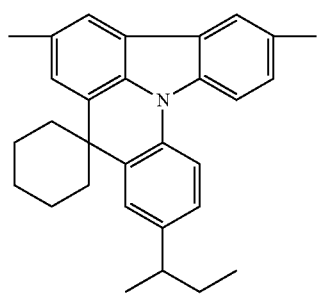
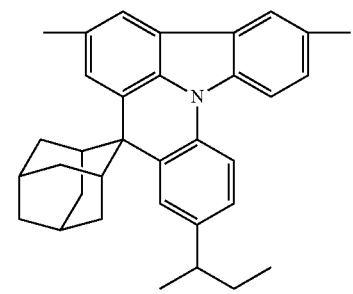

27
-continued
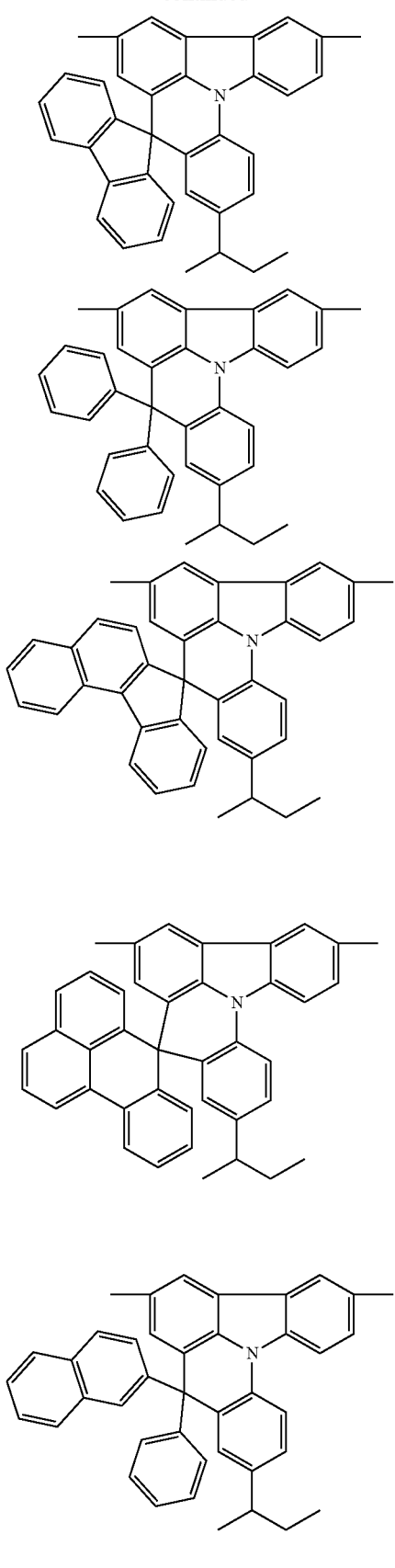
28
-continued
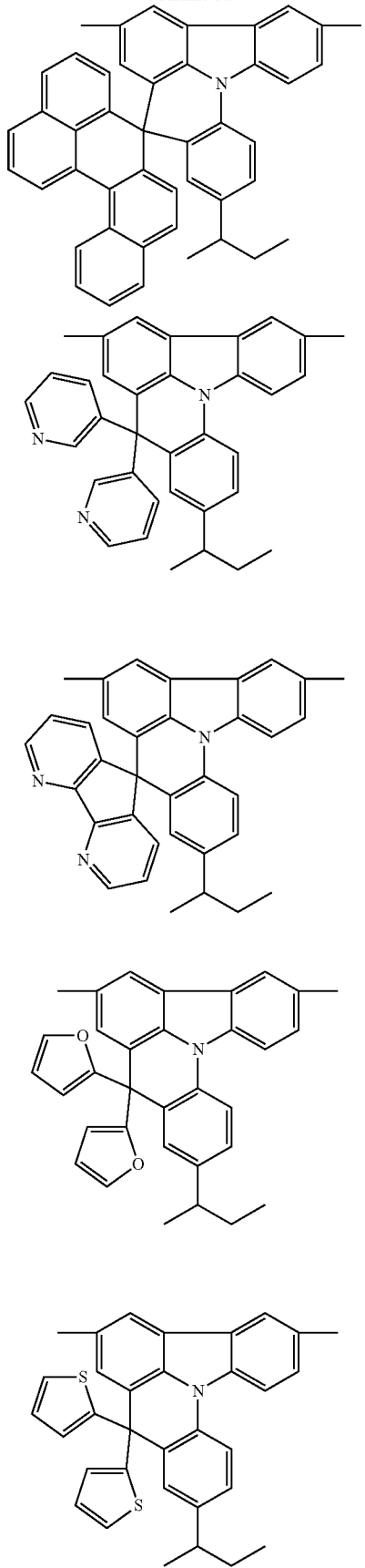

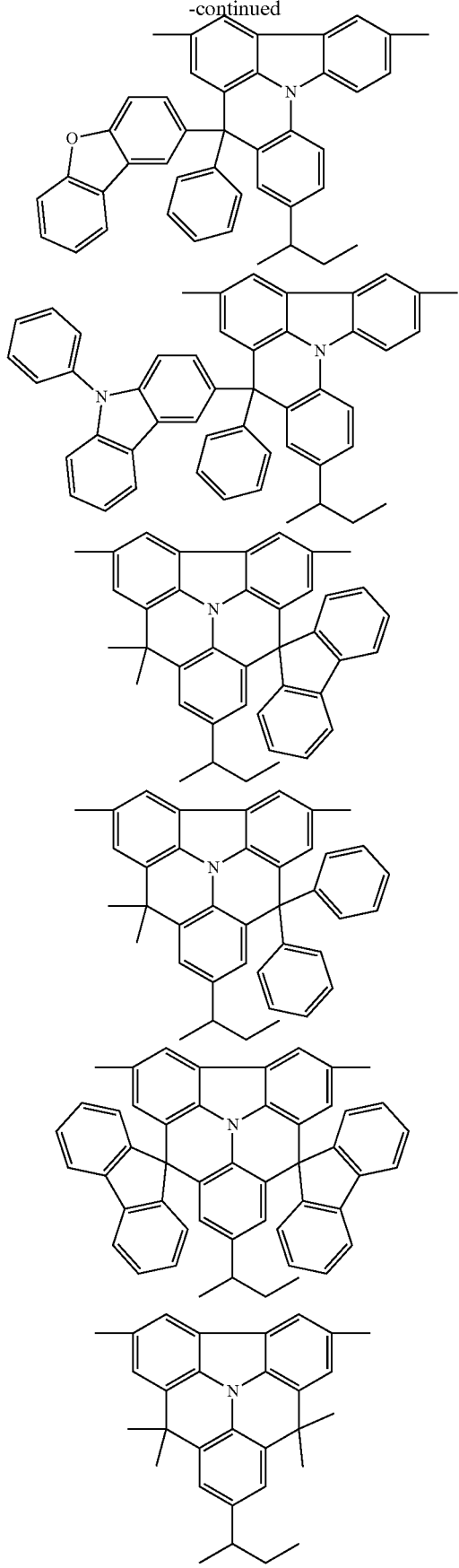
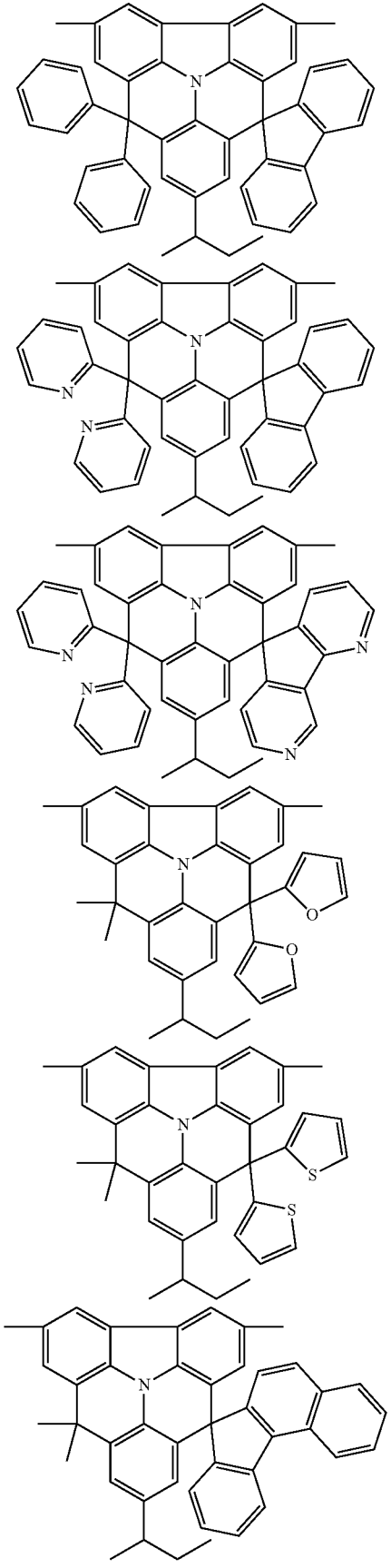

31
-continued
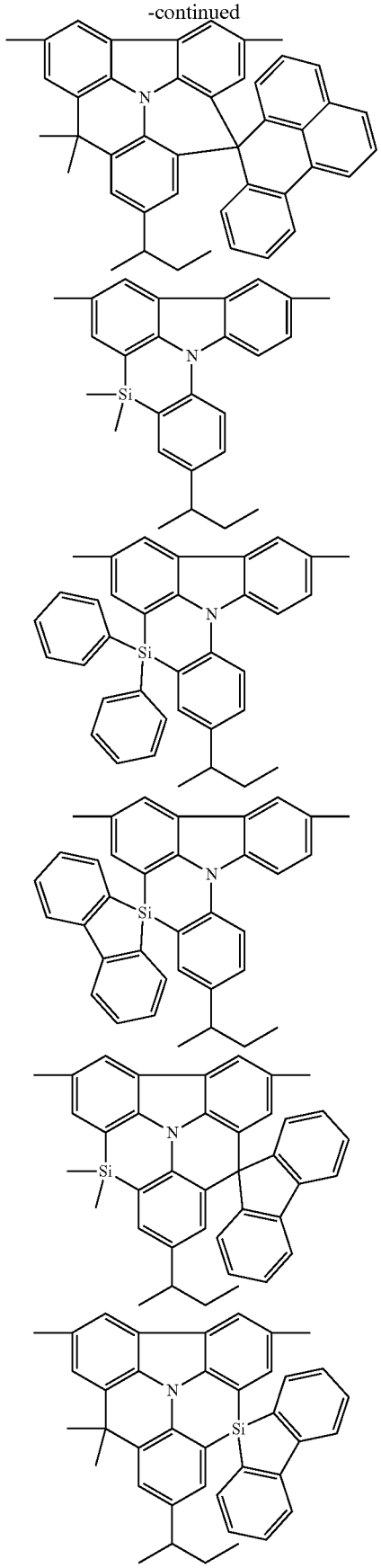
32
-continued
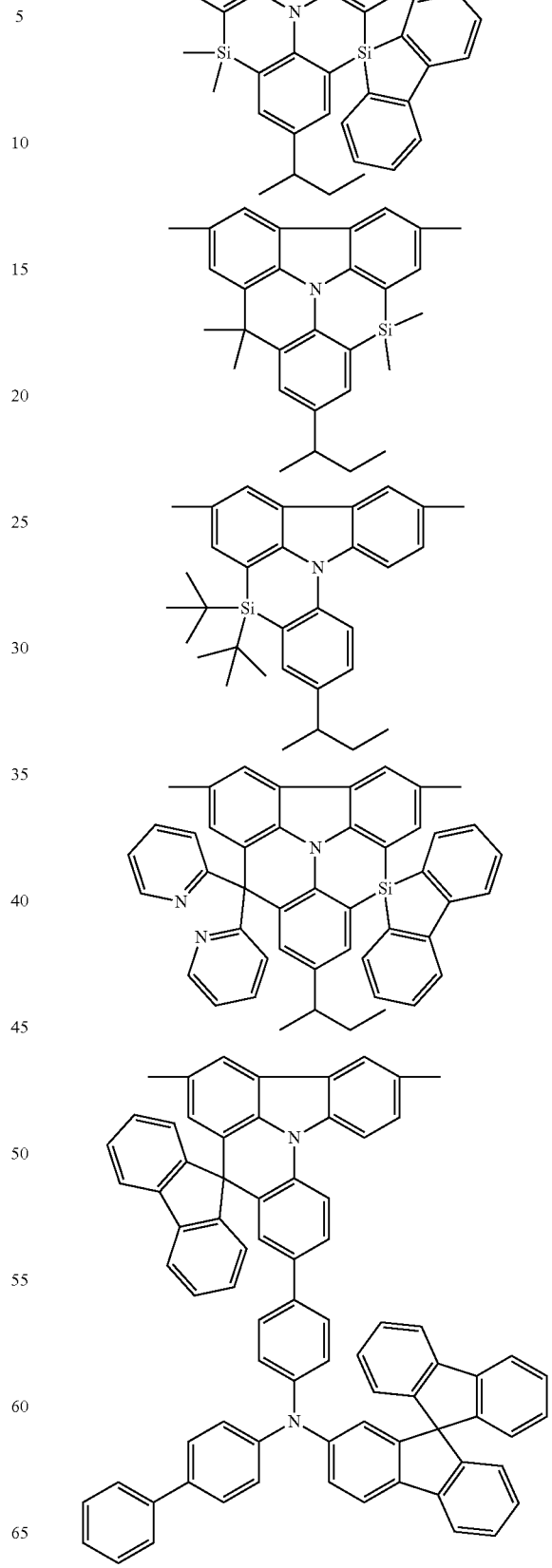

33
-continued
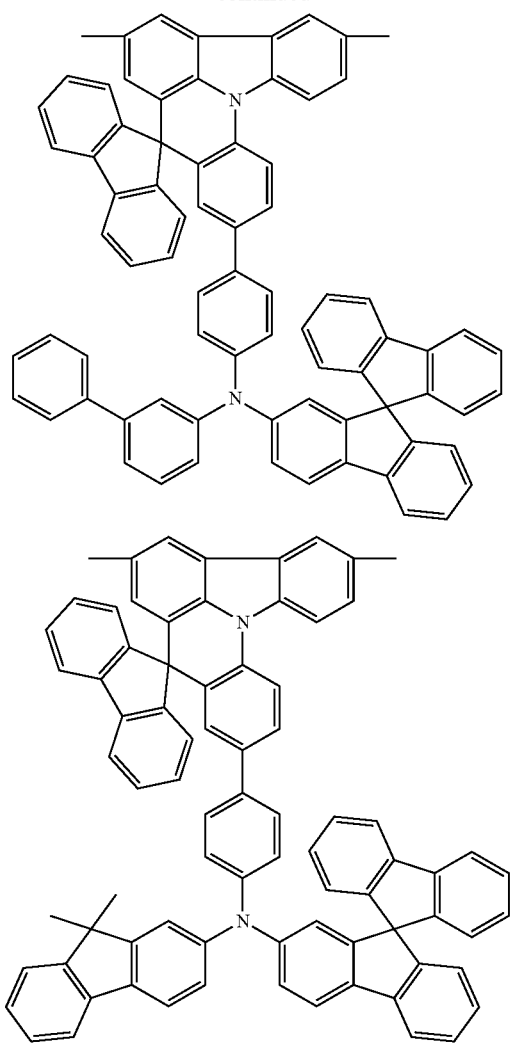
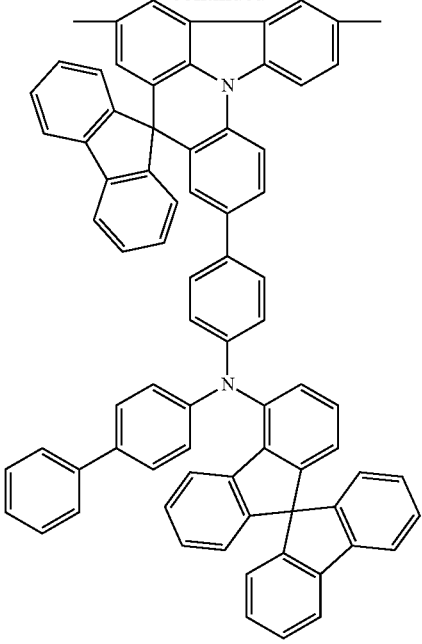
34
-continued
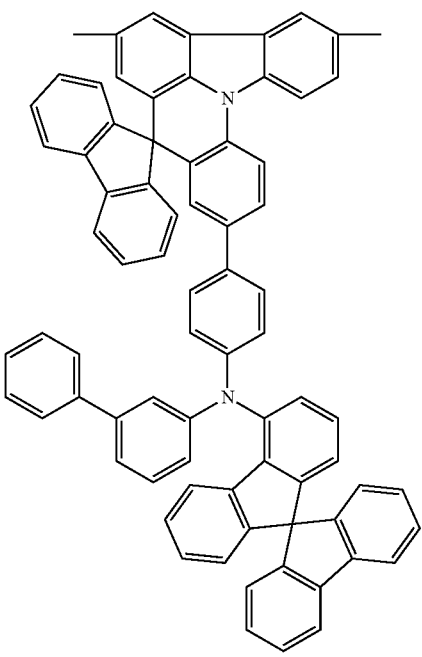

35
-continued
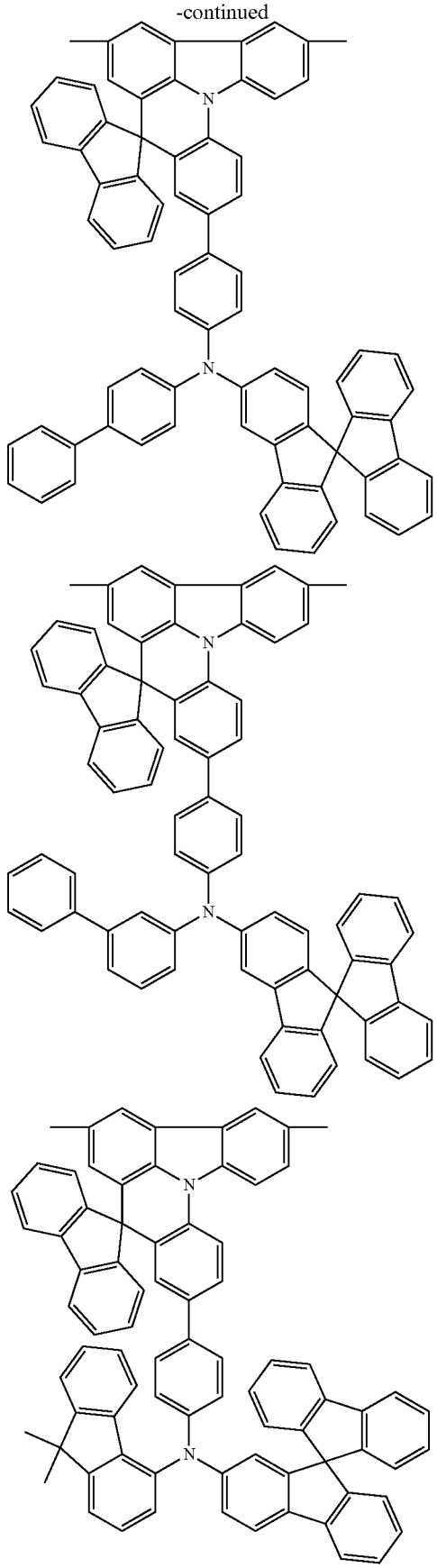
36
-continued
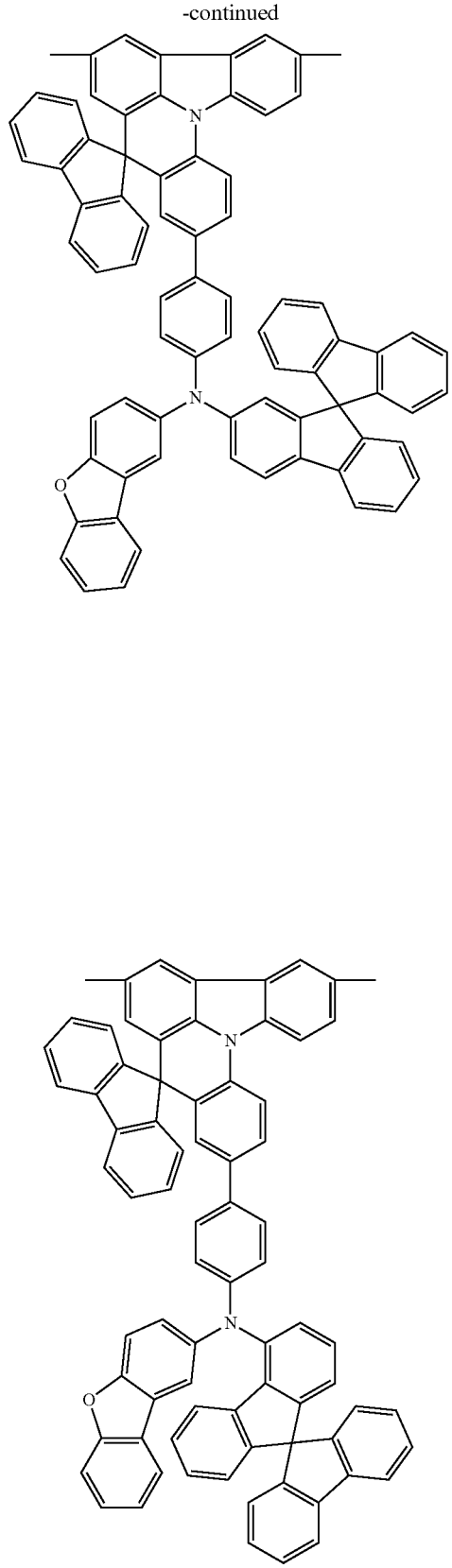

37
-continued
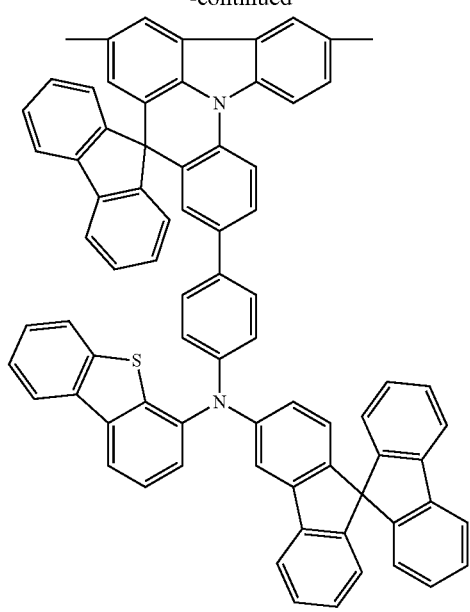
38
-continued
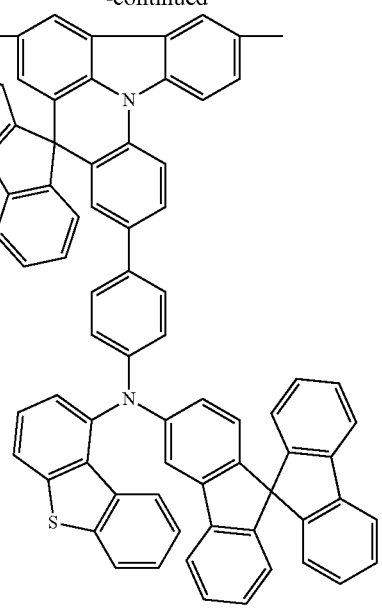
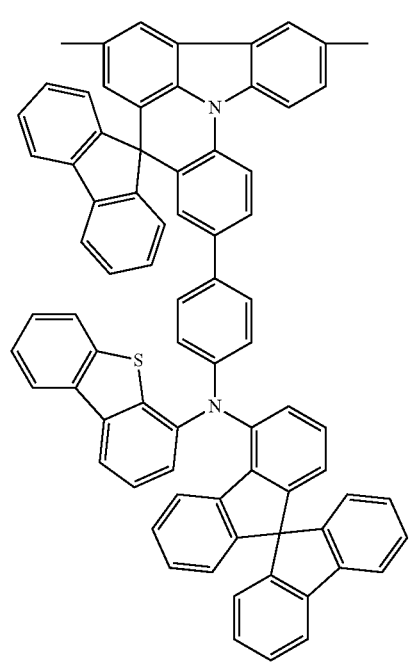
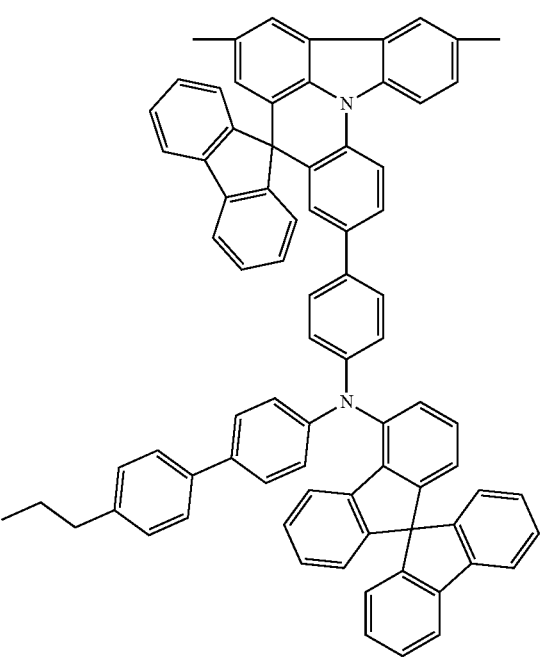

39
-continued
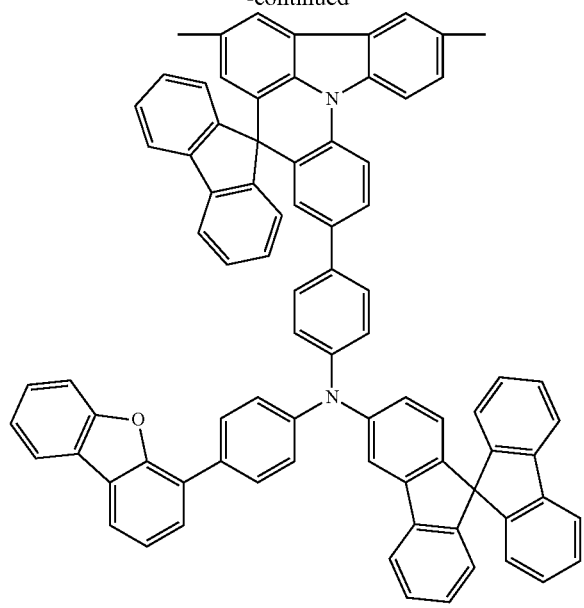
40
-continued
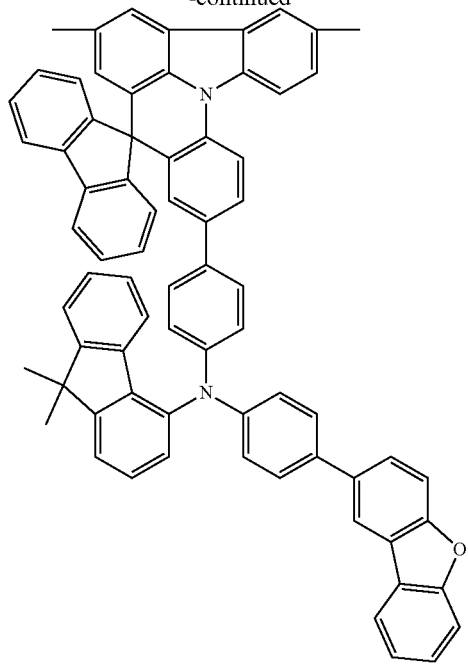
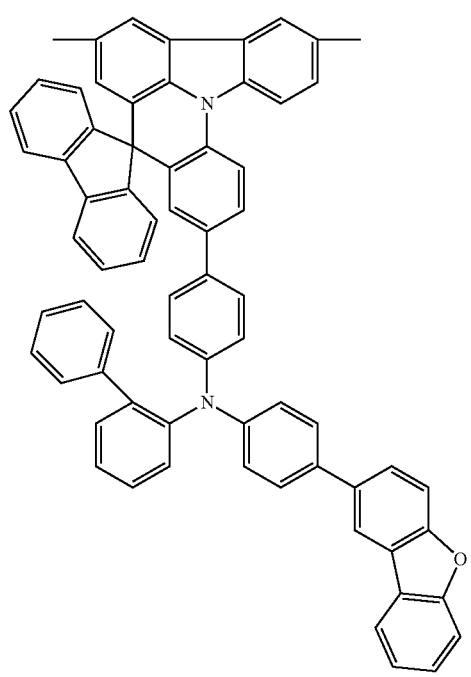
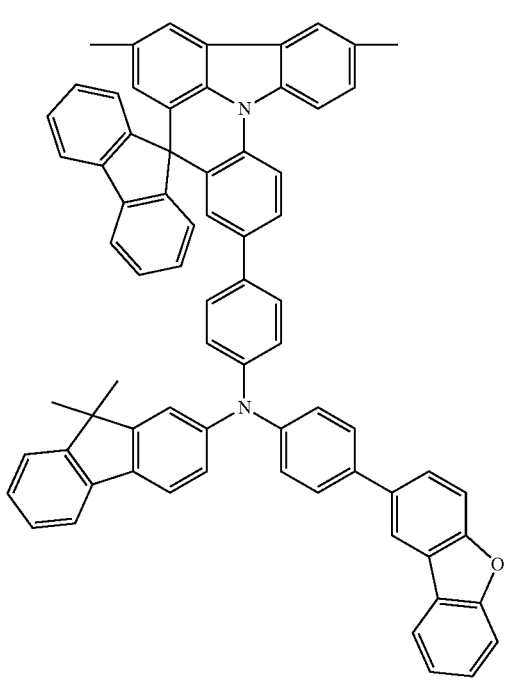

-continued
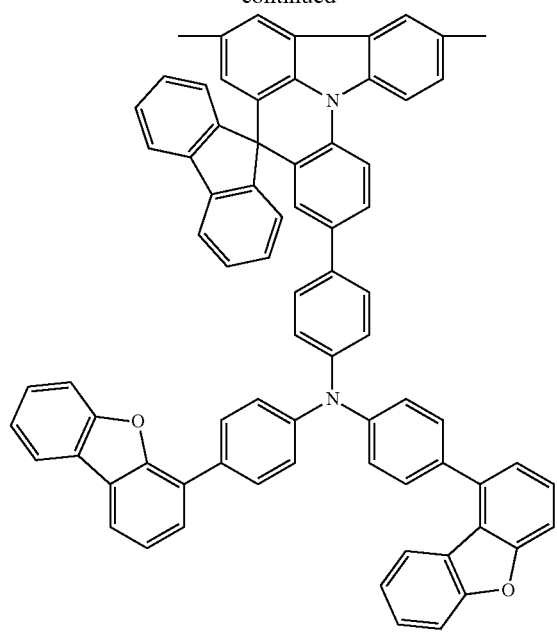
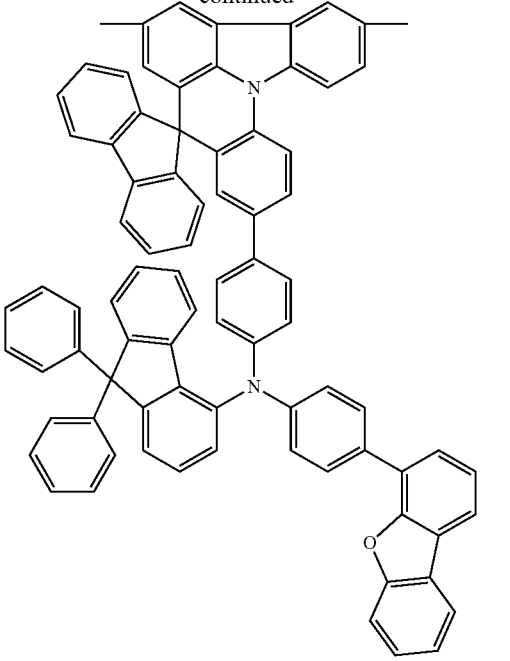
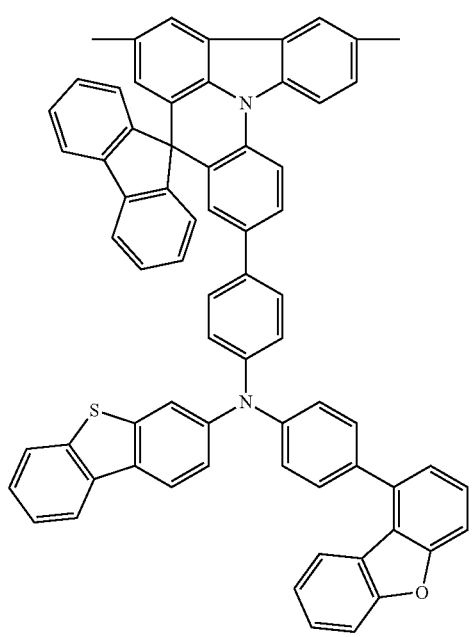
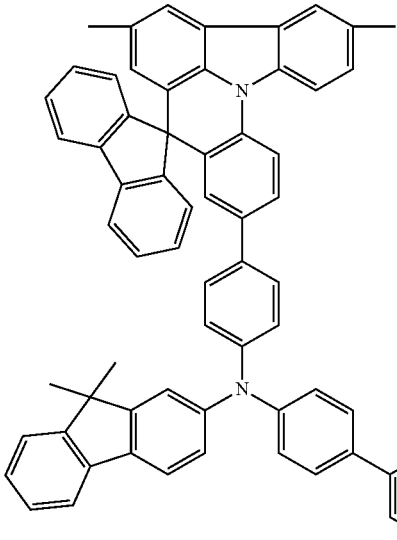

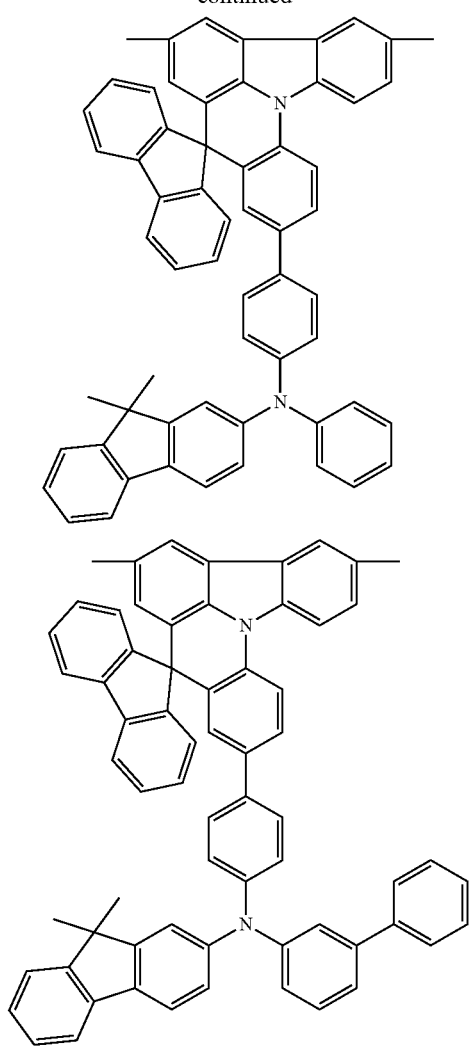
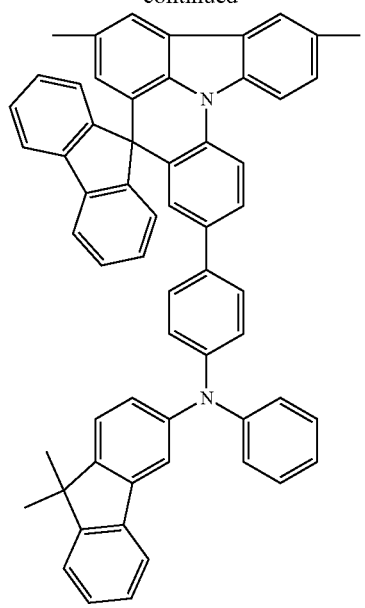
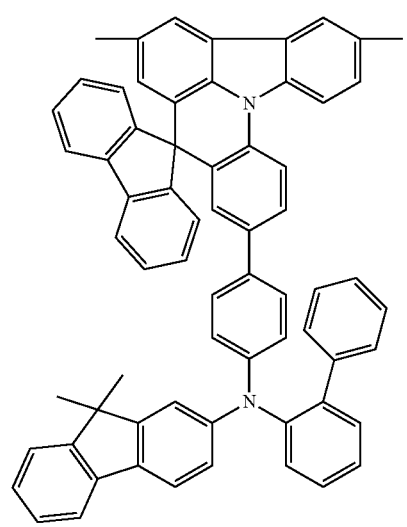
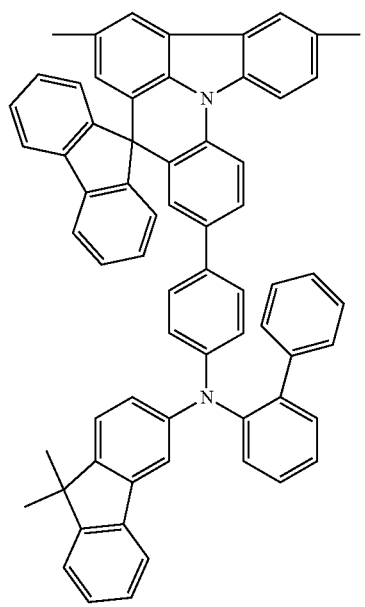

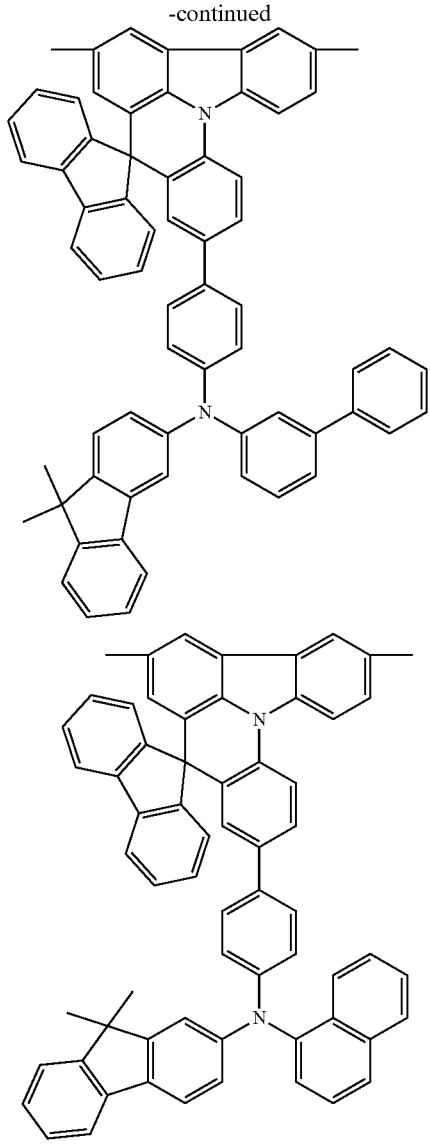
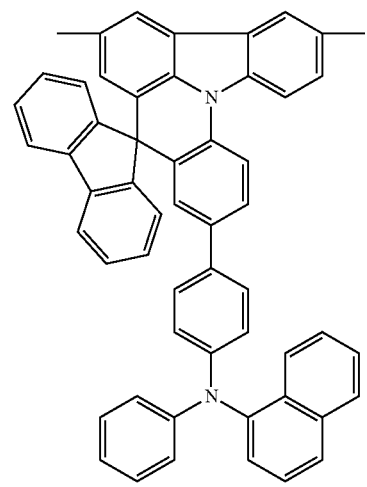
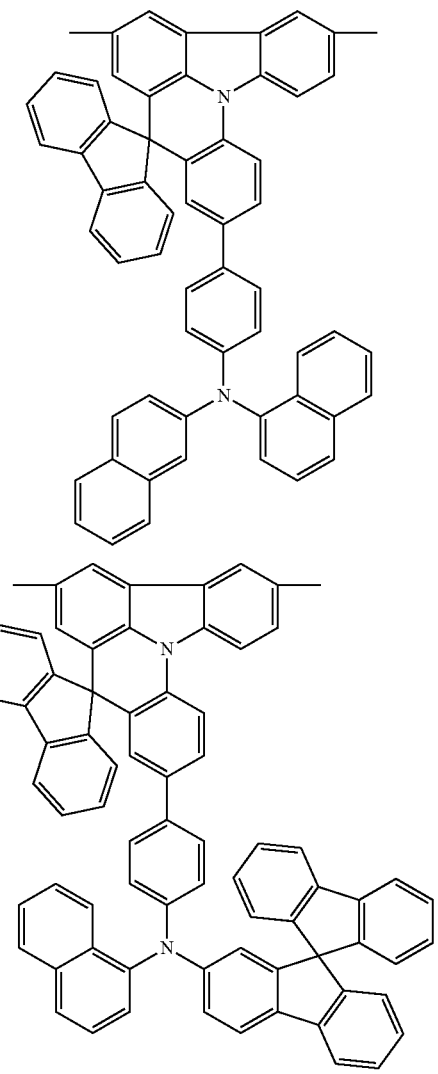
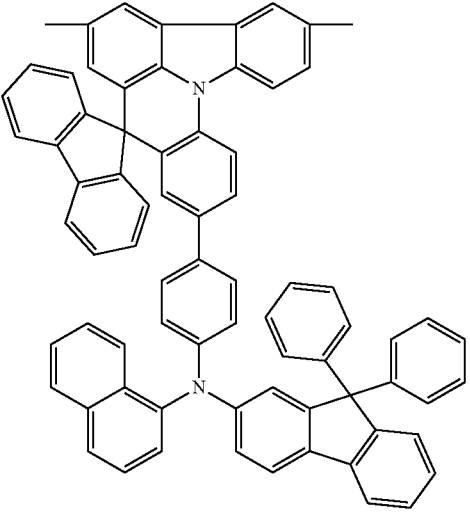

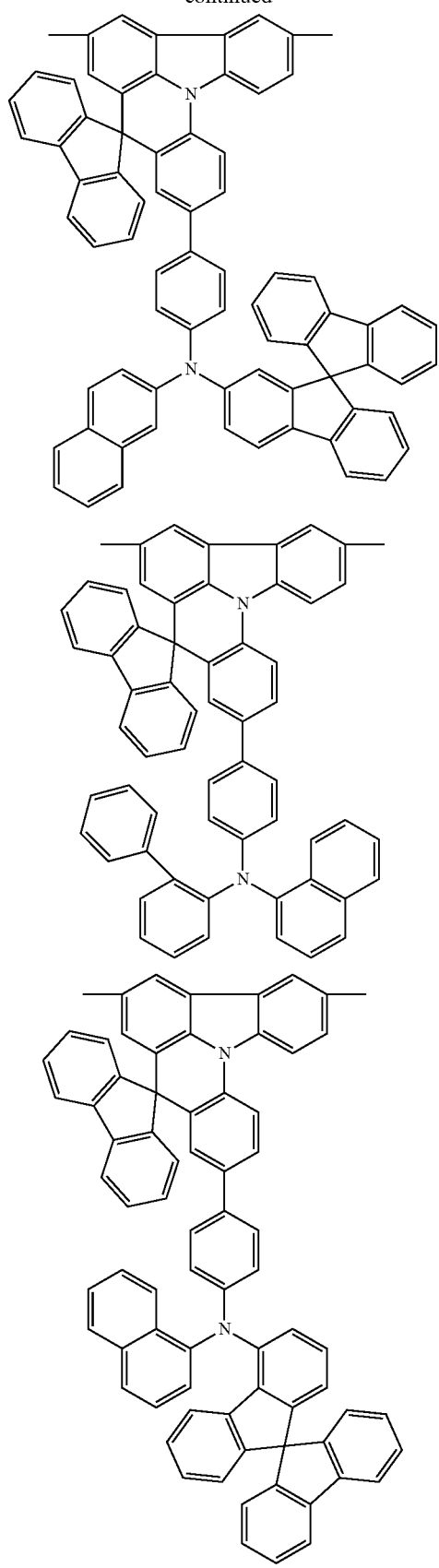
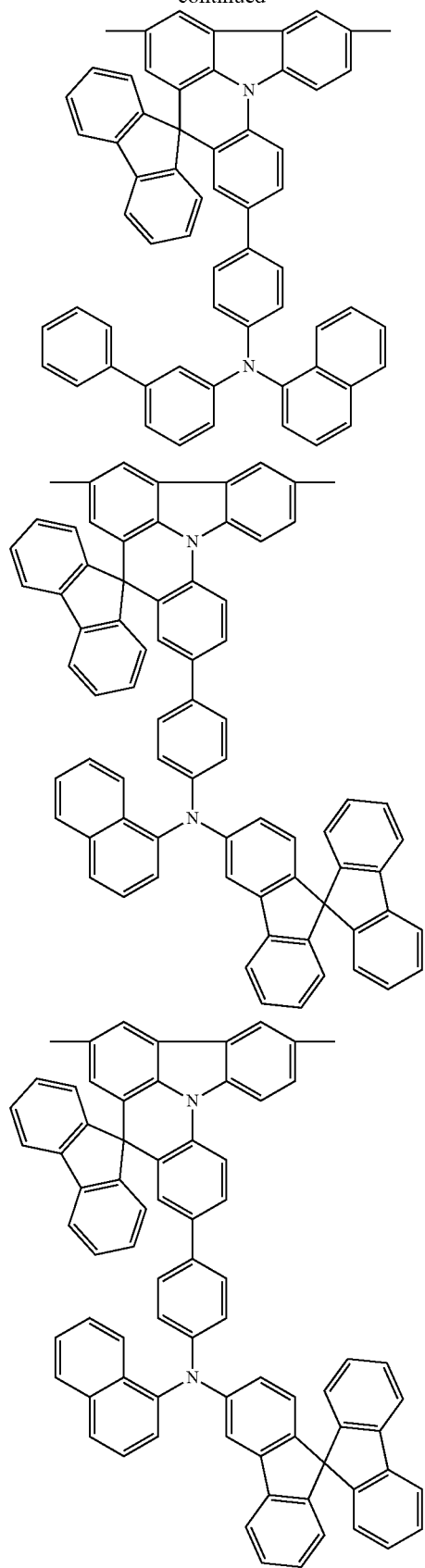

49
-continued
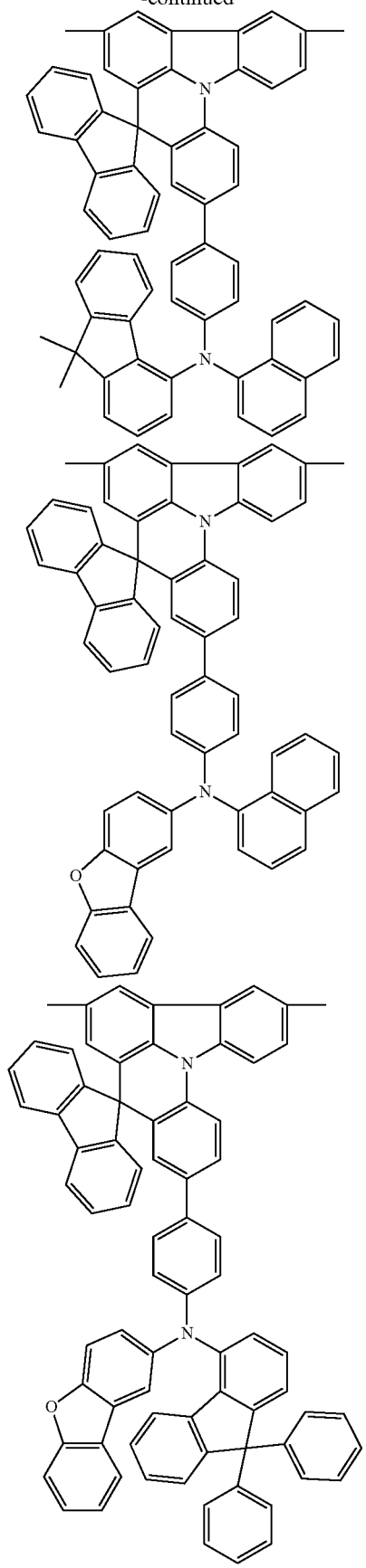
50
-continued
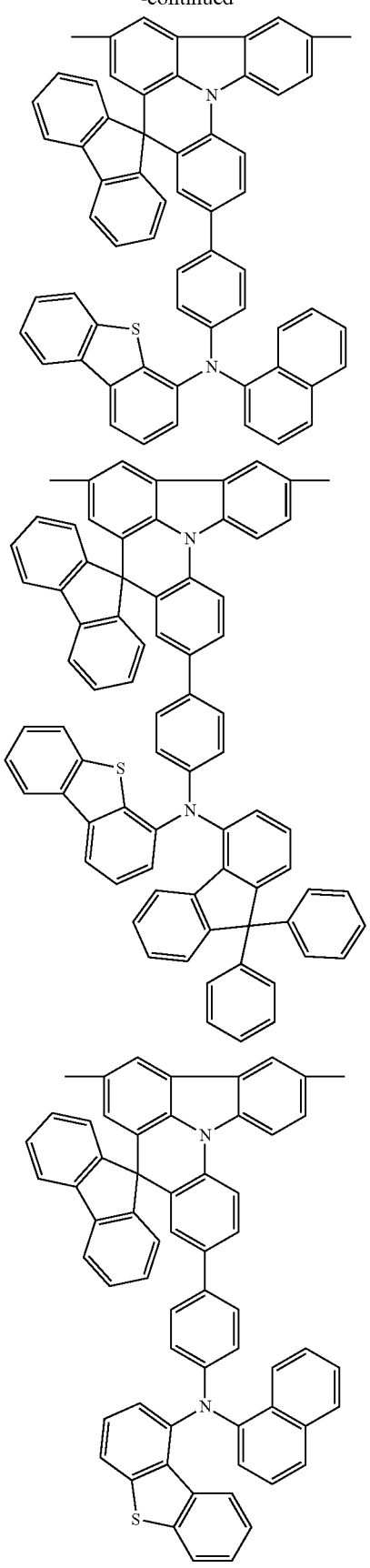

51
-continued
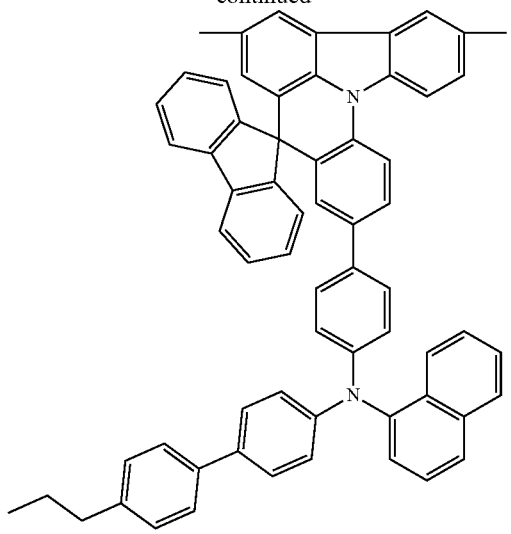
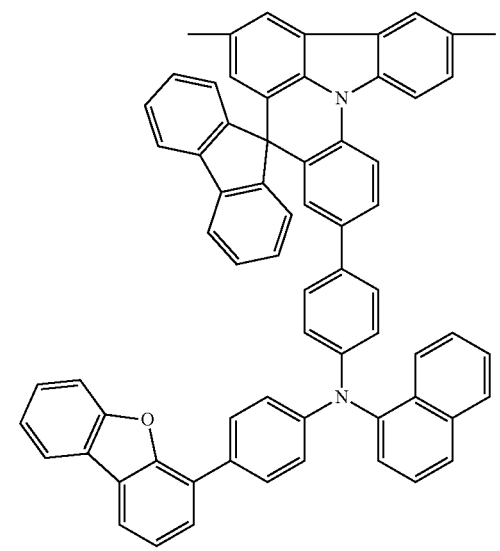
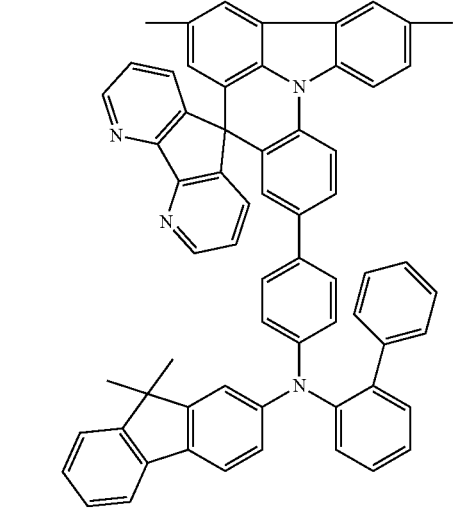
52
-continued
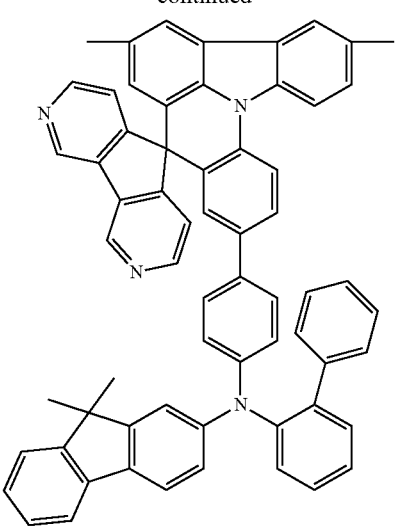
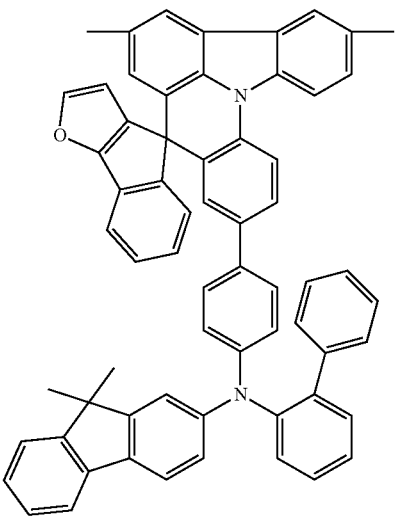
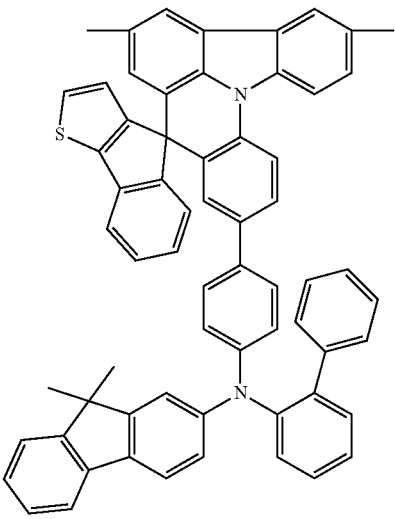

-continued

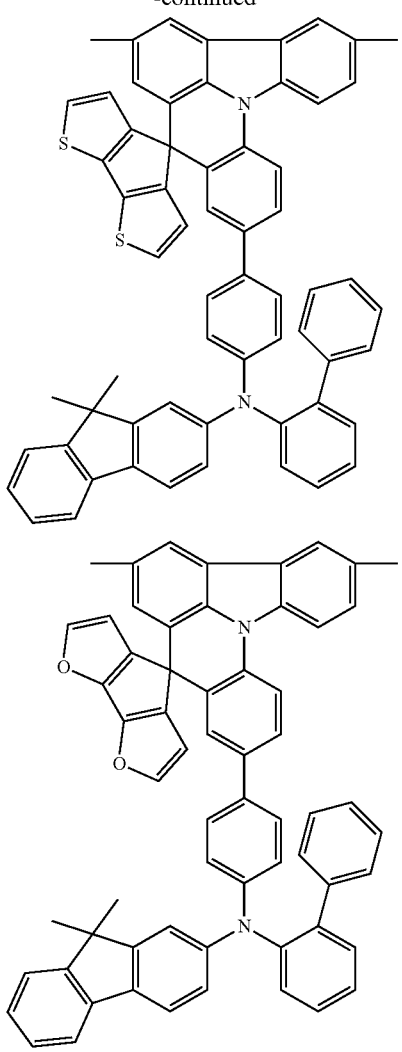

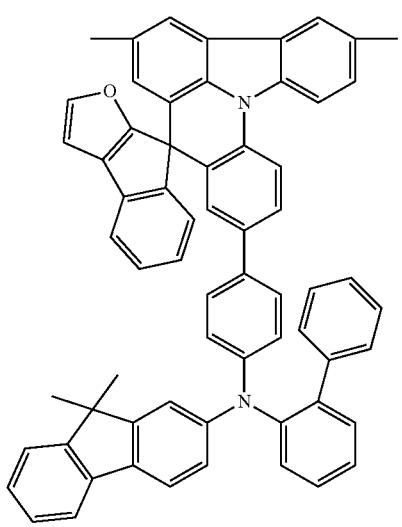

-continued

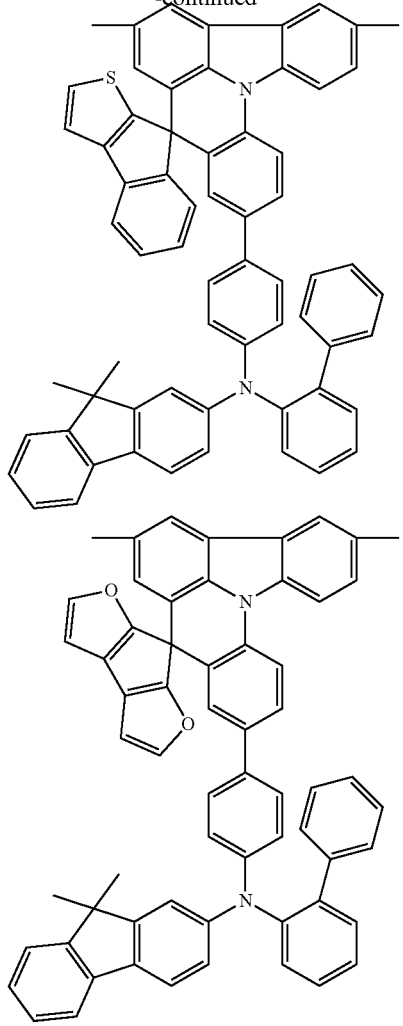

The copolymer of Chemical Formula 1 or Chemical Formula 2 further includes a structural unit of "—Ar$_1$—" in addition to Structural Unit (1-1) and Structural Unit (2-1). When two or more types of Structural Units (1) or Structural Units (2) are present, "—Ar$_1$—" of each Structural Unit (1) or Structural Unit (2) may be the same or different from each other. Herein, An may be a substituted or unsubstituted divalent aromatic hydrocarbon group having 6 to 30 carbon atoms, or a substituted or unsubstituted divalent aromatic heterocyclic group having 5 to 30 ring-member atoms. As the divalent aromatic hydrocarbon group having 6 to 30 carbon atoms and divalent aromatic heterocyclic group having 5 to 30 ring-member atoms, the divalent group derived from the aromatic hydrocarbon compound and the heterocyclic aromatic compound in R$_1$ may be exemplified in the same manner.

Among these, from the viewpoint of new further enhancement of exciton resistance, electron resistance, and hole mobility (thus novel improvement of luminous efficiency and durability (luminescence life-span)), An may be a group represented by one of Chemical Formula 3 to Chemical Formula 18:

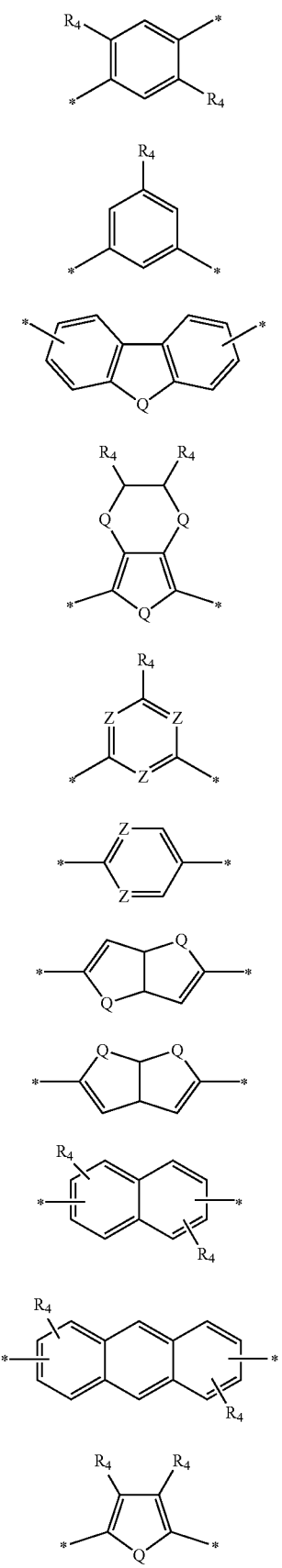

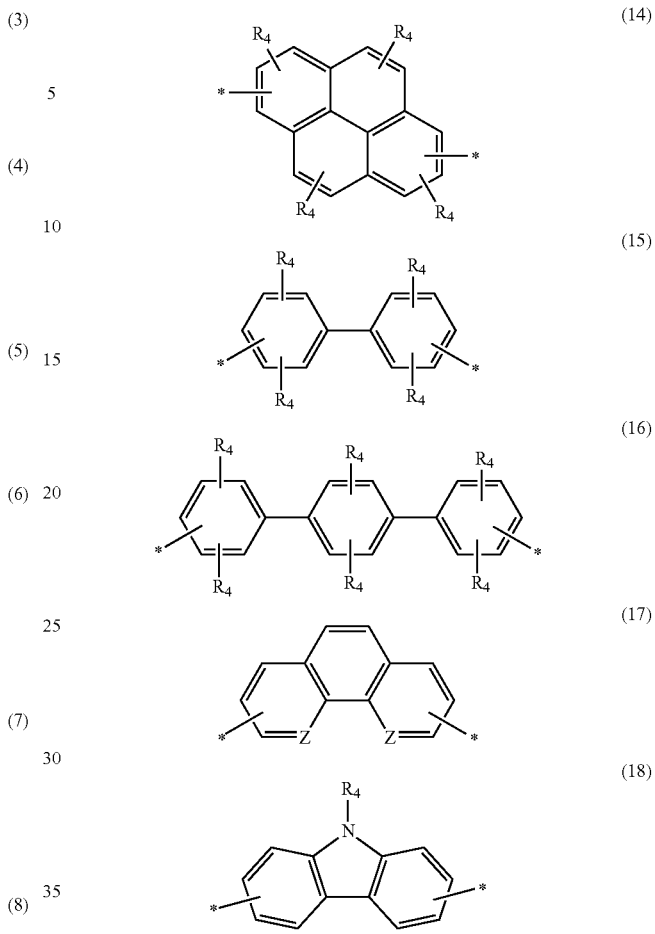

In Chemical Formula 3 to Chemical Formula 18, each $R_4$ may independently be hydrogen, an alkyl group having 1 to 20 carbon atoms, a substituted or unsubstituted monovalent aromatic hydrocarbon group having 6 to 30 carbon atoms, or a substituted or unsubstituted monovalent aromatic heterocyclic group having 5 to 30 ring-member atoms. When a plurality of $R_4$(s) is present, these $R_4$(s) may be the same or different from each other. As the alkyl group having 1 to 20 carbon atoms, the alkyl groups in "substituent" above may be exemplified in the same manner. As the monovalent aromatic hydrocarbon group having 6 to 30 carbon atoms and the monovalent aromatic heterocyclic group having 5 to 30 ring-member atoms, the monovalent group derived from the aromatic hydrocarbon compound and the heterocyclic aromatic compound in $R_1$ may be exemplified in the same manner.

Among these, from the viewpoint of new further enhancement of exciton resistance, electron resistance, and hole mobility (thus novel improvement of luminous efficiency and durability (luminescence life-span)), $R_4$ may each independently be a linear alkyl group having 3 to 20 carbon atoms, a branched alkyl group having 3 to 20 carbon atoms, or hydrogen, and desirably a linear alkyl group having 6 to 12 carbon atoms or hydrogen.

In Group 2 (Chemical Formula 3 to Chemical Formula 18), each Q may independently be —O—, —S—, —Se—, —$CR_5R_6$—, or —$SiR_5R_6$—. In one or more embodiments, Q's may be desirably —$CR_5R_6$— or —$SiR_5R_6$—, and more desirably —$CR_5R_6$—.

When Q is —$CR_5R_6$— or —$SiR_5R_6$—, $R_5$ and $R_6$ may each independently be a hydrogen atom, a deuterium atom, a substituted or unsubstituted alkyl group having 1 to 20 carbon atoms, a substituted or unsubstituted aryl group, or a substituted or unsubstituted heteroaryl group. $R_5$ and $R_6$ may be the same or different from each other.

Herein, as the alkyl group and the aryl group, an alkyl group and an aryl group as in the "substituent" above may be exemplified, respectively. The heteroaryl group may be, for example, a 1-pyrrolyl group, a 2-pyrrolyl group, a 3-pyrrolyl group, a pyradinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-carbazolyl group, a 3-carbazolyl group, a 4-carbazolyl group, a 9-carbazolyl group, a 1-acridinyl group, a 2-acridinyl group, a 3-acridinyl group, a 4-acridinyl group, a 9-acridinyl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, and the like.

Among these, from the viewpoint of new further enhancement of exciton resistance, electron resistance, and hole mobility (thus novel improvement of luminous efficiency and durability (luminescence life-span)), $R_5$ and $R_6$ may be a linear or branched alkyl group having 3 to 20 carbon atoms, desirably a linear alkyl group having 6 to 12 carbon atoms, and more desirably a linear alkyl group having 7 to 9 carbon atoms.

In Group 2 (Chemical Formula 3 to Chemical Formula 18), each Z may independently be —$CR_7$=, —N=, or —$SiR_7$=, wherein, $R_7$ may be hydrogen, a deuterium atom, a substituted or unsubstituted alkyl group having 1 to 20 carbon atoms, a substituted or unsubstituted aryl group, or a substituted or unsubstituted heteroaryl group. Herein, as the alkyl group and the aryl group, the alkyl group and the aryl group as in the "substituent" above may be exemplified, respectively. Also, as the heteroaryl group, the heteroaryl group as in $R_5$ and $R_6$ may be exemplified.

In Group 2 (Chemical Formula 3 to Chemical Formula 18), * is a binding site forming a main chain of the copolymer.

In Group 2, $Ar_1$ may be a group represented by Chemical Formula 3, Chemical Formula 4, Chemical Formula 5, or Chemical Formula 13; desirably group represented by Chemical Formula 3 (each $R_4$ may independently be a linear alkyl group having 3 to 20 carbon atoms, a branched alkyl group having 3 to 20 carbon atoms, or a hydrogen atom), or a group represented by Chemical Formula 5 (Q may be —$CR_5R_6$—, wherein, $R_5$ and $R_6$ may each independently be a linear or branched alkyl group having 3 to 20 carbon atoms); desirably a group represented by Chemical Formula 3 (each $R_4$ may independently be a linear alkyl group having 6 to 12 carbon atoms or a hydrogen atom), or a group represented by Chemical Formula 5 (Q may be —$CR_5R_6$—, wherein, $R_5$ and $R_6$ may each independently be a linear alkyl group having 6 to 12 carbon atoms); and more desirably, a group represented by Chemical Formula 5 (Q may be —$CR_5R_6$—, wherein, $R_5$ and $R_6$ may each independently be a linear alkyl group having 7 to 9 carbon atoms).

A composition including the copolymer incorporating a Structural Unit (1) and/or Structural Unit (2) is not particularly limited. Considering the new further improvement of exciton resistance, electron resistance, and hole mobility by the copolymer (thus the new improvement of luminous efficiency and durability (luminescence life-span)), Structural Unit (1) and/or Structural Unit (2) may be included in the copolymer in an amount of greater than or equal to about 85 mol % and less than or equal to about 100 mol %, for example, greater than about 90 mol % less than or equal to about 100 mol %, or 100 mol % based on the total amount of the structural units constituting the copolymer. (The copolymer may be composed of Structural Unit (1) and/or Structural Unit (2) alone without other structural repeating units).

On the other hand, when the copolymer contains two or more types of Structural Units (1) or two or more types of Structural Units (2), each content of Structural Unit (1) or Structural Unit (2) refers to each sum of Structural Units (1) or Structural Units (2). Moreover, when the copolymer contains both of Structural Unit (1) and Structural Unit (2), the content refers to a sum of Structural Unit (1) and Structural Unit (2).

The copolymer may further contain other structural units in addition to Structural Unit (1) or Structural Unit (2). Herein, the other structural units may be a structural unit derived from compounds, such as azulene, naphthalene, anthracene, terphenylene, phenanthrene, and the like.

Herein, when the copolymer contains the other structural units, the composition of the other structural units is not particularly limited.

Considering the new further improvement of exciton resistance, electron resistance, and hole mobility by the copolymer (thus the new improvement of luminous efficiency and durability (luminescence life-span)), the content of the other structural units in the copolymer may be greater than about 0 mol % and less than about 15 mol %, for example, greater than or equal to about 0.5 mol % and less than or equal to about 10 mol %, based on the total structural units constituting the copolymer.

On the other hand, when the copolymer contains two or more different structural units, the content of the other structural units refers to the total amount of the other structural units.

The weight average molecular weight (Mw) of the copolymer is not particularly limited as long as the desired effect of the present disclosure is obtained. The weight average molecular weight (Mw) may be, for example, about 2,000 grams per mole (g/mol) to about 500,000 g/mol, for example about 5,000 g/mol to about 200,000 g/mol. With such a weight average molecular weight, it is possible to appropriately adjust the viscosity of the coating composition for forming a layer including the copolymer (for example, a hole injection layer, a hole transport layer), and to form a layer having a uniform film thickness.

The number average molecular weight (Mn) of the copolymer is not particularly limited as long as the desired effect of the present disclosure is obtained. The number average molecular weight (Mn) may be, for example, about 1,000 g/mol to about 200,000 g/mol, for example about 2,500 g/mol to about 100,000 g/mol. With such a number average molecular weight, it is possible to appropriately adjust the viscosity of the coating composition for forming a layer (for example, a hole injection layer, a hole transport layer) formed using the copolymer and to form a layer having a uniform film thickness.

In addition, a polydispersity (weight average molecular weight/number average molecular weight) of the copolymer of the present embodiment may be, for example, about 1.10 to about 5.00, for example about 1.20 to about 2.00.

Herein, the measurement of Mn and the Mw is not particularly limited and may be applied by using a known method or by appropriately changing the known methods. In the present specification, the Mn and the Mw refer to values measured by the following method. The polydispersity (Mw/Mn) of the polymer is calculated by dividing the Mw by the Mn measured by the following method.

Measurement of Number Average Molecular Weight (Mn) and Weight Average Molecular Weight (Mw)

The number average molecular weight (Mn) and the weight average molecular weight (Mw) of the copolymer (in the following, polymer material) are measured under the following conditions by size exclusion chromatography (SEC) using polystyrene as a standard material.
  Analysis equipment (SEC): Shimadzu Corporation, Prominence
  Column: Polymer Laboratories, PLgel MIXED-B
  Column temperature: 40° C.
  Flow rate: 1.0 milliliter per minute (mL/min)
  Injection amount of sample solution: 20 microliters (µL) (concentration: about 0.05 wt %)
  Eluent: tetrahydrofuran (THF)
  Detector (UV-VIS detector): Shimadzu Corporation, SPD-10AV
  Standard sample: polystyrene.

The terminal end of the main chain of the copolymer is not particularly limited and is appropriately defined depending on the type of raw material used, but is usually a hydrogen atom.

The copolymer may be synthesized by using a known organic synthesis method. The specific synthesis method of the copolymer may be readily understood by a person of an ordinary skill in the art and by further referring to the examples described herein. For example, when the copolymer contains the structural unit of Chemical Formula 1, the copolymer may be prepared by polymerization of one or more monomers (A-1) represented by Chemical Formula A-1, or may be prepared by a copolymerization reaction of at least one monomer (A-1) represented by Chemical Formula A-1 and another monomer corresponding to the aforementioned other structural units.

Chemical Formula A-1

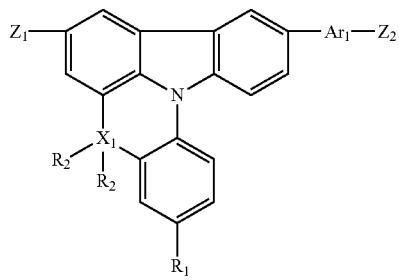

(A-1)

Alternatively, the copolymer may be prepared by a copolymerization reaction of one or more monomers (A-2) represented by Chemical Formula A-2 and one or more monomers (A-3) represented by Chemical Formula A-3, or the copolymer may be prepared by a copolymerization reaction of one or more monomers (A-2) represented by Chemical Formula A-2, one or more monomers (A-3) represented by Chemical Formula A-3, and other monomers corresponding to the aforementioned other structural units.

Chemical Formula A-2

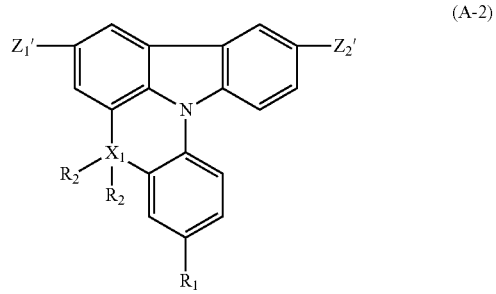

(A-2)

Chemical Formula A-3

(A-3)

For example, when the copolymer contains the structural unit of Chemical Formula 2, the copolymer may be prepared by a polymerization reaction of one or more monomers (B-1) represented by Chemical Formula B-1, or the copolymer may be prepared by a copolymerization reaction of one or more monomers (B-1) represented by Chemical Formula B-1 and another monomer corresponding to the aforementioned other structural units.

Chemical Formula B-1

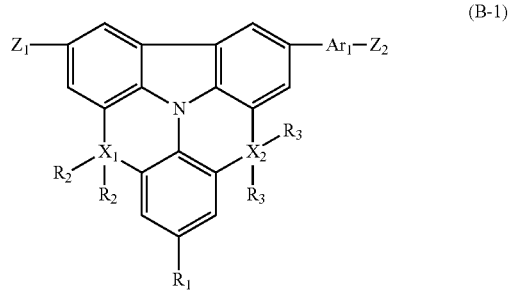

(B-1)

Alternatively, the copolymer may be prepared by a copolymerization reaction of one or more monomers (B-2) represented by Chemical Formula B-2 and one or more monomers (B-3) represented by Chemical Formula B-3, or the copolymer may be prepared by a copolymerization reaction of one or more monomers (B-2) represented by Chemical Formula B-2, one or more monomers (B-3) represented by Chemical Formula B-3, and other monomers corresponding to the aforementioned other structural units.

[Chemical Formula B-2]

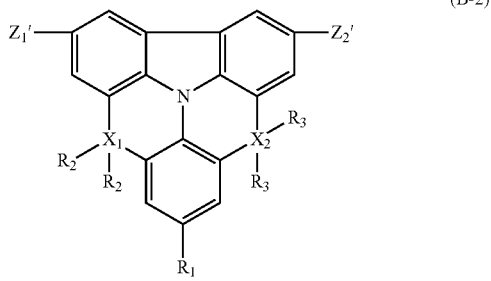

(B-2)

The monomers used for the polymerization of the copolymer may be synthesized by appropriately combining a known synthesis reaction, and their structures may be confirmed by known methods (for example, nuclear magnetic resonance (NMR) spectroscopy, liquid chromatography-mass spectrometry (LC-MS), and the like).

In Chemical Formulas A-1 to A-3, $R_1$, $R_2$, $X_1$, and $Ar_1$ are as defined in Chemical Formula 1. In Chemical Formulas B-1 to B-3, $R_1$, $R_2$, $R_3$, $X_1$, $X_2$, and $Ar_1$ are as defined in Chemical Formula 2.

$Z_1$, $Z_1'$, $Z_1''$, $Z_2$, $Z_2'$, and $Z_2''$ may each independently be a halogen atom (a fluorine atom, a chlorine atom, a bromine atom, an iodine atom, particularly a bromine atom) or a functional group represented by Chemical Formula D. On the other hand, in Chemical Formula D, $R_A$ to $R_D$ may each independently be an alkyl group having 1 to 3 carbon atoms. In an embodiment, $R_A$ to $R_D$ may be a methyl group.

Chemical Formula D

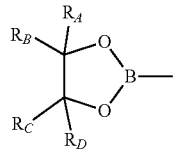

Meanwhile, $Z_1$ and $Z_2$, $Z_1'$ and $Z_2'$, or $Z_1''$ and $Z_2''$ of Chemical Formulas A-1 to A-3 and Chemical Formulas B-1 to B-3 may be the same or different from each other. In one or more embodiments, in Chemical Formula A-1 or Chemical Formula B-1, $Z_1$ and $Z_2$ may be different from each other. In one or more embodiments, in Chemical Formula A-2 or Chemical Formula B-2, $Z_1'$ and $Z_2'$ may be the same. In Chemical Formula A-3 or Chemical Formula B-3, $Z_1''$ and $Z_2''$ may be the same and may be different from $Z_1'$ and $Z_2'$.

The copolymer having Structural Unit (1) or Structural Unit (2) (desirably Structural Unit (1)) has a high C—N bond dissociation energy (excellent exciton resistance and electron resistance) and a narrow C—N bond axis dihedral angle (high hole mobility). Therefore, when the copolymer according to the present embodiment is used as a hole injection material or a hole transport material (particularly, a hole transport material), high luminous efficiency and excellent durability (luminescence life-span) may be well balanced.

In addition, the copolymer according to the present embodiment has a high triplet energy level and simultaneously, a low driving voltage. Accordingly, when the copolymer according to the present embodiment is used as a hole injection material or a hole transport material (particularly, a hole transport material), high hole mobility may be achieved even at a low driving voltage. Accordingly, an electroluminescence device (particularly, QLED) manufactured by using the copolymer may exhibit excellent luminous efficiency and durability (luminescence life-span).

Electroluminescence Device Material

The copolymer may be used as an electroluminescence device material. Accordingly, an electroluminescence device material having excellent luminous efficiency and durability (luminescence life-span) is provided. Due to the copolymer, an electroluminescence device material having a high triplet energy level (current efficiency) and a low driving voltage is also provided.

In addition, the copolymer exhibits high solubility in a solvent and high heat resistance. Therefore, the copolymer may be readily made into a film (thin film) by the wet (coating) method. Accordingly, in another embodiment, an electroluminescence device material including the aforementioned copolymer is provided.

In addition, the use of the copolymer as electroluminescence device material is provided.

Electroluminescence Device

As described above, the copolymer may be used for an electroluminescence device. In other words, an electroluminescence device includes a pair of electrodes and at least one organic layer (e.g., one or more organic layers) disposed between the electrodes and including the copolymer or the electroluminescence device material of the present embodiment. Such an electroluminescent device may achieve a good balance between high luminous efficiency (especially excellent luminous efficiency at a low driving voltage) and excellent durability (luminescence life-span).

Accordingly, according to one or more embodiments, an electroluminescence device includes a first electrode and a second electrode, and at least one organic layer disposed between the first electrode and the second electrode, wherein the at least one layer of the organic layer includes the aforementioned copolymer. The purpose (or effect) of the present disclosure may also be achieved by the electroluminescence device. In one or more embodiments, the electroluminescence device further includes a light emitting layer between the electrodes and including a light emitting material capable of emitting light from triplet excitons.

In addition, a method is provided of manufacturing an electroluminescence device that includes a pair of electrodes and at least one organic layer disposed between the electrodes and including the copolymer. At least one layer of the organic layer is formed by a coating method. In addition, by this method, an electroluminescence device is provided in which at least one layer of the organic layer is formed by a coating method.

The aforementioned copolymer, and electroluminescence device material (EL device material) (hereinafter collectively, also referred to as "copolymer/EL device material") have improved solubility in an organic solvent. For this reason, the copolymer/EL device material may be used for manufacturing devices (especially thin films) by a coating method (wet process). The copolymer may be provided as a liquid composition including the copolymer and a solvent or a dispersion medium. Such a liquid composition is an example of the liquid composition according to the present disclosure.

In addition, as described above, the electroluminescence device material may be used for the manufacture of devices (particularly thin films) by a coating method (wet process). In view of the above, a thin film is provided including the aforementioned copolymer.

Further, the EL device material has improved hole injection properties and hole mobility. For this reason, it may be also desirably used in formation of any one organic layer of a hole injection material, a hole transport material, or a light emitting material (host). Among them, from the viewpoint of hole transportability, it may be used as a hole injection material or a hole transport material, and particularly a hole transport material.

In other words, provided is a composition including the copolymer and at least one material that is a hole transport material, an electron transport material, and a light emitting material. Herein, the light emitting material included in the composition is not particularly limited, and may include an organometallic complex (luminescent organometallic complex compound) or semiconductor nanoparticles (semiconductor inorganic nanoparticles).

Hereinafter, referring to FIG. 1, an electroluminescence device according to one or more embodiments is described in further detail. FIG. 1 is a schematic view showing an electroluminescence device according to the present embodiment. In addition, in this specification, an "electroluminescence device" may be abbreviated as "EL device."

As shown in FIG. 1, the EL device 100 includes a substrate 110, a first electrode 120 on the substrate 110, a hole injection layer 130 on the first electrode 120, a hole transport layer 140 on the hole injection layer 130, a light emitting layer 150 on hole transport layer 140, an electron transport layer 160 on the light emitting layer 150, an electron injection layer 170 on the electron transport layer 160, and a second electrode 180 on the electron injection layer 170.

Herein, the copolymer/EL device material may be included in, for example, any one organic layer (organic film) disposed between the first electrode 120 and the second electrode 180. Specifically, the copolymer/EL device material may be included in the hole injection layer 130 as a hole injection material, in the hole transport layer 140 as a hole transport material, or in the light emitting layer 150 as a light emitting material (host). The copolymer/EL device material may be included in the hole injection layer 130 as a hole injection material or in the hole transport layer 140 as a hole transport material. The copolymer/EL device material may be included in the hole transport layer 140 as a hole transport material. That is, in one or more embodiments, the organic layer including the copolymer/EL device material may be a hole transport layer, a hole injection layer, or a light emitting layer. In one or more embodiments, the organic layer including the copolymer/EL device material may be a hole transport layer or a hole injection layer. In one or more embodiments, the organic layer including the copolymer/EL device material may be a hole transport layer.

In addition, the organic layer including the copolymer may be formed by a coating method (solution coating method). Specifically, the organic layer may be formed by a solution coating method such as a spin coating method, a casting method, a micro gravure coating method, a gravure coating method, a bar coating method, a roll coating method, a wire bar coating method, a dip coating method, a spray coating method, a screen-printing method, a flexographic printing method, an offset printing method, an inkjet printing method, and the like.

As the solvent used in the solution coating method, any solvent may be used as long as it is capable of dissolving the copolymer, and the solvent may be appropriately selected according to types of the copolymer. For example, the solvent may be toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, phenyl acetate, phenyl propionate, methyl benzoate, ethyl benzoate, cyclohexane, and the like. An amount of the solvent used is not particularly limited, but considering the ease of coating, a concentration of the copolymer may desirably be greater than or equal to about 0.1 wt % and less than or equal to about 10 wt %, or greater than or equal to about 0.5 wt % and less than or equal to about 5 wt % based on 100 wt % total.

In addition, the film-formation method of layers other than the organic layer including the copolymer/EL device material/is not specifically limited. The layers other than the organic layer including the copolymer/EL device material according to the present embodiment may be formed by, for example, a vacuum deposition method or may be formed by a solution coating method.

The substrate 110 may be a substrate used in a general EL device. For example, the substrate 110 may be a semiconductor substrate such as a glass substrate, a silicon substrate, and the like, or a transparent plastic substrate.

On the substrate 110, the first electrode 120 is formed. The first electrode 120 is specifically an anode, and is formed by a material having a large work function among a metal, an alloy, or a conductive compound. For example, the first electrode 120 may be formed as a transmissive electrode by indium tin oxide ($In_2O_3$—$SnO_2$: ITO), indium zinc oxide ($In_2O_3$—ZnO), tin oxide ($SnO_2$), zinc oxide (ZnO) or the like due to improved transparency and conductivity. The first electrode 120 may be formed as a reflective electrode by laminating magnesium (Mg), aluminum (Al), silver (Ag), or the like on the transparent conductive layer. After forming the first electrode 120 on the substrate 110, washing and UV-ozone treatment may be performed as needed.

On the first electrode 120, the hole injection layer 130 is formed. The hole injection layer 130 is a layer that facilitates injection of holes from the first electrode 120, and may be formed to have a thickness (dry film thickness; the same below) of specifically greater than or equal to about 10 nanometers (nm) and less than or equal to about 1000 nm, or greater than or equal to about 20 nm and less than or equal to about 50 nm.

The hole injection layer 130 may be formed of a known hole injection material. The known hole injection material of the hole injection layer 130 may include, for example, triphenylamine-containing poly(ether ketone) (TPAPEK), 4-isopropyl-4'-methyldiphenyl iodonium tetrakis(pentafluorophenyl)borate (PPBI), N,N'-diphenyl-N,N'-bis-[4-(phenyl-m-tolyl-amino)-phenyl]biphenyl-4,4'-diamine (DNTPD), copper phthalocyanine, 4,4',4"-tris(3-methylphenylphenylamino)triphenylamine (m-MTDATA), N,N'-di(1-naphthyl)-N,N'-diphenylbenzidine (NPB), 4,4',4"-tris(diphenylamino)triphenylamine (TDATA), 4,4',4"-tris(N,N-2-naphthylphenylamino)triphenylamine (2-TNATA), polyaniline/dodecylbenzenesulphonic acid, poly(3,4-ethylenedioxythiophene)/poly(4-styrenesulfonate) (PEDOT/PSS), polyaniline/10-camphorsulfonic acid, a combination thereof, and the like.

On the hole injection layer 130, the hole transport layer 140 is formed. The hole transport layer 140 is a layer having a function of transporting holes, and may be formed with a thickness of, for example, greater than or equal to about 10 nm and less than or equal to about 150 nm, and more specifically greater than or equal to about 20 nm and less than or equal to about 50 nm. The hole transport layer 140 may be formed by a solution coating method using the copolymer according to the present embodiment. According to this method, the durability (luminescence life-span) of EL device 100 may be extended. In addition, the performance (luminous efficiency) of the EL device 100 may be improved. In addition, since the hole transport layer may be formed by the solution coating method, a large area may be formed efficiently. However, when one organic layer of the EL device 100 includes the copolymer according to the present embodiment, the hole transport layer 140 may be formed of a known hole transport material. The known hole transport material may include, for example, one or more of 1,1-bis[(di-4-tolylamino) phenyl] cyclohexane (TAPC), a carbazole derivative such as N-phenylcarbazole, polyvinylcarbazole, and the like, N,N'-bis(3-methylphenyl)-N,N'-diphenyl-[1,1-biphenyl]-4,4'-diamine (TPD), 4,4',4"-tris(N-carbazolyl) triphenylamine (TCTA), and N,N'-di(1-naphthyl)-N,N'-diphenylbenzidine (NPB).

On the hole transport layer 140, the light emitting layer 150 is formed. The light emitting layer 150 is a layer that emits light by fluorescence, phosphorescence, and the like, and is formed using a vacuum deposition method, a spin coating method, an inkjet printing method, or the like. The light emitting layer 150 may be formed with a thickness of, for example, about 10 nm to about 60 nm, and more specifically about 20 nm to about 50 nm. As the light emitting material of the light emitting layer 150 may include a known light emitting material. However, the light emitting material included in the light emitting layer 150 is desirably a light emitting material capable of emitting light (i.e., phosphorescence emission) from triplet excitons. In such a case, the driving life-span of the EL device 100 may be further improved.

The light emitting layer 150 is not particularly limited and may have a known configuration. In one or more embodiments, the light emitting layer may include a semiconductor nanoparticle or an organometallic complex. That is, in one or more embodiments of the present disclosure, the organic layer may include a light emitting layer including semiconductor nanoparticles or organometallic complexes. When the light emitting layer includes semiconductor nanoparticles, the EL device may be a quantum dot electroluminescence device (QLED) or a quantum dot light emitting diode. In addition, when the light emitting layer includes an organometallic complex, the EL device is an organic electroluminescence device (OLED).

In the form in which the light emitting layer includes semiconductor nanoparticles (QLED), the light emitting layer may include a plurality of semiconductor nanoparticles (quantum dots) arranged in a single layer or a plurality of layers. Herein, the semiconductor nanoparticles (quantum dots) may be particles of predetermined sizes that have a quantum confinement effect. The diameter of the semiconductor nanoparticles (quantum dots) is not particularly limited but is greater than or equal to about 1 nm and less than or equal to about 10 nm.

The semiconductor nanoparticles (quantum dots) arranged in the light emitting layer may be synthesized by a wet chemical process, an organometal chemical deposition process, a molecular beam epitaxy process, or another similar process. Among them, the wet chemical process is a method of growing a particle by putting a precursor material in an organic solvent.

In the wet chemistry process, when crystals grow, the organic solvent naturally coordinates to the surface of the quantum dot crystals and acts as a dispersing agent, thereby controlling the growth of the crystals. For this reason, in the wet chemical process, compared with gas phase deposition methods, such as metal organic chemical vapor deposition (MOCVD) and molecular beam epitaxy (MBE), growth of semiconductor nanoparticles may be easily controlled at a low cost.

The semiconductor nanoparticles (quantum dots) may adjust energy bandgaps by adjusting their sizes, so that light of various wavelengths may be obtained from the light emitting layer (quantum dot light emitting layer). Thus, a plurality of differently sized quantum dots may embody a display that discharges (or emits) light of multiple wavelengths. The sizes of the quantum dots may be selected to emit red, green, and blue light to form a color display. In addition, the sizes of the quantum dots may be combined so that various color lights emit white light.

The semiconductor nanoparticles (quantum dots) may be semiconductor material that is a Group II-VI semiconductor compound; a Group III-V semiconductor compound; a Group IV-VI semiconductor compound; a Group IV element or compound; or a combination thereof.

The Group II-VI semiconductor compound is not particularly limited, but includes, for example, a binary compound that is CdSe, CdTe, ZnS, ZnSe, ZnTe, ZnO, HgS, HgSe, HgTe, or a mixture thereof; a ternary compound that is CdSeS, CdSeTe, CdSTe, ZnSeS, ZnTeSe, ZnSTe, HgSeS, HgSeTe, HgSTe, CdZnS, CdZnSe, CdZnTe, CdHgS, CdHgSe, CdHgTe, HgZnS, HgZnSe, HgZnTe, or a quaternary compound that is CdZnSeS, CdZnSeTe, CdZnSTe, CdHgSeS, CdHgSeTe, CdHgSTe, HgZnSeS, HgZnSeTe, HgZnSTe, or a mixture thereof.

The Group III-V semiconductor compound is not particularly limited, but includes, for example, a binary compound that is GaN, GaP, GaAs, GaSb, AlN, AlP, AlAs, AlSb, InN, InP, InAs, InSb, or a mixture thereof; a ternary compound that is GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a mixture thereof; or a quaternary compound that is GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof.

The Group IV-VI semiconductor compound is not particularly limited, but includes, for example, a binary compound that is SnS, SnSe, SnTe, PbS, PbSe, PbTe, or a mixture thereof; a ternary compound that is SnSeS, SnSeTe, SnSTe, PbSeS, PbSeTe, PbSTe, SnPbS, SnPbSe, SnPbTe, or a mixture thereof; or a quaternary compound that is SnPbSSe, SnPbSeTe, SnPbSTe, or a mixture thereof.

The Group IV element or compound is not particularly limited, but includes, for example, a single element compound that is Si, Ge, or a mixture thereof; or a binary compound that is SiC, SiGe, or a mixture thereof.

The semiconductor nanoparticles (quantum dots) may have a homogeneous single structure or a double structure of a core-shell. The core-shell may include different materials. The material constituting each core and shell may be made of different semiconductor compounds. However, an energy bandgap of the shell material is larger than an energy bandgap of the core material. Specifically, structures such as ZnTeSe/ZnSe/ZnS, CdSe/ZnS, InP/ZnS, and the like are desirable.

For example, a process of producing a quantum dot having a core (CdSe)•shell (ZnS) structure is described.

First, crystals are formed by injecting core (CdSe) precursor materials of $(CH_3)_2Cd$ (dimethyl cadmium), TOPSe (trioctylphosphine selenide) and the like into an organic solvent using TOPO (trioctylphosphine oxide) as a surfactant. At this time, after maintaining a certain time at high temperature so that the crystals grow to a certain size, the precursor materials of the shell (ZnS) are injected, to form a shell on the surface of the core already generated. As a result, a quantum dot of CdSe/ZnS capped with TOPO may be produced.

In addition, in the OLED in which the light emitting layer includes an organometallic complex, the light emitting layer 150 may include, for example 6,9-diphenyl-9'-(5'-phenyl-[1,1':3',1"-terphenyl]-3-yl)3,3'-bi[9H-carbazole], 3,9-diphenyl-5-(3-(4-phenyl-6-(5'-phenyl-[1,1':3',1"-terphenyl]-3-yl)-1,3,5,-triazin-2-yl)phenyl)-9H-carbazole, 9,9'-diphenyl-3,3'-bi[9H-carbazole], tris(8-quinolinato)aluminum ($Alq_3$), 4,4'-bis(carbazol-9-yl)biphenyl (CBP), poly(n-vinyl carbazole (PVK), 9,10-di(naphthalene)anthracene (ADN), 4,4',4"-tris (N-carbazolyl)triphenylamine (TCTA), 1,3,5-tris(N-phenyl-benzimidazol-2-yl)benzene (TPBI), 3-tert-butyl-9,10-di (naphth-2-yl)anthracene (TBADN), distyrylarylene (DSA), 4,4'-bis(9-carbazole)-2,2'-dimethyl-bipheny (dmCBP), and the like, as a host material.

In addition, the light emitting layer 150 may include, for example, perylene and a derivative thereof, rubrene and a derivative thereof, coumarin and a derivative thereof, 4-dicyanomethylene-2-(dimethylaminostyryl)-6-methyl-4H-pyran (DCM) and a derivative thereof, an iridium (Ir) complex such as bis[2-(4,6-difluorophenyl)pyridinate]picolinate iridium (III) (Flrpic)), bis(1-phenylisoquinoline) (acetylacetonate)iridium (III) ($Ir(piq)_2(acac)$), tris(2-phenylpyridine)iridium (III) ($Ir(ppy)_3$), tris(2-(3-p-xylyl)phenyl)pyridine iridium (III), an osmium (Os) complex, a platinum complex, and the like, as a dopant material. Among these, it is desirable that the light emitting material is a light emitting organometallic complex compound.

A method for forming the light emitting layer is not particularly limited. It may be formed by coating (solution coating method) coating composition including a semiconductor nanoparticle or an organometallic complex. At this time, it is desirable to select a solvent which does not dissolve the materials (hole transport material, particularly the copolymer or polymeric composition) in the hole transport layer as the solvent constituting the coating composition.

On the light emitting layer 150, the electron transport layer 160 may be formed. The electron transport layer 160 is a layer having a function of transporting electrons, and is formed using a vacuum deposition method, a spin coating method, an inkjet method, or the like. For example, the electron transport layer 160 may be formed to have a thickness of greater than or equal to about 15 nm and less than or equal to about 50 nm.

The electron transport layer 160 may be formed of a known electron transport material. The known electron transport material may include, for example, (8-quinolinato) lithium (lithium quinolate, Liq), tris(8-quinolinato) aluminum (Alq3), or a compound having a nitrogen-containing aromatic ring. Examples of the compound having the nitrogen-containing aromatic ring may include, for example, a compound including a pyridine ring such as 1,3,5-tri[(3-pyridyl)-phen-3-yl]benzene), a compound including a triazine ring such as 2,4,6-tris(3'-(pyridin-3-yl)biphenyl-3-yl)-1,3,5-triazine), a compound including an imidazole ring such as 2-(4-(N-phenylbenzoimidazolyl-1-yl-phenyl)-9,10-dinaphthylanthracene or 1,3,5-tris(N-phenyl-benzimidazol-2-yl)benzene (TPBI). The electron transport material may be used alone or as a mixture of two or more thereof.

On the electron transport layer 160, the electron injection layer 170 may be formed. The electron injection layer 170 is a layer having a function of facilitating injection of electrons from the second electrode 180. The electron injection layer 170 is formed using a vacuum deposition method or the like. The electron injection layer 170 may be formed to have a thickness of greater than or equal to about 0.1 nm and less than or equal to about 5 nm, and more specifically, greater than or equal to about 0.3 nm and less than or equal to about 2 nm. As a material for forming the electron injection layer 170, any known material may be used. For example, the electron injection layer 170 may be formed of a lithium compound such as (8-quinolinato) lithium (lithium quinolate, Liq) and lithium fluoride (LiF), sodium chloride (NaCl), cesium fluoride (CsF), lithium oxide ($Li_2O$), or barium oxide (BaO).

On the electron injection layer 170, the second electrode 180 is formed. The second electrode 180 is formed using a vacuum deposition method or the like. Specifically, the second electrode 180 is a cathode, and is formed by a material having a small work function such as metals, alloys, or conductive compounds. For example, the second electrode 180 is may be formed as a reflective electrode with a metal such as lithium (Li), magnesium (Mg), aluminum (Al), silver (Ag), calcium (Ca), aluminum-lithium (Al—Li), magnesium-indium (Mg—In), magnesium-silver (Mg—Ag), or the like. The second electrode 180 may be formed to have a thickness of greater than or equal to about 10 nm and less than or equal to about 200 nm, and more and specifically, greater than or equal to about 50 nm and less than or equal to about 150 nm. Alternatively, the second electrode 180 may be formed as a transmissive electrode by a thin film of less than or equal to about 20 nm of a metal material or a transparent conductive layer such as indium tin oxide ($In_2O_3$—$SnO_2$), or indium zinc oxide ($In_2O_3$—$ZnO$).

The EL device 100 has been described above as an example of the electroluminescence device. The EL device 100 according to the present embodiment further improves durability (luminescence life-span) by including an organic layer (particularly a hole transport layer or a hole injection layer) including the copolymer. In addition, the luminous efficiency (current efficiency) may be further improved and the driving voltage may be reduced.

The stacked structure of the EL device 100 according to the present embodiment is not limited to the above embodiments. The EL device 100 according to the present embodiment may have another known stacked structure. For example, in the EL device 100, one or more layers of the hole injection layer 130, the hole transport layer 140, the electron transport layer 160 and the electron injection layer 170 may be omitted or another layer may be further included. In addition, each layer of the EL device 100 may be formed in a single layer or in a plurality of layers.

For example, the EL device 100 may further include a hole blocking layer disposed between the hole transport layer 140 and the light emitting layer 150 to prevent excitons or holes from diffusing into the electron transport layer 160. The hole blocking layer may be formed by, for example, an oxadiazole derivative, a triazole derivative, or a phenanthroline derivative.

In addition, the copolymer may be applied to electroluminescence devices other than the QLED or OLED. Other electroluminescence devices including the copolymer may include, but are not particularly limited to, for example, organic inorganic perovskite light emitting devices.

EXAMPLES

The one or more exemplary embodiments are described in further detail using the following examples and comparative examples. However, the technical range of the present disclosure is not limited to the following examples. In the following examples, unless specifically described, each operation was performed at room temperature (25° C.). In addition, unless specifically stated, "%" and "a part" mean "wt %" and "a part by weight", respectively.

Synthesis Example 1

Synthesis of Compound 1

Compound 1 was synthesized according to Reaction Scheme 1.

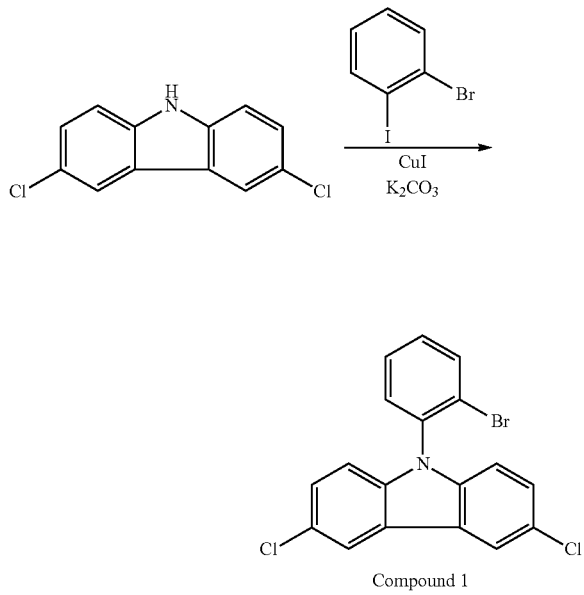

Compound 1

In a 3-neck flask substituted with argon, 3,6-dichlorocarbazole (35.00 grams (g)), 1-bromo-2-iodobenzene (210.00 g), copper iodide (30 g), and potassium carbonate (38.00 g) were combined to form a reaction solution, and then the reaction solutions was stirred while heating at 180° C. for 3 days. Subsequently, toluene was added to the reaction solution and the contents were allowed to cool to 25° C., and subsequently the insoluble matter therein was removed by filtration. An eluate therefrom was distilled from the resulting liquid under a reduced pressure, and the collected residue was recrystallized with toluene and ethanol, obtaining Compound 1 (40.52 g).

Synthesis Example 2

Synthesis of Compound 2

Compound 2 was synthesized according to Reaction Scheme 2.

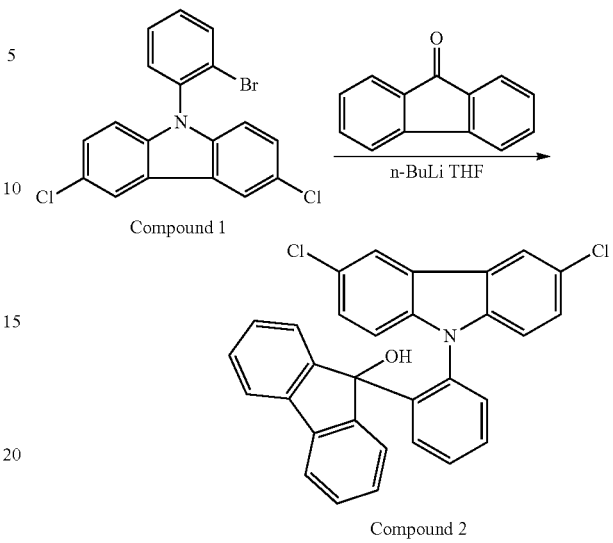

In a 3-neck flask substituted with argon, Compound 1 (20.00 g) of Synthesis Example 1 and 200 milliliters (mL) of anhydrous tetrahydrofuran (THF) were combined and then, stirred at −48° C. for 10 minutes.

Subsequently, 20 mL of a 2.8 molar (M) solution of n-butyl lithium (n-BuLi) in hexanes was added thereto and the resulting mixture was stirred at −48° C. for 30 minutes, and then a fluorenone solution containing fluorenone (20.00 g) dissolved in 20 mL of anhydrous THF was added dropwise thereto, and then stirring was continued at room temperature for 1 hour. Then, water was added to the reaction solution and then extracted with ethyl acetate, and the resulting organic layer therefrom was dried with magnesium sulfate.

The solvent therein was removed under a reduced pressure, and the residue was purified through a column charged with silica gel, obtaining Compound 2 (20.54 g).

Synthesis Example 3

Synthesis of Compound 3

Compound 3 was synthesized according to Reaction Scheme 3.

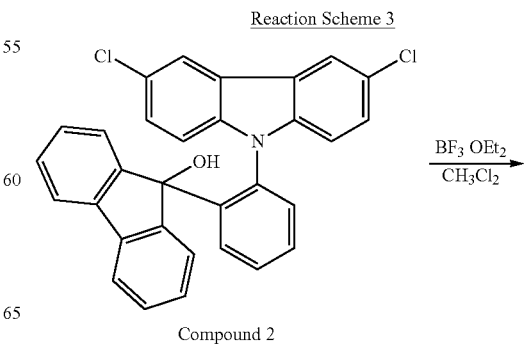

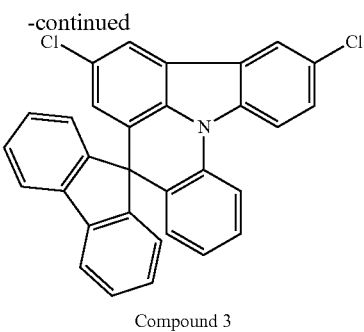

Compound 3

In a 3-neck flask substituted with argon, Compound 2 (13.00 g) of Synthesis Example 2 and 70 mL of anhydrous dichloromethane were combined and then stirred at 0° C. for 10 minutes. Subsequently, a boron trifluoride diethyl ether complex (BF$_3$·OEt$_2$) (6.70 mL) was added dropwise thereto and then the reaction solution was stirred at room temperature for 2 hours.

Subsequently, water was added to the reaction solution and extracted with dichloromethane, and an organic layer obtained therefrom was dried with magnesium sulfate. The solvent therein was removed under a reduced pressure, and the residue was purified through a column charged with silica gel, obtaining Compound 3 (8.62 g).

Synthesis Example 4

Synthesis of Compound 4

Compound 4 was synthesized according to Reaction Scheme 4.

Reaction Scheme 4

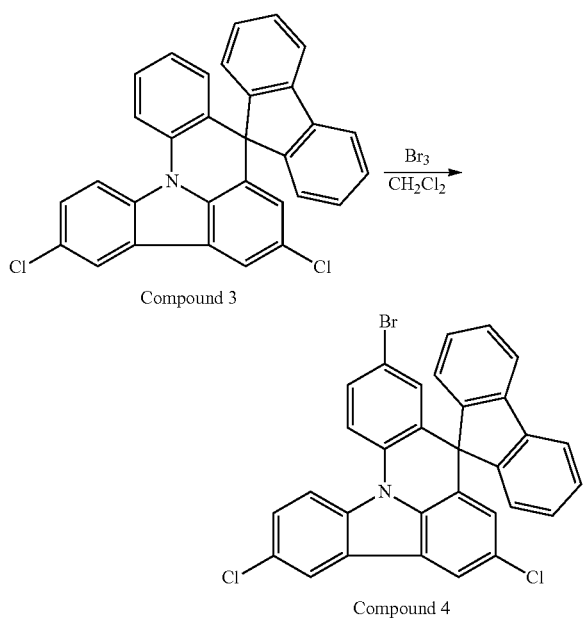

In a 3-neck flask substituted with argon, Compound 3 (21.25 g) of Synthesis Example 3 and 200 mL of anhydrous dichloromethane were combined and then stirred at 0° C. for 10 minutes. Subsequently, bromine (2.20 mL) was added dropwise thereto and the resulting reaction solution was stirred at room temperature for 8 hours.

Subsequently, a sodium bicarbonate aqueous solution was added to the reaction solution, and then washed with sodium thiosulfate. An organic layer was extracted therefrom with dichloromethane, which was then dried with magnesium sulfate.

A solvent therein was removed under a reduced pressure, and the residue was recrystallized with dichloromethane and methanol, obtaining Compound 4 (15.24 g).

Synthesis Example 5

Synthesis of Compound 5

Compound 5 was synthesized according to Reaction Scheme 5.

Reaction Scheme 5

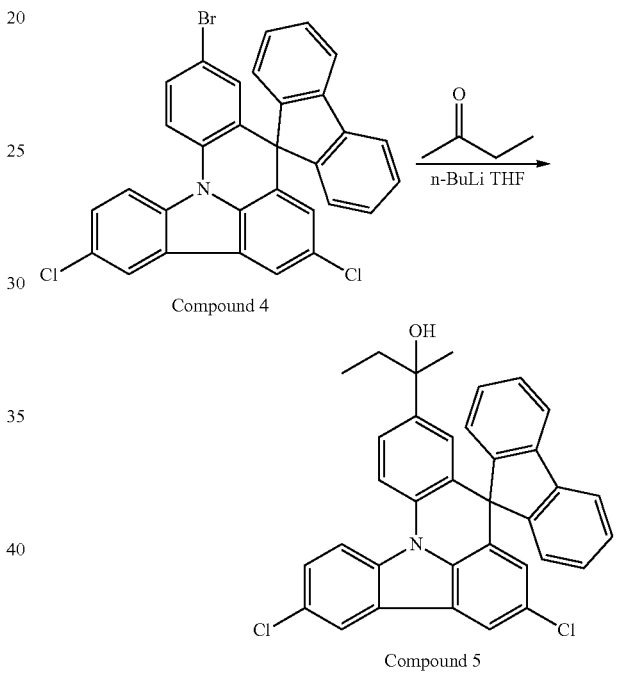

In a 3-neck flask substituted with argon, Compound 4 (10.00 g) of Synthesis Example 4 and 200 mL of anhydrous THF were combined and then the resulting solution was stirred at −48° C. for 10 minutes. Subsequently, 10 mL of a 2.8 M solution of n-BuLi in hexanes was added dropwise thereto and the reaction mixture was stirred at −48° C. for 30 minutes, and then 10 mL of methylethylketone (MEK) was added dropwise thereto and the resulting solution was stirred at room temperature for 1 hour.

Then, water was added to the reaction solution and then extracted with ethyl acetate, and an organic layer obtained therefrom was dried with magnesium sulfate. A solvent therein was removed under a reduced pressure, and the residue was purified through a column charged with silica gel, obtaining Compound 5 (7.67 g).

Synthesis Example 6

Synthesis of Compound 6

Compound 6 was synthesized according to Reaction Scheme 6.

Reaction Scheme 6]

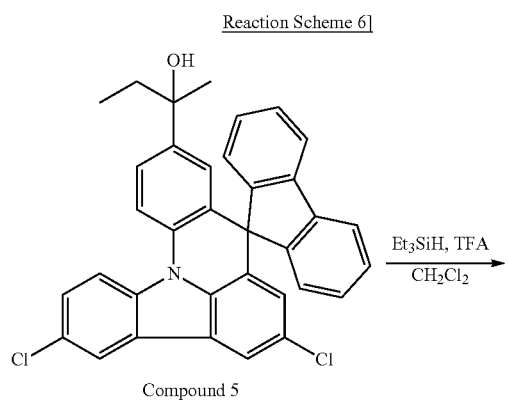

Compound 5

Et₃SiH, TFA
CH₂Cl₂
⟶

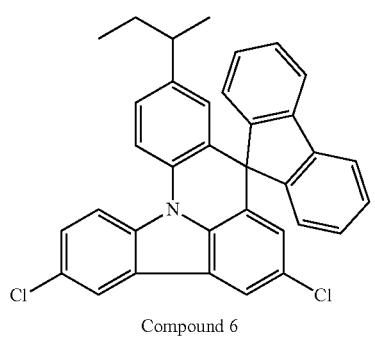

Compound 6

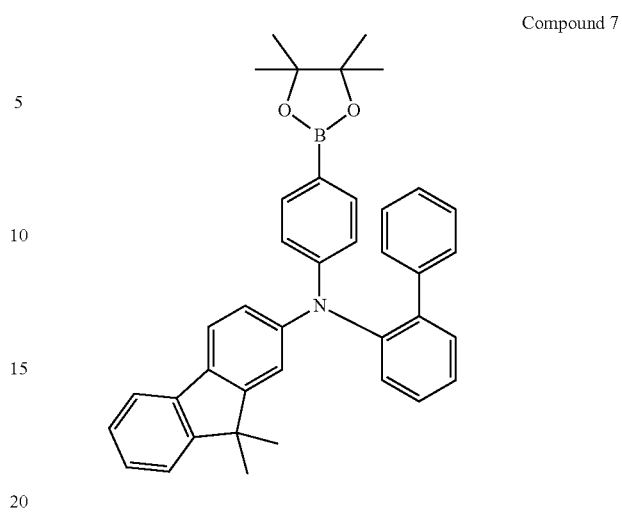

Compound 7

In a 3-neck flask substituted with argon, Compound 5 (10.00 g) of Synthesis Example 5 and 18 mL of anhydrous dichloromethane were combined and the solution was stirred at 0° C. for 10 minutes, and triethylsilane (Et₃SiH) (4.00 mL) was added dropwise thereto and then the resulting solution was stirred at 0° C. for 10 minutes. Subsequently, trifluoroacetic acid (TFA) (2.00 mL) was added dropwise thereto and then the reaction solution was stirred at room temperature for 2 hours.

Then, water was added to the reaction solution and then extracted with dichloromethane, and an organic layer obtained therefrom was dried with magnesium sulfate. A solvent therein was removed under a reduced pressure, and the residue was purified through a column charged with silica gel, obtaining Compound 6 (5.42 g).

Synthesis Example 7

Synthesis of Compound 7

Compound 7 having the following structure was synthesized according to a similar method as described in Japanese Patent Publication No. 2017-513815 (WO 2015/131976) of "Intermediate: biphenyl-4-yl(9,9-dimethyl-9H-fluoren-2-yl) [4-(4,4,5,5-tetramethyl-[1,3,2]dioxaborolane-2-yl)phenyl] amine."

Specifically, biphenyl-4-yl(9,9-dimethyl-9H-fluorene-2-yl) amine (40 g) and 4-chloroiodobenzene (26.4 g) were combined with toluene (700 mL) to form a solution. The solution was degassed and then saturated with $N_2$. Subsequently, 4.4 mL of a 1 M tri-tert-butyl phosphine solution and palladium (II) acetate (0.5 g) are added to the solution, and sodium tert-butoxide (15.9 g) was added thereto, preparing a reaction mixture. This reaction mixture was heated under an $N_2$ atmosphere for 5 hours, until reflux was achieved. Then, the mixture was combined with toluene and water, and an organic phase was obtained therefrom by fractional distillation. The organic layer was washed three times with water, dehydrated with sodium sulfate, and then concentrated through rotary evaporation, obtaining a crude product.

The crude product was filtered through silica gel with toluene, and the residue was recrystallized with heptane/toluene, obtaining biphenyl-4-yl(4-chlorophenyl) (9,9-dimethyl-9H-fluorene-2-yl) amine.

Subsequently, the obtained biphenyl-4-yl(4-chlorophenyl) (9,9-dimethyl-9H-fluorene-2-yl) amine (20 g), bis(pinacolato)diborane (12.5 g), and potassium acetate (12.5 g) were suspended in dioxane (400 mL).

Then, a 1,1-bis(diphenyl phosphino)ferrocene dichloropalladium (II) complex (1.04 g) with dichloromethane was added to this suspension, obtaining a reaction mixture. This reaction mixture was heated under reflux for 16 hours. After allowing the reaction mixture to cool to room temperature, the organic phase was removed therefrom, and the residue was washed three times with 200 mL of water, dried using sodium sulfate, and then concentrated on a rotary evaporator. The residue was recrystallized with toluene.

Synthesis Example 8

Synthesis of Compound 8

Compound 8 was synthesized according to Reaction Scheme 8.

Reaction Scheme 8

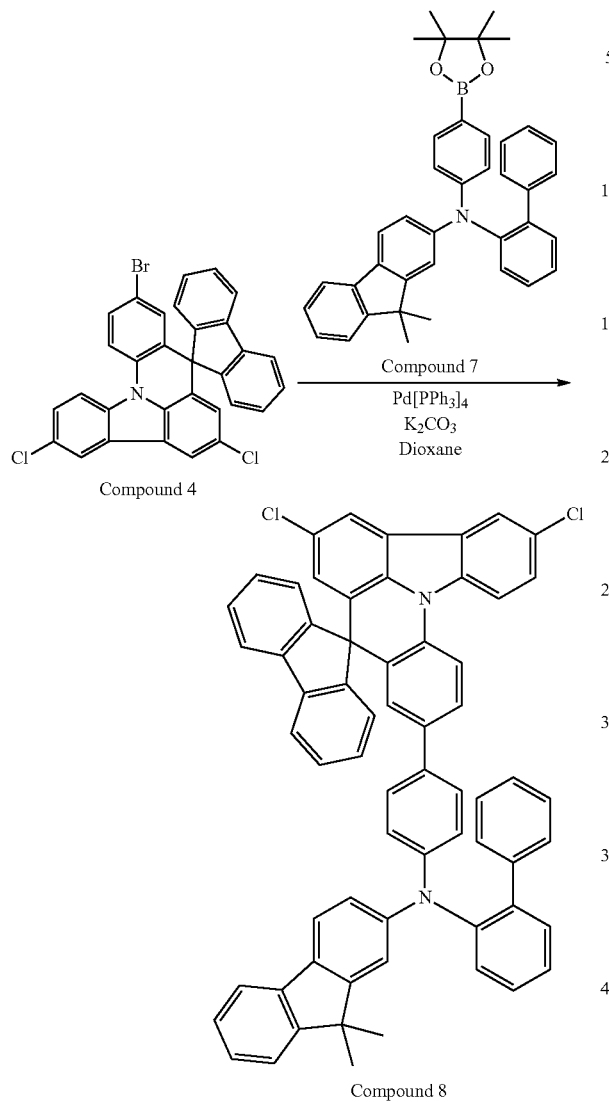

In a 3-neck flask substituted with argon, Compound 4 (3.00 g) of Synthesis Example 4, Compound 7 (3.20 g) of Synthesis Example 7, potassium carbonate (2.20 g), dioxane (50 mL), and water (25 mL) were combined and then stirred for 30 minutes. Subsequently, tetrakis(triphenylphosphine) palladium (0) (Pd[PPh$_3$]$_4$) (0.30 g) was added thereto and then, the reaction mixture was heated under reflux and stirred for 13 hours. When a reaction was completed, the resultant was allowed to cool to room temperature and then the product was extracted with toluene. An organic layer obtained therefrom was dried with magnesium sulfate, filtered and then concentrated. The residue was recrystallized with dichloromethane and ethanol, obtaining Compound 8 (4.82 g).

Synthesis Example 9

Synthesis of Compound 9

Compound 9 was synthesized according to Reaction Scheme 9 in a similar method as Synthesis Example 1 except that 1-bromo-4-iodo benzene was used instead of the 1-bromo-2-iodo benzene.

Reaction Scheme 9

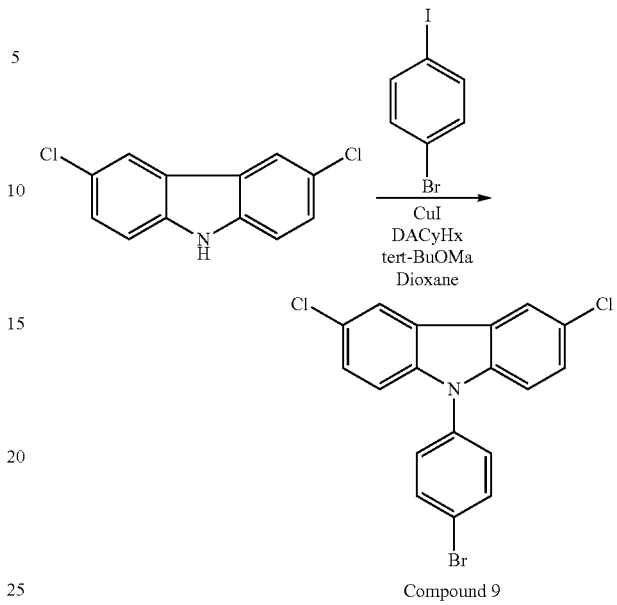

Synthesis Example 10

Synthesis of Compound 10

Compound 10 was synthesized according to Reaction Scheme 10 in a similar method as Synthesis Example 5 except that Compound 9 of Synthesis Example 9 was used instead of Compound 4 of Synthesis Example 5.

Reaction Scheme 10

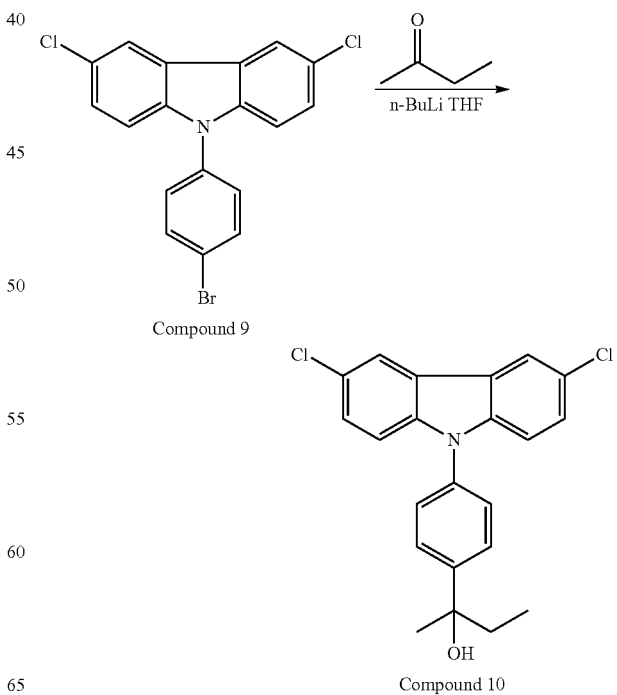

Synthesis Example 11

Synthesis of Compound 11

Compound 11 was synthesized according to the following scheme in a similar method as Synthesis Example 6 except that compound 10 of Synthesis Example 10 was used instead of Compound 5 of Synthesis Example 5.

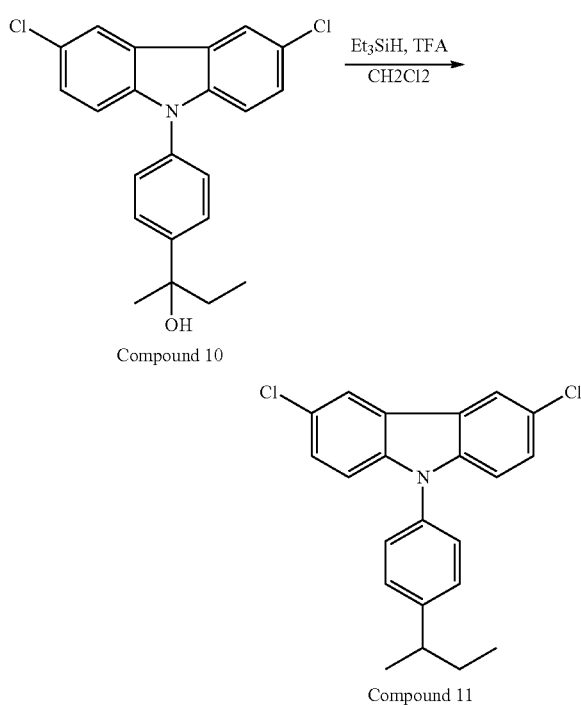

Synthesis Example M-1

Synthesis of Compound M-1

Compound M-1 is synthesized according to Reaction Scheme M-1.

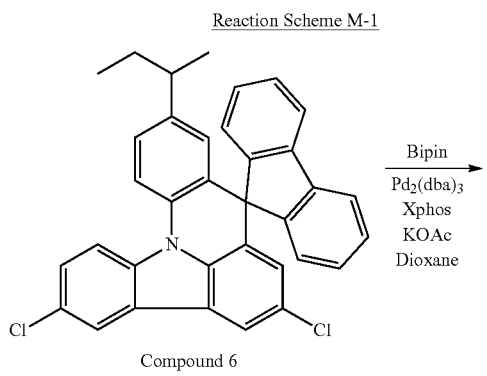

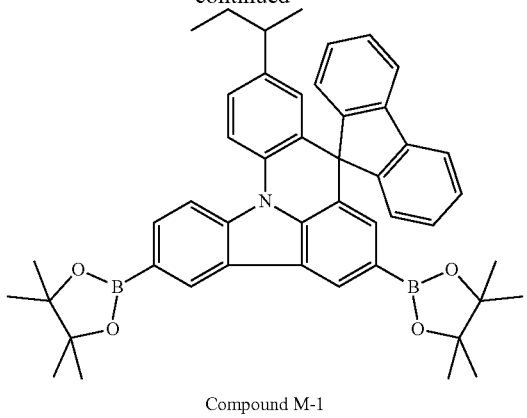

In a 3-neck flask substituted with argon, Compound 6 (5.50 g) of Synthesis Example 6, bis(pinacolato)diborane (Bipin) (10.10 g), potassium acetate (5.22 g), tris(dibenzylideneacetone)dipalladium (0) (Pd$_2$(dba)$_3$) (0.92 g), 2-dicyclohexylphosphino-2',4',6'-triisopropylbiphenyl (XPhos) (1.02 g), and 1,4-dioxane (200 mL) were combined and then heated at reflux under a nitrogen atmosphere for 8 hours. The reaction solution was allowed to cool to room temperature and then filtered with Celite® to obtain a solid.

A solvent therein was removed under a reduced pressure, and the residue was dissolved in toluene, activated carbon and zeolite were added thereto, and then the contents were stirred at 130° C. for 30 minutes.

A solid was filtered therefrom by using Celite®, and after removing a solvent under a reduced pressure, the residue was recrystallized with toluene and ethanol, obtaining Compound M-1 (5.02 g).

Synthesis Example M-2

Synthesis of Compound M-2

Compound M-2 is Synthesized According to Reaction Scheme M-2

Reaction Scheme M-2

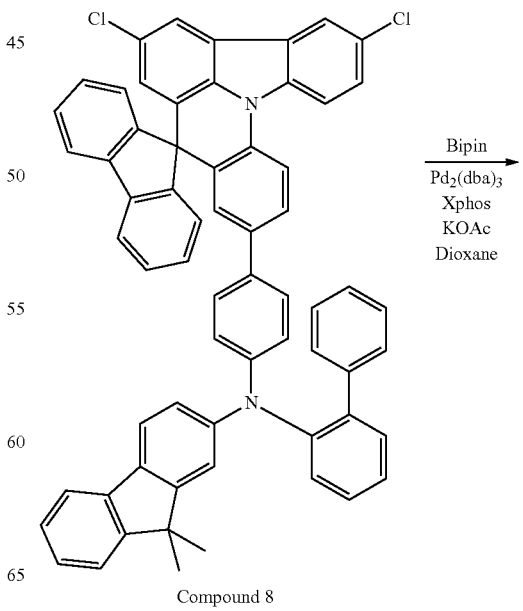

-continued

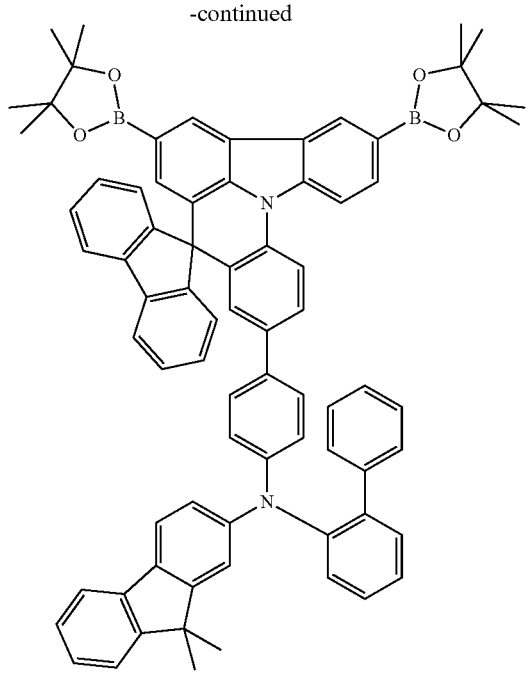

Compound M-2

In a 3-neck flask substituted with argon, Compound 8 (4.10 g) of Synthesis Example 8, bis(pinacolato)diborane (2.29 g), potassium acetate (1.10 g), Pd$_2$(dba)$_3$ (0.20 g), XPhos (0.2 g), and 1,4-dioxane (40 mL) were combined and then heated at reflux under a nitrogen atmosphere for 8 hours. The reaction solution was allowed to cool to room temperature and then filtered by using Celite® to obtain a solid.

A solvent therein was removed under a reduced pressure, and then, the residue was dissolved in toluene, activated carbon and zeolite were added thereto, and then the mixture was stirred at 130° C. for 30 minutes.

A solid was filtered therefrom by using Celite®, and after removing a solvent under a reduced pressure, the residue was recrystallized with toluene and ethanol, obtaining Compound M-2 (2.10 g).

Synthesis Example M-3

Synthesis of Compound M-3

Compound M-3 is synthesized according to Reaction Scheme M-3 in the same method as Synthesis Example M-1 except that Compound 11 of Synthesis Example 11 is used instead of Compound 6.

Reaction Scheme M-3

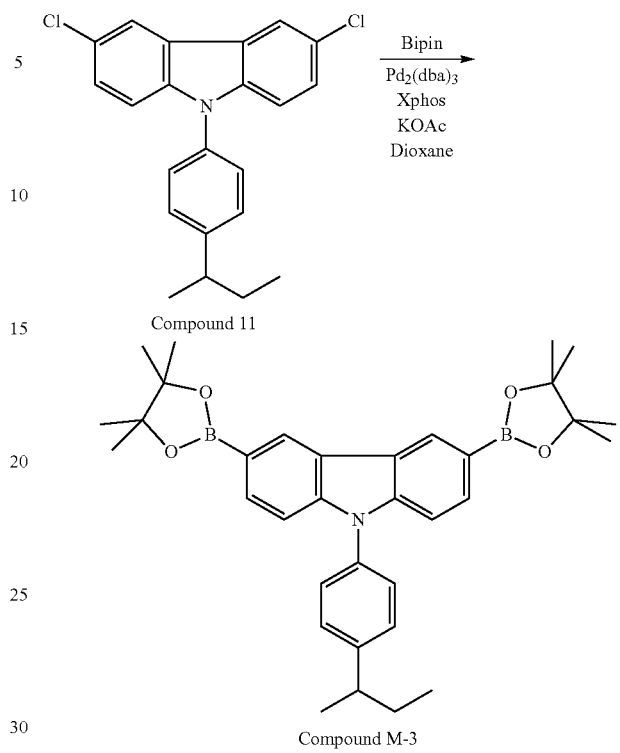

Compound 11

Compound M-3

Example 1

Synthesis of Copolymer P-1

Under an argon atmosphere, Compound M-1 (2.027 g) of Synthesis Example M-1, 2,7-dibromo-9,9-di-n-octyl fluorene (1.148 g), palladium (II) acetate (6.4 mg), tris(2-methoxy phenyl)phosphine (51.9 mg), toluene (64 mL), and a 20 wt % aqueous solution of tetraethylammonium hydroxide (7.3 g) were combined in a four-neck flask and stirred at 85° C. for 6 hours.

Subsequently, phenyl boronic acid (343 milligrams (mg)), bis(triphenylphosphine)palladium (II) dichloride (119 mg), and a 20 wt % aqueous solution of tetraethylammonium hydroxide (7.42 g) were added thereto and then the resulting was stirred for 6 hours.

Then, sodium N,N-diethyldithiocarbamate trihydrate (5.71 g) dissolved in deionized (DI) water (50 mL) was added thereto and then stirred at 85° C. for 2 hours.

After separating an organic layer from an aqueous layer, the organic layer was washed with water, a 3 wt % aqueous solution of acetic acid, and water.

The organic layer was passed through a column charged with silica gel and alumina, and a solvent therein was removed under a reduced pressure.

The obtained liquid was added dropwise to methanol to precipitate a solid, and the solid was dissolved in toluene, filtered, and then dried, obtaining Copolymer P-1 (0.83 g).

Copolymer P-1 was measured with respect to a weight average molecular weight (Mw) and polydispersity (Mw/Mn) by using size exclusion chromatography (SEC). As a result, the Mw and the polydispersity of Copolymer P-1 are respectively 5,200 grams per mole (g/mol) and 1.57.

Copolymer P-1 has the following structural until from an input ratio of the monomers.

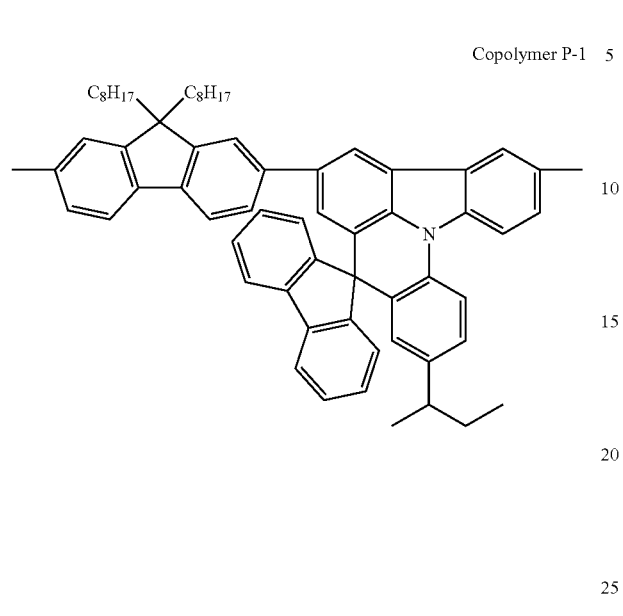

Copolymer P-1

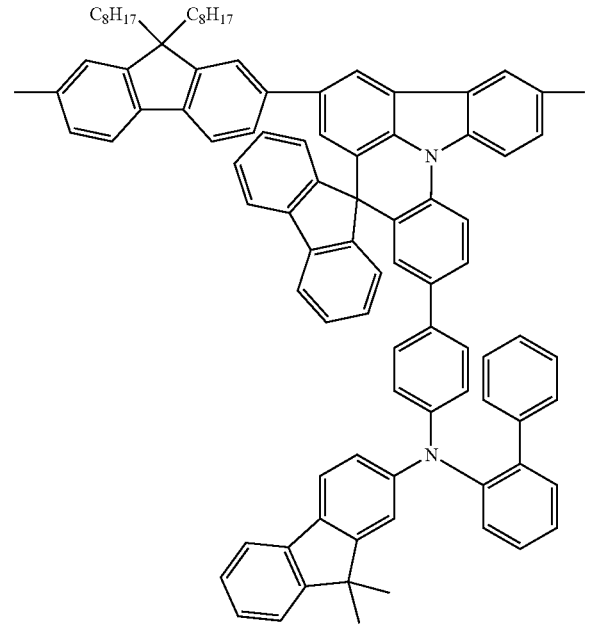

Copolymer P-2

Example 2

Synthesis of Copolymer P-2

Under an argon atmosphere, Compound M-2 (1.157 g) of Synthesis Example M-2, 2,7-dibromo-9,9-di-n-octylfluorene (0.581 g), palladium (II) acetate (2.4 mg), tris(2-methoxyphenyl)phosphine (19.4 mg), toluene (35 mL), and a 20 wt % aqueous solution of tetraethylammonium hydroxide (5.4 g) were combined in a four-neck flask and stirred at 85° C. for 6 hours. Subsequently, phenyl boronic acid (128.2 mg), bis(triphenylphosphine)palladium (II) dichloride (44 mg), and a 20 wt % aqueous solution of tetraethylammonium hydroxide (5.4 g) were added thereto and then stirred for 6 hours.

Then, sodium N,N-diethyldithiocarbamate trihydrate (5.71 g) dissolved in DI water (30 mL) was added thereto and then stirred at 85° C. for 2 hours.

After separating an organic layer from an aqueous layer, the organic layer was washed with water, a 3 wt % aqueous solution of acetic acid, and water. The organic layer was passed through a column charged with silica gel and alumina, and a solvent therein was removed under a reduced pressure.

The obtained liquid was added dropwise to methanol to precipitate a solid, the solid was dissolved in toluene and then added again dropwise to methanol to precipitate a solid, and the solid was filtered and dried, obtaining Copolymer P-2 (1.01 g).

Copolymer P-2 was measured with respect to a Mw and polydispersity by using SEC. As a result, the Mw and the polydispersity of Copolymer P-2 are respectively 17,600 g/mol and 1.72.

Copolymer P-2 has the following structural unit from an input ratio of the monomers.

Comparative Example 1

Synthesis of Comparative Copolymer P-3

Under an argon atmosphere, Compound M-3 (1.607 g) according to Synthesis Example M-3, 2,7-dibromo-9,9-di-n-octylfluorene (1.599 g), palladium (II) acetate (6.5 mg), tris(2-methoxyphenyl)phosphine (53.2 mg), toluene (60 mL), and a 20 wt % aqueous solution of tetraethylammonium hydroxide (15.03 g) were combined in a four-neck flask and stirred at 85° C. for 6 hours.

Subsequently, phenyl boronic acid (352.7 mg), bis(triphenylphosphine)palladium (II) dichloride (122.8 mg), and a 20 wt % aqueous solution of tetraethylammonium hydroxide (5.4 g) were added thereto and then stirred for 6 hours.

Then, sodium N,N-diethyldithiocarbamate trihydrate (7.21 g) dissolved in DI water (30 mL) was added thereto and then stirred at 85° C. for 2 hours.

After separating an organic layer from an aqueous layer, the organic layer was washed with water, a 3 wt % aqueous solution of acetic acid, and water. The organic layer was passed through a column charged with silica gel and alumina, and a solvent therein was removed under a reduced pressure.

The obtained liquid was added dropwise to methanol to precipitate a solid, the solid was dissolved in toluene and added again dropwise to methanol to precipitate a solid, and the solid was filtered and dried, obtaining Comparative Copolymer P-3 (1.21 g).

Comparative Copolymer P-3 was measured with respect to a Mw and polydispersity by using SEC. As a result, the Mw and the polydispersity of Comparative Copolymer P-3 are respectively 7,400 g/mol and 1.85.

Comparative Copolymer P-3 has the following structural unit from an input ratio of the monomers.

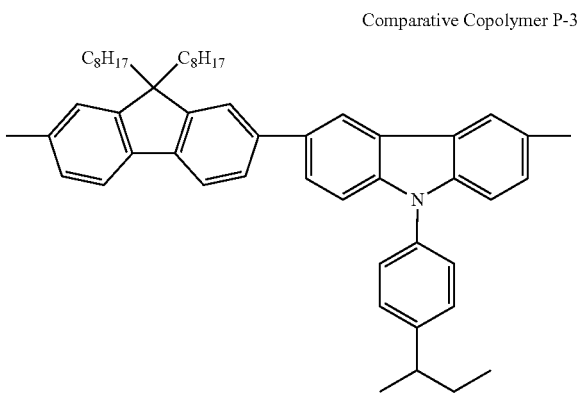

Comparative Copolymer P-3

Example 3

Manufacture of Electroluminescence Device 1

As for a first electrode (an anode), a glass substrate adhered with indium tin oxide (ITO) that was patterned to have a film thickness of 150 nm was used. This ITO-adhered glass substrate was sequentially washed with a neutral detergent, DI water, water, and isopropyl alcohol, and then treated with ultraviolet (UV) light and ozone.

Subsequently, on this ITO-adhered glass substrate, poly (3,4-ethylenedioxythiophene)/poly(4-styrenesulfonate) (PEDOT/PSS) (Sigma-Aldrich Co., Ltd.) was spin-coated and dried to have a dry film thickness of 30 nm. As a result, a hole injection layer having a thickness (dry film thickness) of 30 nm was formed on the ITO-adhered glass substrate.

Next, Copolymer A-1 (hole transport material) synthesized according to Example 1 was dissolved in toluene (solvent) at a concentration of 1 wt % to prepare a coating composition (1) for forming a hole transport layer.

On the hole injection layer, the coating composition (1) for forming the hole transport layer was applied by spin coating so that the thickness (dry film thickness) was 30 nm, and then heated at 230° C. for 1 hour to form a hole transport layer having a thickness (dry film thickness) of 30 nm.

Figure 2:
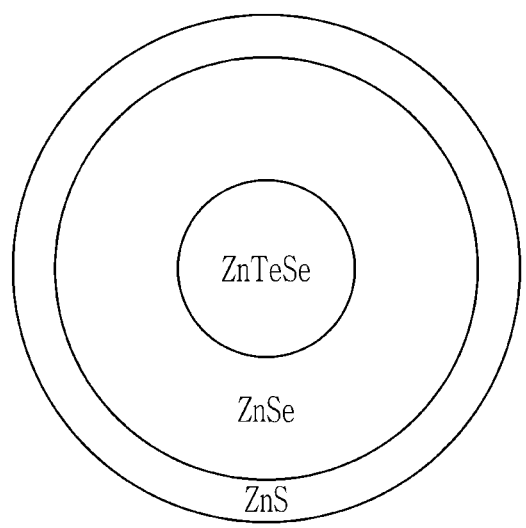
FIG. 2 is a cross-sectional view showing the structure of a quantum dot used in the examples.

Quantum dot dispersion was prepared by dispersing blue quantum dots of ZnTeSe/ZnSe/ZnS (core/shell/shell; having an average diameter of about 10 nm) having a structure shown in FIG. 2 in cyclohexane at concentration of 1.0 wt %.

On the other hand, the hole transport layer (particularly, Copolymer P-1) was not dissolved in cyclohexane.

This quantum dot dispersion was spin-coated to have a dry film thickness of 30 nm on the hole transport layer and dried. As a result, a quantum dot light emitting layer with a thickness (dry film thickness) of 30 nm was formed on the hole transport layer.

On the other hand, when the quantum dot dispersion was irradiated by UV light, the resulting light generated therefrom has a central wavelength of 462 nm and a full width at half maximum of 30 nm.

This quantum dot light emitting layer was completely dried. On this quantum dot light emitting layer, lithium quinolate (Liq) and 1,3,5-tris(N-phenylbenzimidazol-2-yl) benzene (TPBI) (Sigma-Aldrich Co., Ltd.) as an electron transport material were co-deposited by using a vacuum deposition apparatus. As a result, a 36 nm-thick electron transport layer was formed on the quantum dot light emitting layer.

Using a vacuum deposition apparatus, (8-quinolato) lithium (lithium quinolate, Liq) was deposited on this electron transport layer. As a result, a 0.5 nm-thick electron injection layer was formed on the electron transport layer.

Using a vacuum deposition apparatus, aluminum (Al) was deposited on the electron injection layer. As a result, a 100 nm-thick second electrode (cathode) was formed on the electron injection layer.

Accordingly, electroluminescence device 1 (quantum dot electroluminescence device 1) was obtained.

Example 4

Manufacture of Electroluminescence Device 2

Electroluminescence device 2 (quantum dot electroluminescence device 2) was manufactured according to a similar method as Example 3 except that Copolymer P-2 according to Example 2 was used instead of Copolymer P-1 according to Example 3.

Comparative Example 1

Manufacture of Comparative Electroluminescence Device 1

Comparative electroluminescence device 1 (Comparative quantum dot electroluminescence device 1) was manufactured according to a similar method as Example 3, except that Comparative Copolymer P-3 of Comparative Example 1 was used instead of Copolymer P-1 according to Example 3.

Evaluation of Electroluminescence Device

Electroluminescence devices 1 and 2 according to Examples 3 and 4, respectively, and Comparative electroluminescence device 1 according to Comparative Example 1 were each evaluated with respect to luminous external quantum efficiency (EQE) and luminescence life-span ($LT_{90}$) according to the following methods. The results are shown in Table 1.

Luminous Efficiency

When a voltage is applied to each electroluminescence device, a current begins to flow at a constant voltage, and the electroluminescence device emits light. Hereinafter, a DC constant voltage power supply (a source meter, Keyence Corp.) was used to gradually increase a voltage, at which a current of each device was measured, and a luminance measuring device (SR-3, Topcon Technology Co., Ltd.) was used to measure luminance of the device at the time of emission. Herein, the measurement was terminated when the luminance of the device begins to decrease from the initial luminance. An area of each device was used to calculate a current per unit area (current density), and current efficiency (candela per ampere, cd/A) was determined by dividing the luminance (candela per square meter, $cd/m^2$ or nit) by the current density ($A/m^2$). In Table 1, the highest current efficiency within the measured voltage range is regarded to be cd/A max. On the other hand, the current efficiency represents efficiency of converting a current into light-emitting energy (conversion efficiency), and as the current efficiency is higher, a device exhibits the higher performance.

In addition, external quantum efficiency (EQE) (%) at cd/A max was calculated, from a spectral radiant luminance spectrum measured by a luminance measuring device, assuming that Lambertian radiation is performed, and then was used to evaluate luminous efficiency.

Luminescence Life-Span

The DC constant voltage power supply (a source meter made by KEYENCE Corp.) was used to apply a predetermined voltage to each quantum dot electroluminescence device and thus make the quantum dot electroluminescence device emit light.

While the light emission of the quantum dot electroluminescence device as measured by using the luminance-measuring device (SR-3, Topcon Technology Co., Ltd.), a current was gradually increased and then, when the luminance reached 280 nit (cd/m$^2$), the device was allowed to stand while the current was kept constant.

"$LT_{90}(hr)$" was obtained by measuring time when luminance measured by a luminance-measuring device is gradually deteriorated and reaches 90% of initial luminance. On the other hand, in Table 1, $LT_{90}$ is expressed as a value relative to the $LT_{90}$ of Comparative Example 1.

TABLE 1

| | | Copolymer | EQE [%] | $LT_{90}$ |
|---|---|---|---|---|
| Example 3 | P-1: | [structure with $C_{18}H_{17}$, $C_8H_{17}$] | 16.7 | 3.7 |
| Example 4 | P-2: | [structure with $C_{18}H_{17}$, $C_8H_{17}$] | 11.4 | 7.1 |

TABLE 1-continued

| Copolymer | EQE [%] | LT$_{90}$ |
|---|---|---|
| Comparative Example 1 | P-3: 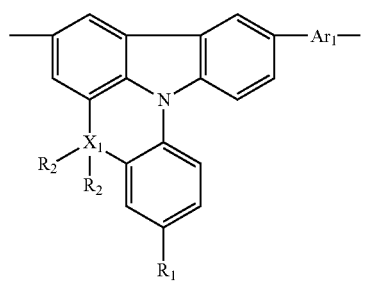 | 13.9 | 1 |

Referring to Table 1, electroluminescence devices 1 and 2 of Examples 3 and 4 achieved better balance between the luminous efficiency (EQE) and the luminescence life-span (LT$_{90}$) compared with the electroluminescence device of Comparative Example 1.

On the other hand, in the present example embodiments, although blue quantum dot electroluminescence devices were evaluated, the same results as above may be obtained in red quantum dot electroluminescence devices and the like.

While this disclosure has been described in connection with what is presently considered to be practical exemplary embodiments, it is to be understood that the disclosure is not limited to the disclosed exemplary embodiments. On the contrary, it is intended to cover various modifications and equivalent arrangements included within the spirit and scope of the appended claims.

DESCRIPTION OF SYMBOLS

100: electroluminescence device (EL device)
110: substrate
120: first electrode
130: hole injection layer
140: hole transport layer
150: light emitting layer
160: electron transport layer
170: electron injection layer
180: second electrode

What is claimed is:

1. A copolymer, comprising a structural unit represented by Chemical Formula 1, a structural unit represented by Chemical Formula 2, or a combination thereof:

Chemical Formula 1

(1)

[Chemical structure showing carbazole derivative with Ar$_1$, X$_1$, R$_1$, R$_2$ substituents]

-continued

Chemical Formula 2

(2)

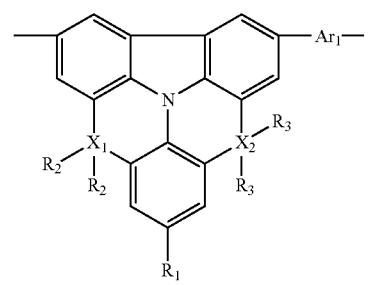

wherein, in Chemical Formula 1 and Chemical Formula 2,

R$_1$ is a substituted or unsubstituted alkyl group having 1 to 20 carbon atoms, a substituted or unsubstituted monovalent aromatic hydrocarbon group having 6 to 30 carbon atoms, a substituted or unsubstituted monovalent aromatic heterocyclic group having 5 to 30 ring-member atoms, or —Y—N(Ar$_2$)(Ar$_3$), wherein Y is a substituted or unsubstituted divalent aromatic hydrocarbon group having 6 to 30 carbon atoms, Ar$_2$ and Ar$_3$ are each independently a substituted or unsubstituted monovalent aromatic hydrocarbon group having 6 to 30 carbon atoms, or a substituted or unsubstituted monovalent aromatic heterocyclic group having 5 to 30 ring-member atoms, R$_2$ and R$_3$ are each independently a substituted or unsubstituted alkyl group having 1 to 20 carbon atoms, a substituted or unsubstituted alkoxy group having 1 to 20 carbon atoms, a substituted or unsubstituted monovalent aromatic hydrocarbon group having 6 to 30 carbon atoms, or a substituted or unsubstituted monovalent aromatic heterocyclic group having 5 to 30 ring-member atoms, wherein each R$_2$ is the same or different, and each R$_3$ is the same or different, optionally wherein two R$_2$(s) are combined with each other to provide a ring, optionally wherein two R$_3$(s) are combined with each other to provide a ring, and optionally wherein one or more R$_2$(s) is combined with one or more R$_3$(s) to provide a ring, X$_1$ and X$_2$ are each independently a carbon atom (C) or a silicon atom (Si), and Ar$_1$ is a substituted or unsubstituted divalent aromatic hydrocarbon group having 6 to 30 carbon atoms, or a substituted or unsubstituted divalent aromatic heterocyclic group having 5 to 30 ring-member atoms.

2. The copolymer of claim 1, wherein in Chemical Formula 1 and Chemical Formula 2, Ar₁ is a group represented by one of Chemical Formula 3 to Chemical Formula 18:

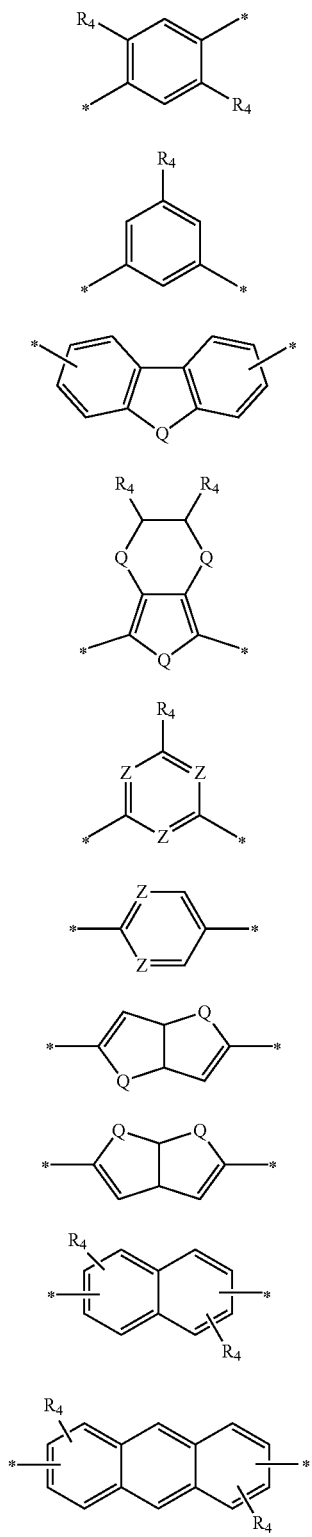

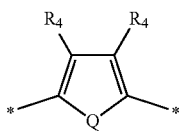

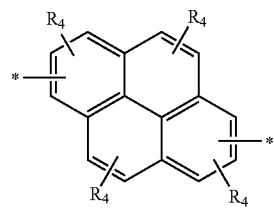

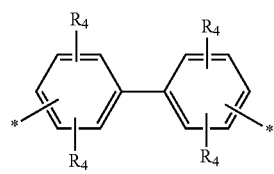

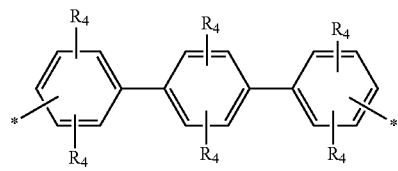

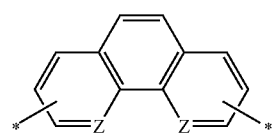

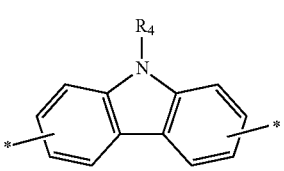

wherein, in Chemical Formula 3 to Chemical Formula 18,
each $R_4$ is independently a hydrogen atom, an alkyl group having 1 to 20 carbon atoms, a substituted or unsubstituted monovalent aromatic hydrocarbon group having 6 to 30 carbon atoms, or a substituted or unsubstituted monovalent aromatic heterocyclic group having 5 to 30 ring-member atoms, each Q is independently —O—, —S—, —Se—, —CR₅R₆—, or —SiR₅R₆—, wherein $R_5$ and $R_6$ are each independently a hydrogen atom, a deuterium atom, a substituted or unsubstituted alkyl group having 1 to 20 carbon atoms, a substituted or unsubstituted aryl group, or a substituted or unsubstituted heteroaryl group, each Z is independently —CR₇=, —N=, or —SiR₇=, wherein, $R_7$ is a hydrogen atom, a deuterium atom, a substituted or unsubstituted alkyl group having 1 to 20 carbon atoms, a substituted or unsubstituted aryl group, or a substituted or unsubstituted heteroaryl group, and

* is a binding site forming a main chain of the copolymer.

3. The copolymer of claim 1, wherein
the copolymer has the structural unit represented by Chemical Formula 1, wherein $R_1$ is a substituted or unsubstituted alkyl group having 1 to 8 carbon atoms, or —Y—N(Ar$_2$)(Ar$_3$), wherein, Y is a substituted or unsubstituted phenylene group, a substituted or unsubstituted fluorenylene group, or a substituted or unsubstituted dibenzofuranylene group, and Ar$_2$ and Ar$_3$ are each independently a substituted or unsubstituted phenyl group, a substituted or unsubstituted fluorenyl group, a substituted or unsubstituted dibenzofuranyl group, or a substituted or unsubstituted biphenyl group, each $R_2$ is independently a substituted or unsubstituted alkyl group having 1 to 8 carbon atoms, or a substituted or unsubstituted phenyl group, or two $R_2$(s) are combined with each other to provide a ring, and $X_1$ is a carbon atom (C).

4. The copolymer of claim 1, wherein the copolymer has the structural unit represented by Chemical Formula 1, wherein $R_1$ is a substituted or unsubstituted alkyl group having 1 to 8 carbon atoms, or —Y—N(Ar$_2$)(Ar$_3$), wherein, Y is a substituted or unsubstituted phenylene group, a substituted or unsubstituted fluorenylene group, or a substituted or unsubstituted dibenzofuranylene group, and Ar$_2$ and Ar$_3$ are each independently a substituted or unsubstituted phenyl group, a substituted or unsubstituted fluorenyl group, a substituted or unsubstituted dibenzofuranyl group, or a substituted or unsubstituted biphenyl group, two $R_2$(s) are combined with each other to provide a ring, and $X_1$ is a carbon atom (C).

5. The copolymer of claim 1, wherein the copolymer has the structural unit represented by Chemical Formula 2, wherein $R_1$ is a substituted or unsubstituted alkyl group having 1 to 8 carbon atoms, or —Y—N(Ar$_2$)(Ar$_3$), wherein, Y is a substituted or unsubstituted phenylene group, a substituted or unsubstituted fluorenylene group, or a substituted or unsubstituted dibenzofuranylene group, and Ar$_2$ and Ar$_3$ are each independently a substituted or unsubstituted phenyl group, a substituted or unsubstituted fluorenyl group, a substituted or unsubstituted dibenzofuranyl group, or a substituted or unsubstituted biphenyl group, each $R_2$ is independently a substituted or unsubstituted alkyl group having 1 to 8 carbon atoms, or a substituted or unsubstituted phenyl group, or two $R_2$(s) are combined with each other to provide a ring, each $R_3$ is independently a substituted or unsubstituted alkyl group having 1 to 8 carbon atoms, or a substituted or unsubstituted phenyl group, or two $R_3$(s) are combined with each other to provide a ring, provided that two $R_2$(s) are combined with each other to provide a ring or two $R_3$(s) are combined with each other to provide a ring, and $X_1$ and $X_2$ are carbon.

6. The copolymer of claim 1, wherein the copolymer has the structural unit represented by Chemical Formula 2, wherein $R_1$ is a substituted or unsubstituted alkyl group having 1 to 8 carbon atoms, or —Y—N(Ar$_2$)(Ar$_3$), wherein, Y is a substituted or unsubstituted phenylene group, a substituted or unsubstituted fluorenylene group, or a substituted or unsubstituted dibenzofuranylene group, and Ar$_2$ and Ar$_3$ are each independently a substituted or unsubstituted phenyl group, a substituted or unsubstituted fluorenyl group, a substituted or unsubstituted dibenzofuranyl group, or a substituted or unsubstituted biphenyl group, two $R_2$(s) are combined with each other to provide a ring or two $R_3$(s) are combined with each other to provide a ring, and $X_1$ and $X_2$ are carbon.

7. The copolymer of claim 2, wherein each $R_4$ is independently a linear alkyl group having 3 to 20 carbon atoms, a branched alkyl group having 3 to 20 carbon atoms, or hydrogen.

8. The copolymer of claim 1, comprising greater than or equal to about 85 mol % and less than or equal to about 100 mol % of the structural unit represented by Chemical Formula 1, or comprising greater than or equal to about 85 mol % and less than or equal to about 100 mol % of the structural unit represented by Chemical Formula 2.

9. The copolymer of claim 1, wherein the copolymer has a weight average molecular weight of about 2,000 to about 500,000 grams per mole, as determined by size exclusion chromatography.

10. The copolymer of claim 1, wherein the copolymer has a polydispersity of about 1.10 to about 5.00, as determined by size exclusion chromatography.

11. An electroluminescence device material, comprising the copolymer of claim 1.

12. An electroluminescence device, comprising:

a first electrode and a second electrode, and at least one organic layer disposed between the first electrode and the second electrode, wherein the at least one layer of the organic layer comprises the copolymer of claim 1.

13. The electroluminescence device of claim 12, wherein the organic layer comprising the copolymer is a hole transport layer or a hole injection layer.

14. The electroluminescence device of claim 12, wherein the organic layer comprises a light emitting layer, wherein the light emitting layer comprises semiconductor nanoparticles or an organometallic complex.

* * * * *